(12) United States Patent
Yang et al.

(10) Patent No.: US 8,837,872 B2
(45) Date of Patent: Sep. 16, 2014

(54) WAVEGUIDE STRUCTURES FOR SIGNAL AND/OR POWER TRANSMISSION IN A SEMICONDUCTOR DEVICE

(75) Inventors: Ping-Jung Yang, Hsinchu (TW); Hsin-Jung Lo, Jhonghe (TW); Te-Sheng Liu, Jhubei (TW)

(73) Assignee: Qualcomm Incorporated, San Diego, CA (US)

( * ) Notice: Subject to any disclaimer, the term of this patent is extended or adjusted under 35 U.S.C. 154(b) by 467 days.

(21) Appl. No.: 13/338,184

(22) Filed: Dec. 27, 2011

(65) Prior Publication Data

US 2012/0170887 A1 Jul. 5, 2012

Related U.S. Application Data

(60) Provisional application No. 61/428,821, filed on Dec. 30, 2010.

(51) Int. Cl.
| | |
|---|---|
| *G02B 6/12* | (2006.01) |
| *G02B 6/43* | (2006.01) |
| *G02B 6/132* | (2006.01) |
| *G02B 6/122* | (2006.01) |
| *H05K 1/02* | (2006.01) |

(52) U.S. Cl.
CPC ............... *G02B 6/43* (2013.01); *G02B 6/1221* (2013.01); *G02B 6/132* (2013.01); *G02B 6/12002* (2013.01); *H05K 1/0274* (2013.01)
USPC ............................................ 385/14; 385/129

(58) Field of Classification Search
None
See application file for complete search history.

(56) References Cited

U.S. PATENT DOCUMENTS

| | | | | |
|---|---|---|---|---|
| 3,563,630 | A | * 2/1971 | Anderson et al. | 385/132 |
| 4,966,430 | A | * 10/1990 | Weidel | 385/14 |
| 5,124,543 | A | 6/1992 | Kawashima | |
| 5,262,656 | A | 11/1993 | Blondeau et al. | |
| 5,439,647 | A | 8/1995 | Saini | |
| 5,562,838 | A | * 10/1996 | Wojnarowski et al. | 216/24 |
| 5,835,646 | A | * 11/1998 | Yoshimura et al. | 385/14 |
| 6,285,808 | B1 | * 9/2001 | Mehlhorn et al. | 385/14 |

(Continued)

FOREIGN PATENT DOCUMENTS

JP 2003-43281 A * 2/2003

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Mike Stahl
(74) *Attorney, Agent, or Firm* — Seyfarth Shaw LLP

(57) ABSTRACT

A device is described which includes a waveguide structure for signal transmission and power/ground delivery The waveguide structure includes a signal transmission part for transmitting an optical signal from an illuminant device to a detector. The signal transmission part may include transparent polymer, diamond or glass. The signal transmission part is used for a waveguide. The waveguide structure further includes a power/ground delivery part surrounding the signal transmission part. The power/ground delivery part is composed of at least one metal layer. Thus, the waveguide structure can provide an optical-signal transmission with high speed and high volume through the signal transmission part, while a stable power or ground reference can be provided to multiple units through the power/ground delivery part.

20 Claims, 68 Drawing Sheets

(56) References Cited

U.S. PATENT DOCUMENTS

| | | | |
|---|---|---|---|
| 6,370,292 B1* | 4/2002 | Strake | 385/14 |
| 6,387,284 B2* | 5/2002 | Hornbeck et al. | 216/24 |
| 7,462,326 B2 | 12/2008 | Lehmann et al. | |
| 7,477,809 B1* | 1/2009 | Tan et al. | 385/14 |
| 8,019,187 B1 | 9/2011 | Dutta | |
| 2005/0135727 A1* | 6/2005 | Piede et al. | 385/14 |
| 2008/0273853 A1* | 11/2008 | Khan | 385/129 |
| 2009/0208167 A1* | 8/2009 | Hodono | 385/14 |
| 2011/0142392 A1* | 6/2011 | Tilly | 385/14 |
| 2011/0150405 A1* | 6/2011 | Shiraishi et al. | 385/123 |
| 2013/0011094 A1* | 1/2013 | Kim | 385/11 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Techincal Digest IEEE International Electron Devices Meeting (1997) pp. 769-772.

Jenei, S. et al. "High Q Inductor Add-on Module in Thick Cu-/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuts and Technology Meeting (1999) pp. 149-152.

Sakran, N. et al. "The Implementation of the 65nm Dual-Core 64b Merom Processor," IEEE International Solid-State Circuts Conference, Session 5, Microprocessors, 5.6 (2007) pp. 106-107, p. 590.

Kumar, R. et al. "A Family of 45nm IA Processors," IEEE International Solid State Circuts Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuts Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuts Digest of Technical Papers (2008) pp. 62-63.

Maloney, T. et al. "Novel Clamp Circuts for IC Power Supply Protection," IEEE Transaction on Components, Packaging, and Manufacturing Technology, Part C, vol. 19, No. 3 (Jul. 1996) pp. 150-161.

Geffken, R. M. "An Overview of Polymide Use in Integrated Circuts and Packaging," Proceedings of the Third International Symposium on Ultra Large Scale Integration Science and Technology (1991) pp. 667-677.

Luther, B. et al. "Planar Copper-Polymide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

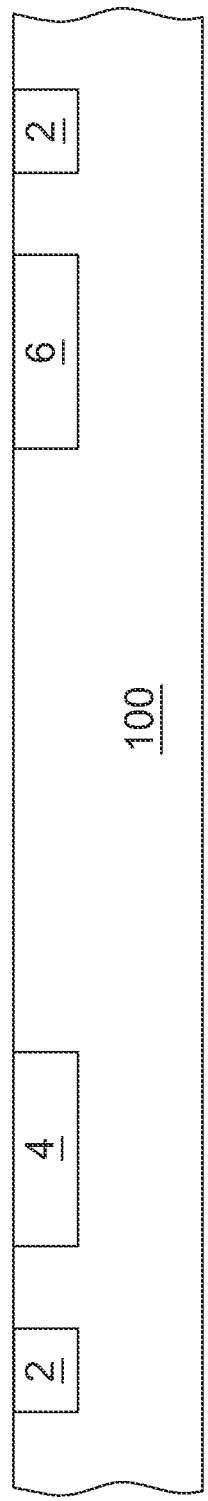
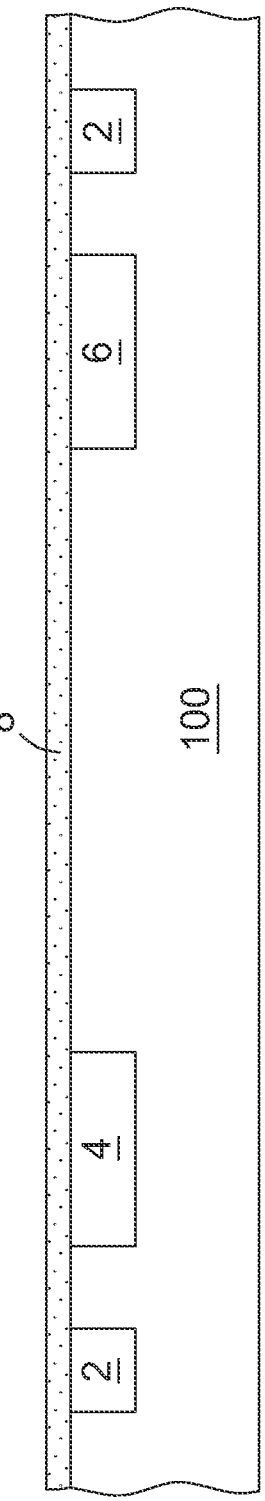

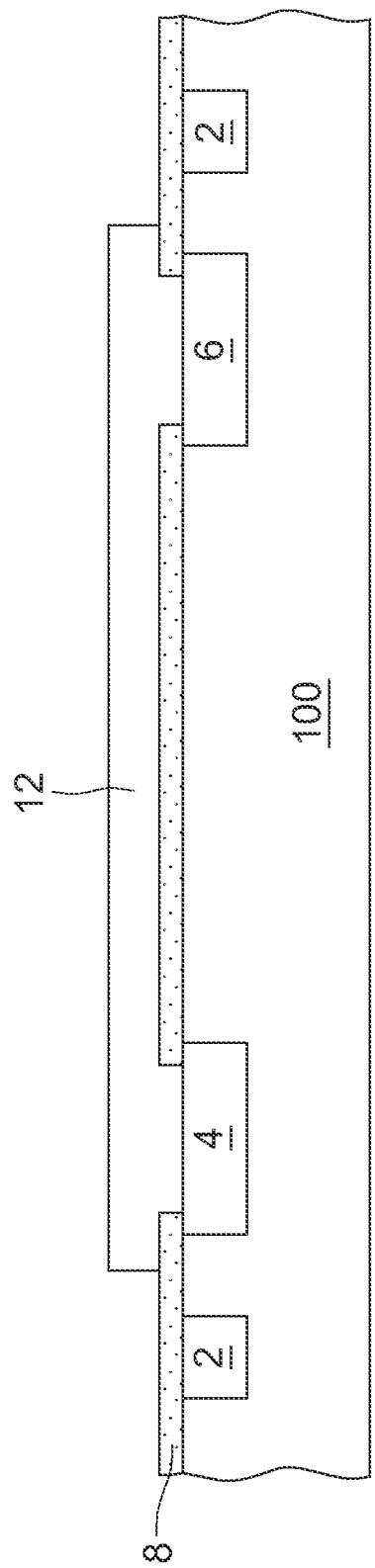
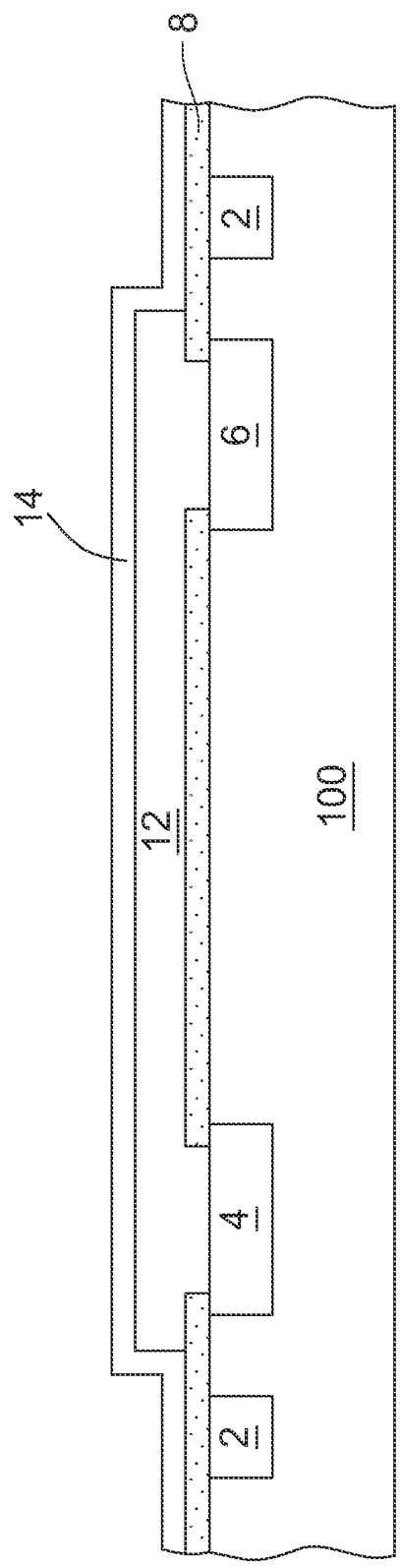

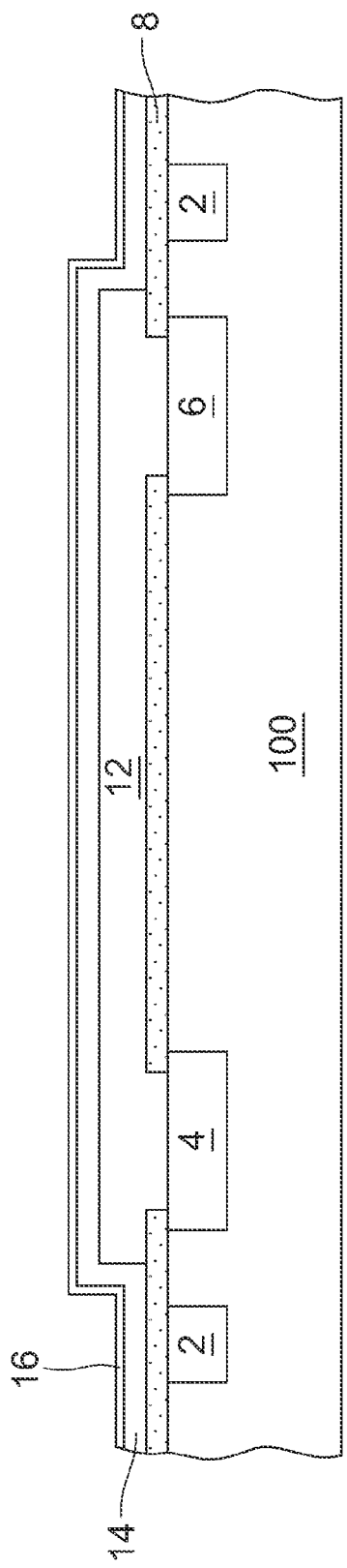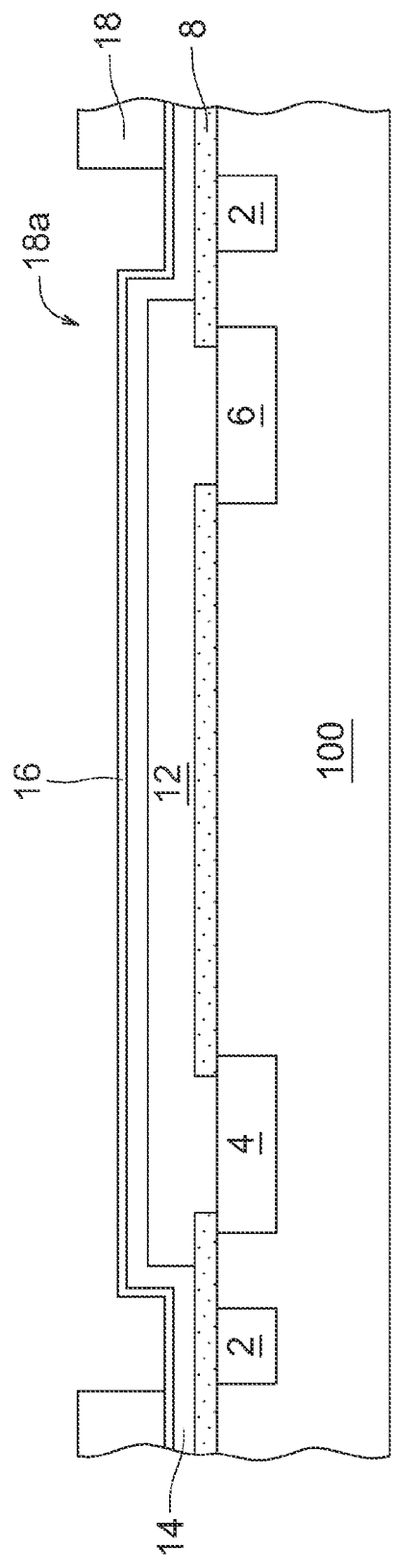

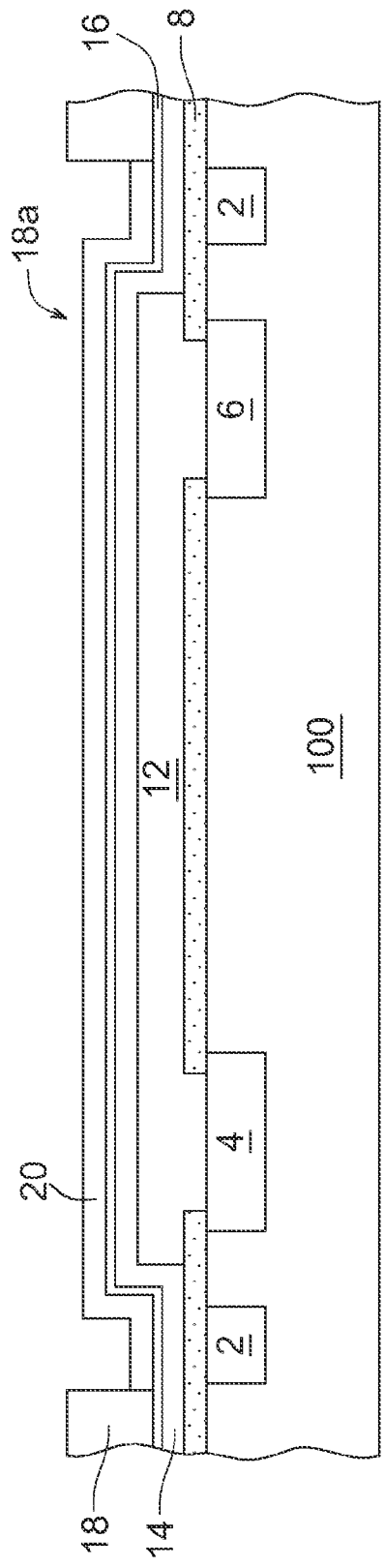
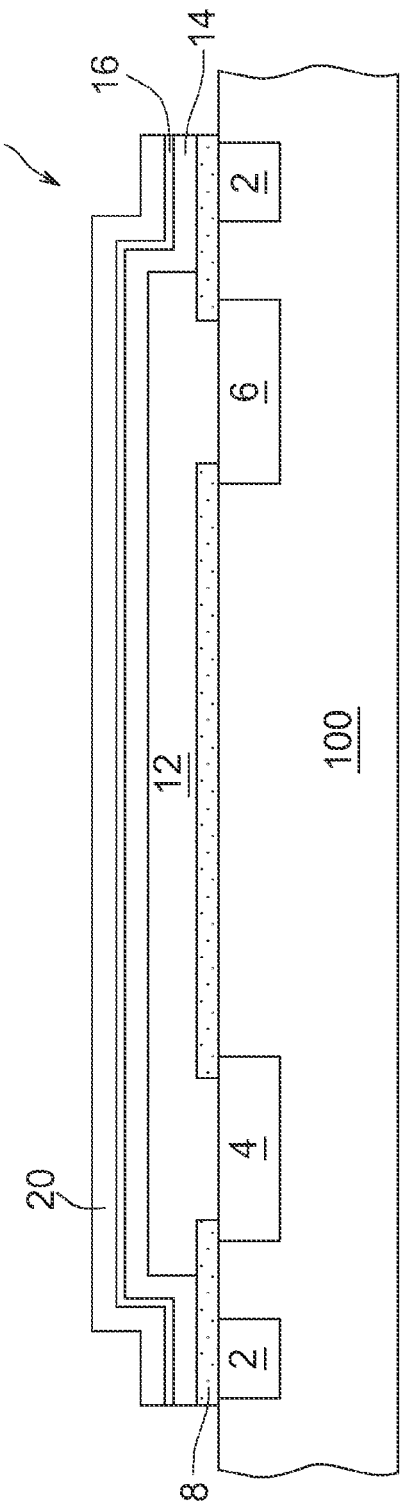

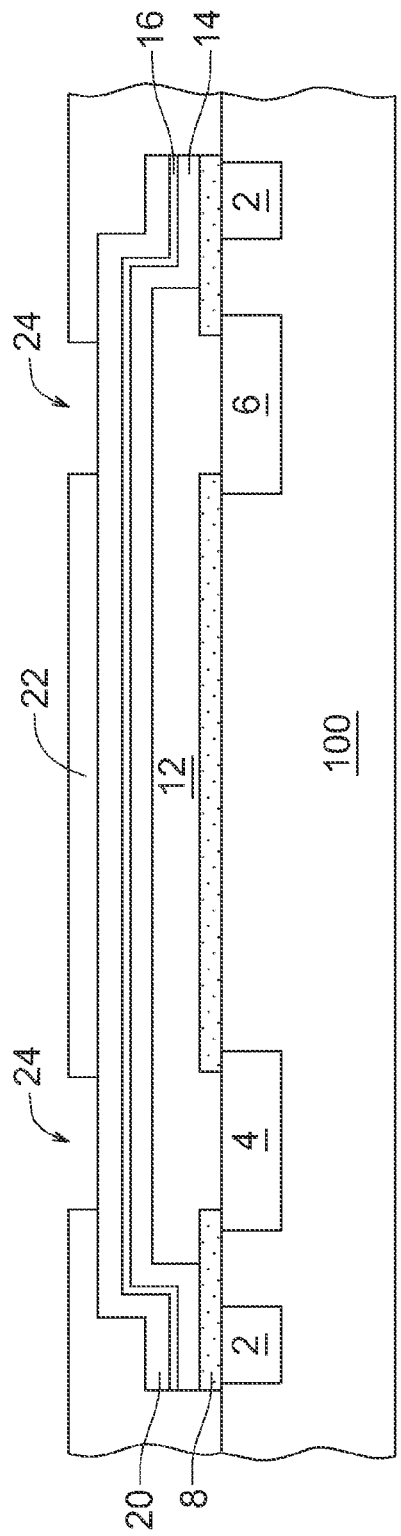
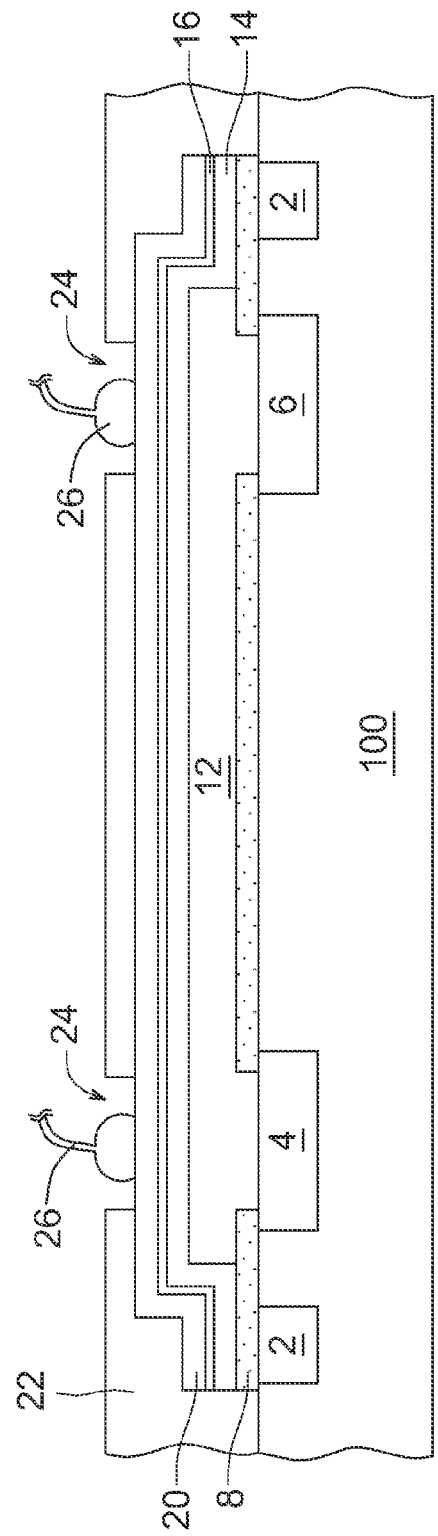

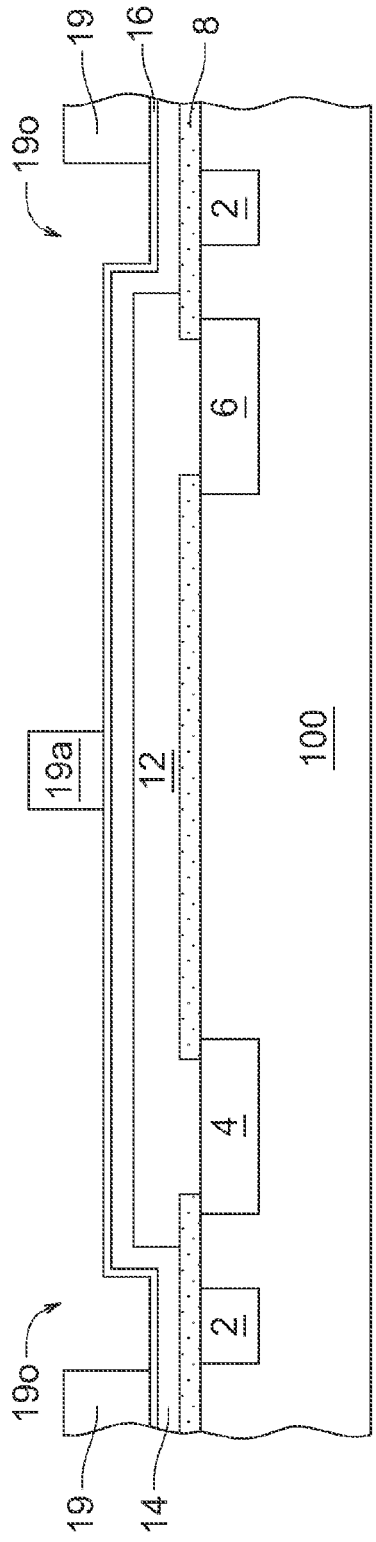
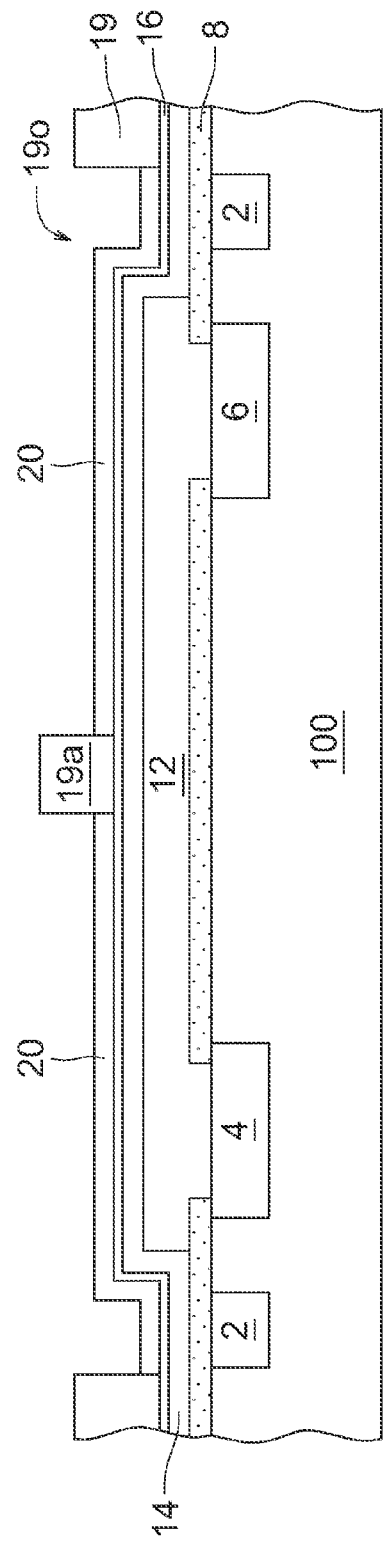

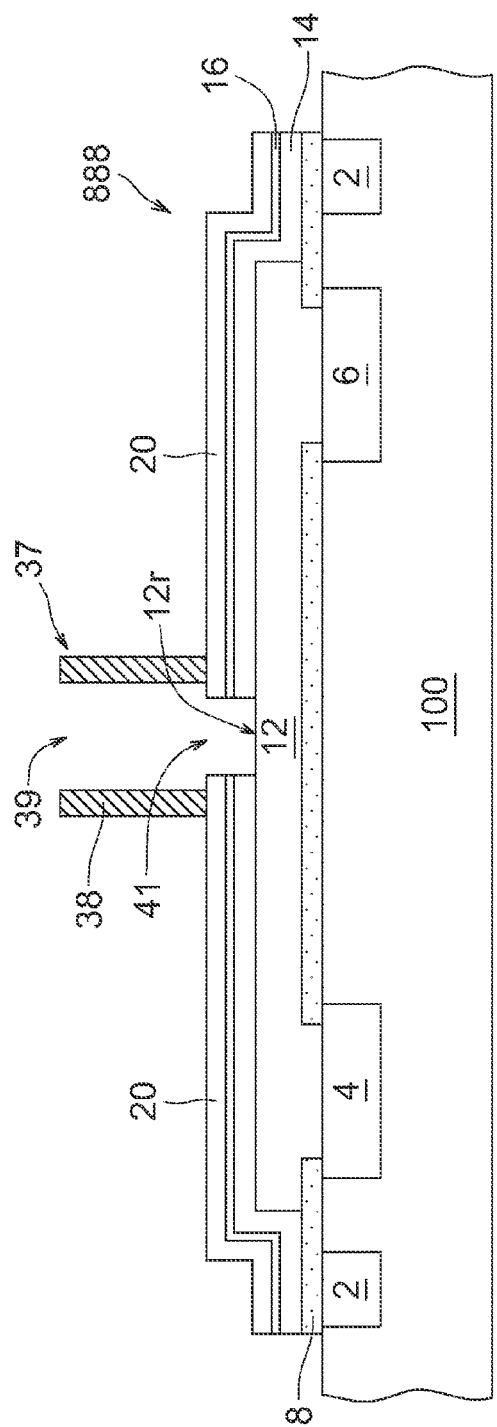
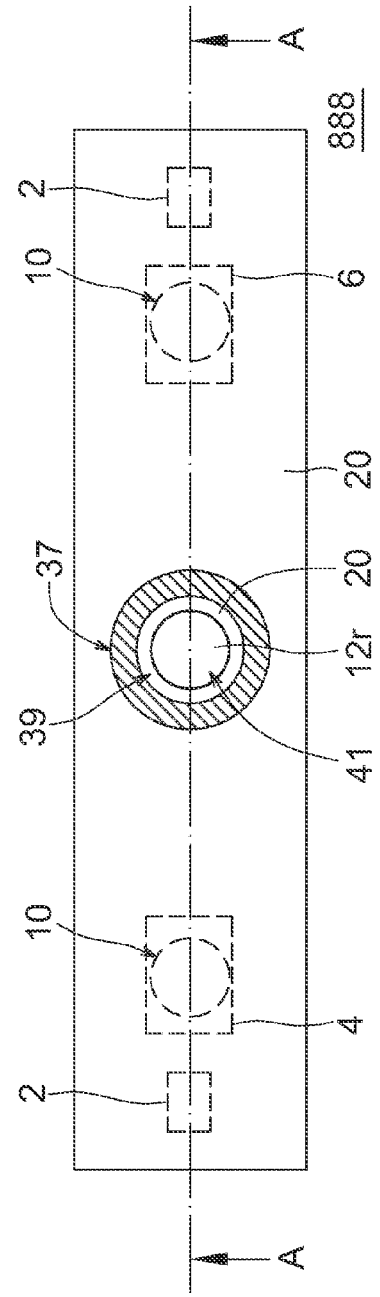
Fig. 2G
Fig. 2H

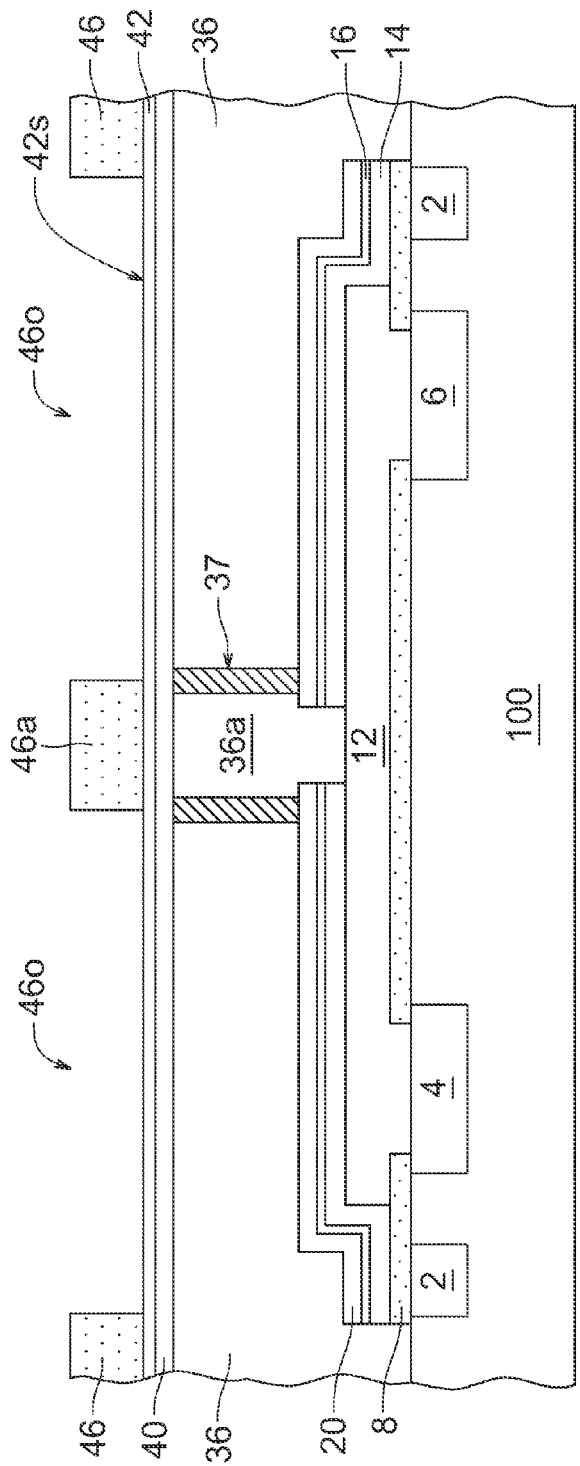
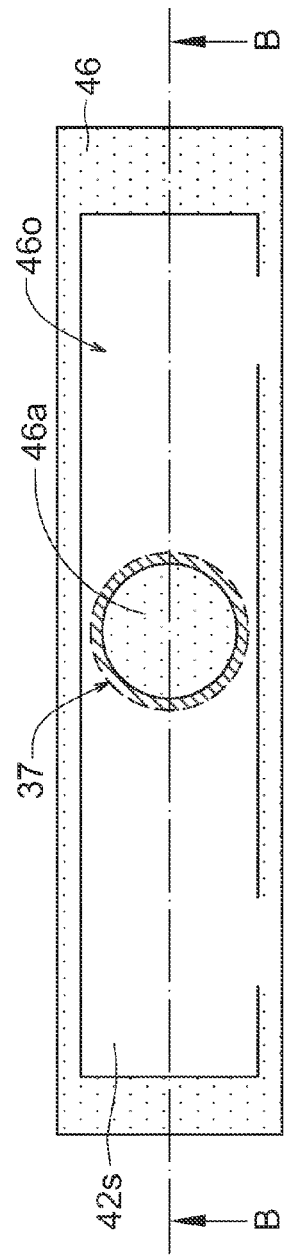
Fig. 2L
Fig. 2M

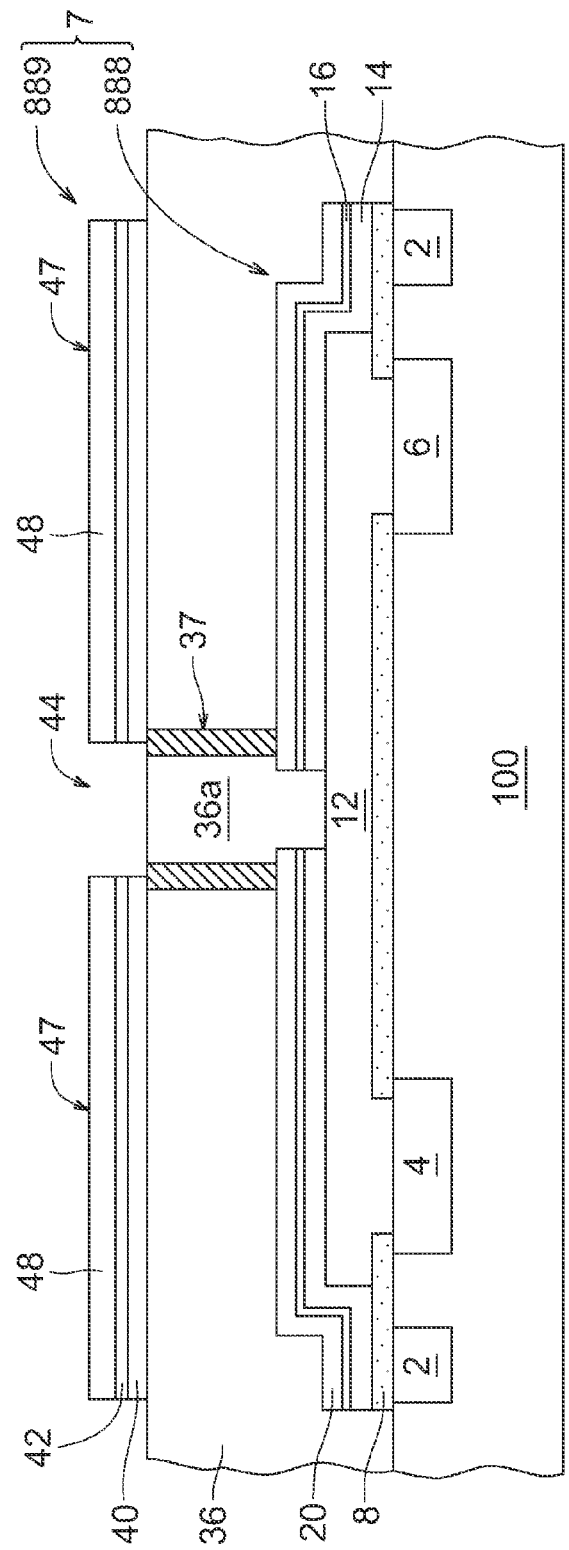
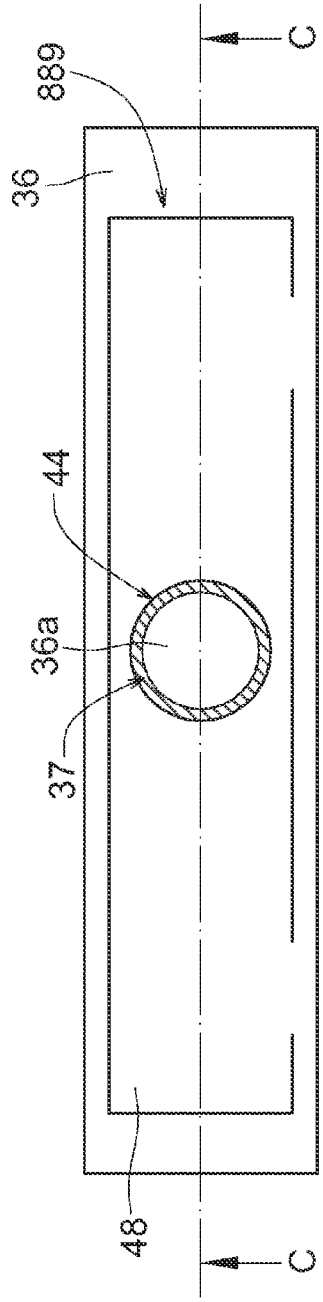
Fig. 2O
Fig. 2P

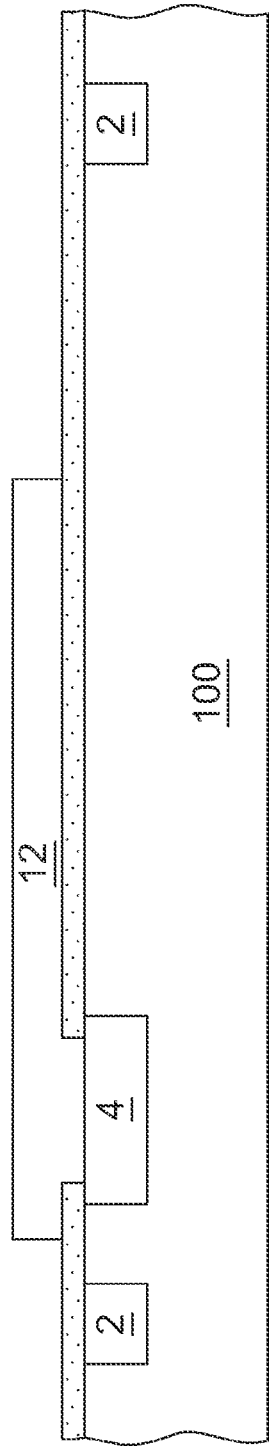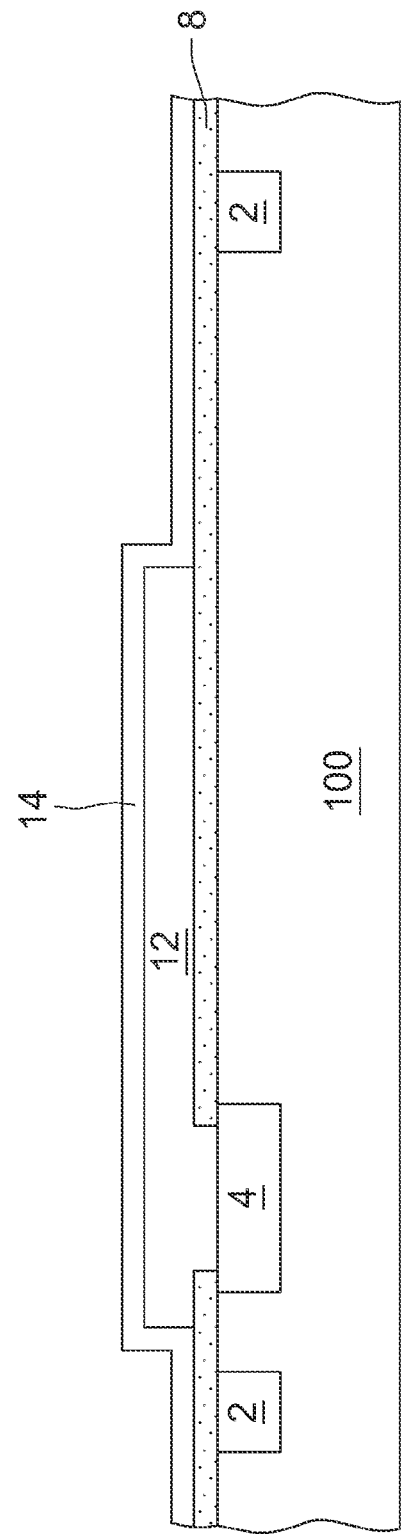

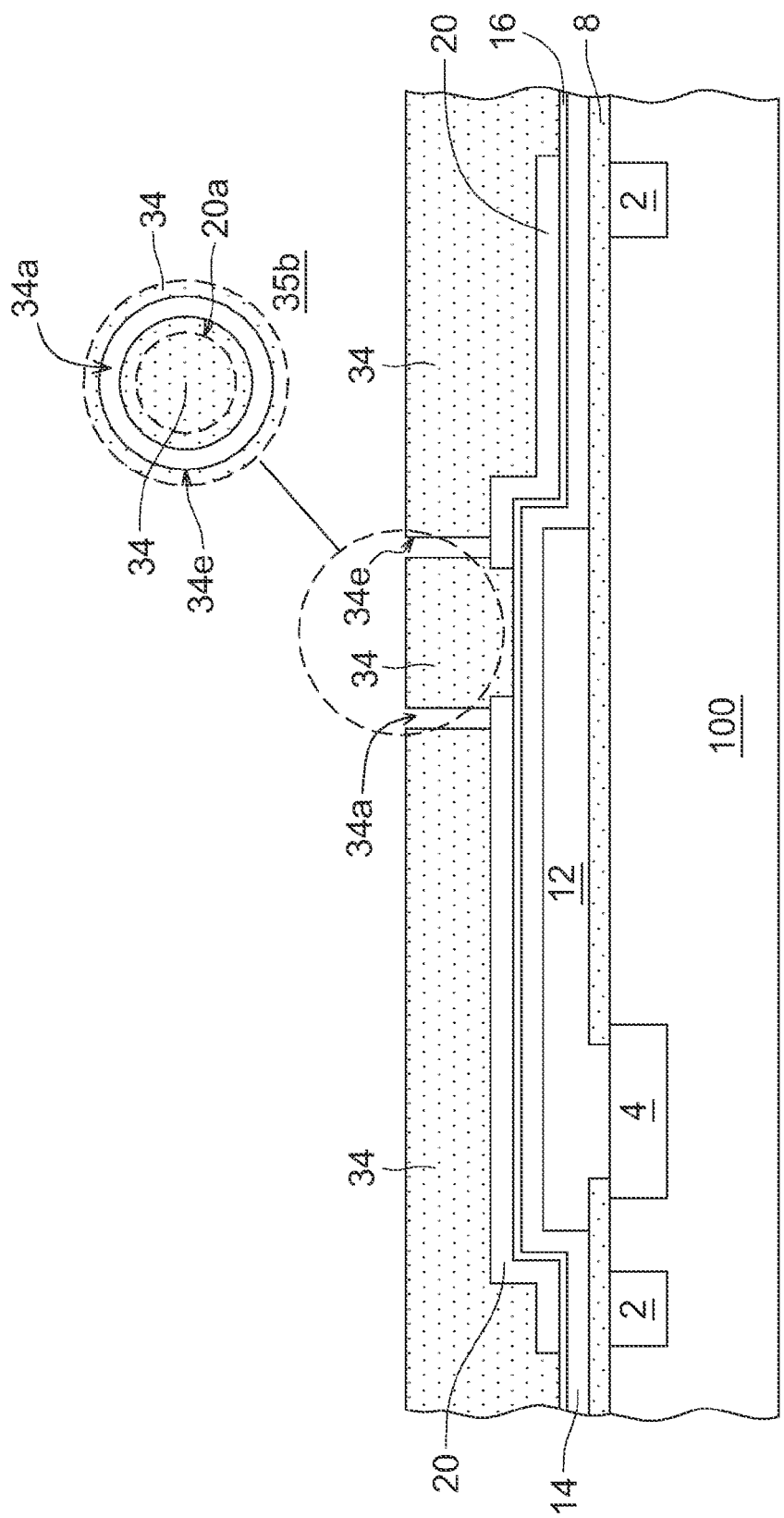

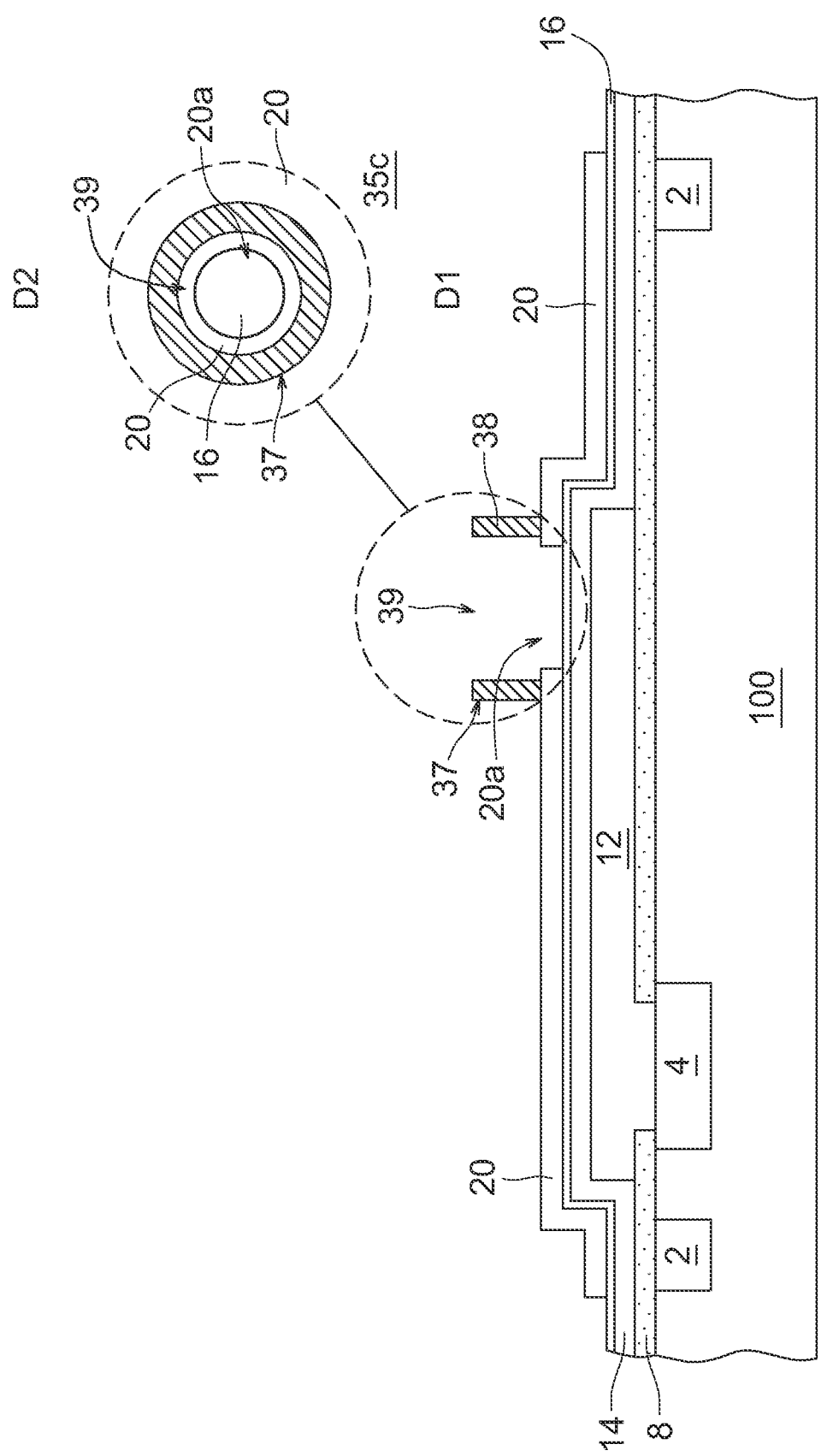

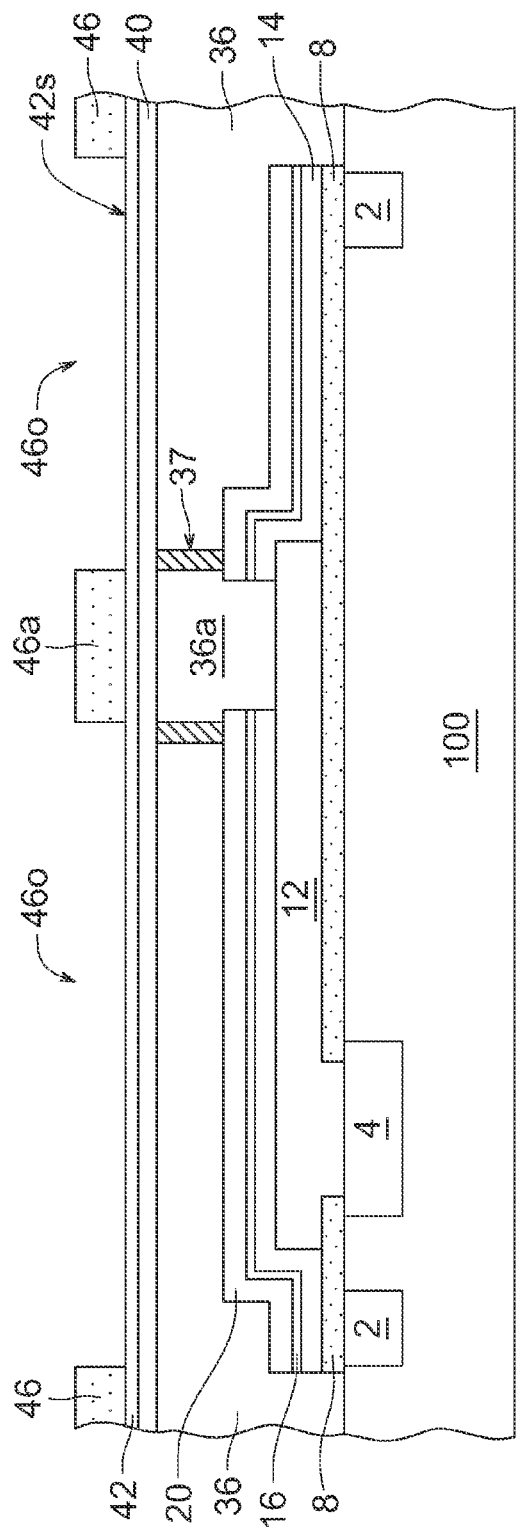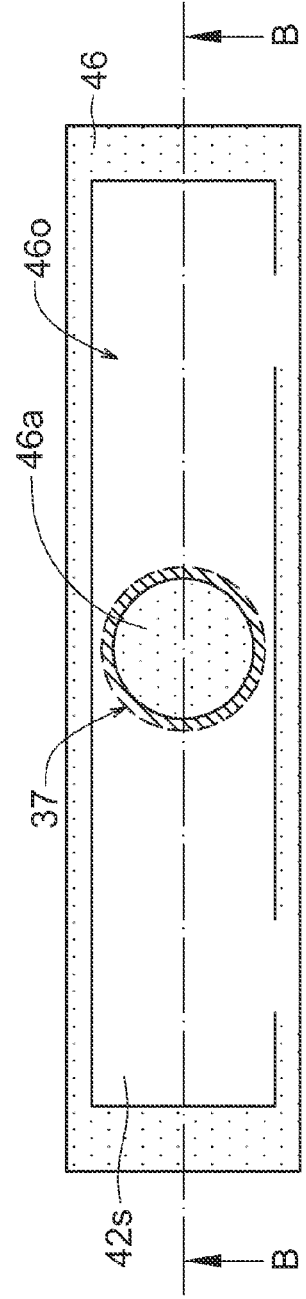
Fig. 3S
Fig. 3T

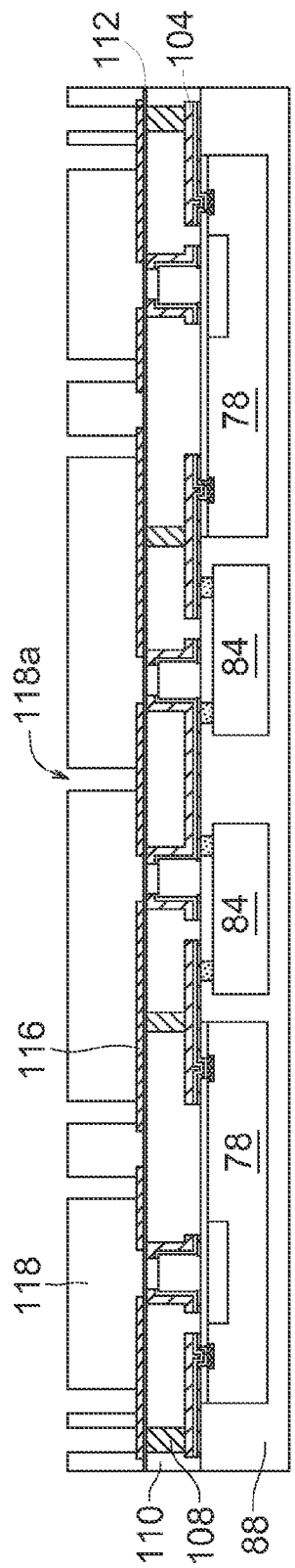
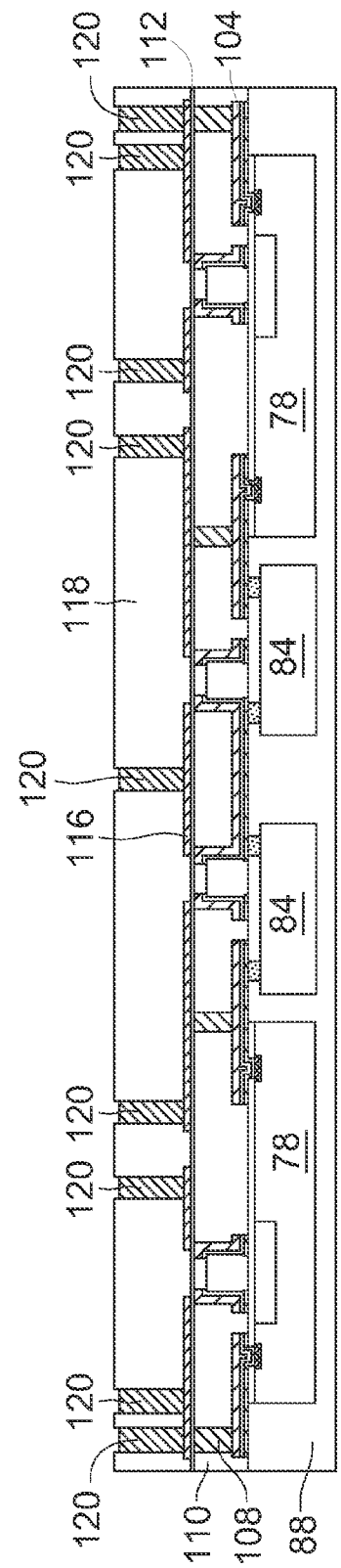

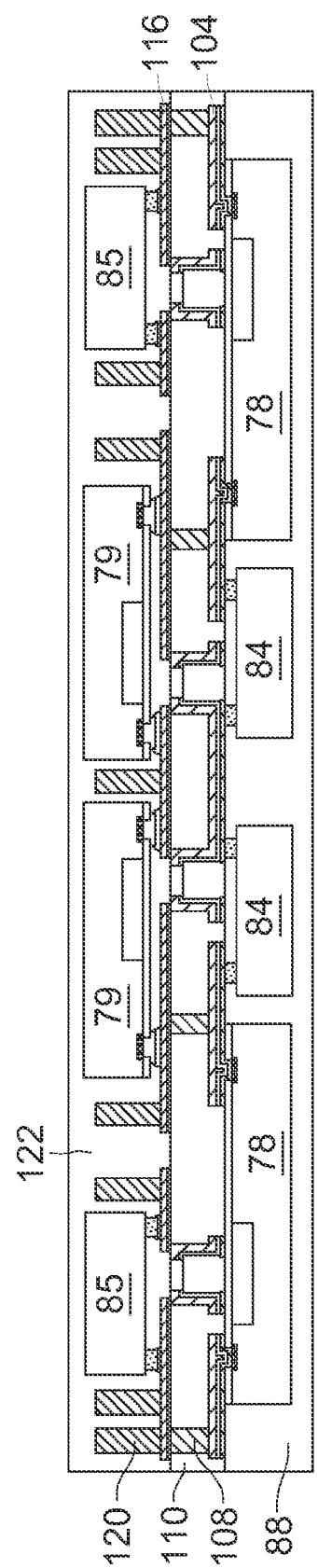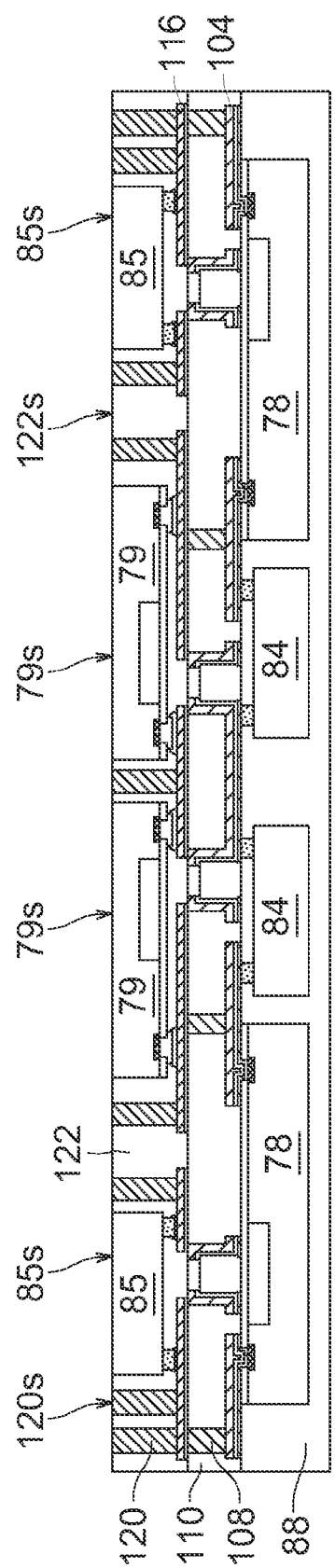
Fig. 5X
Fig. 5Y

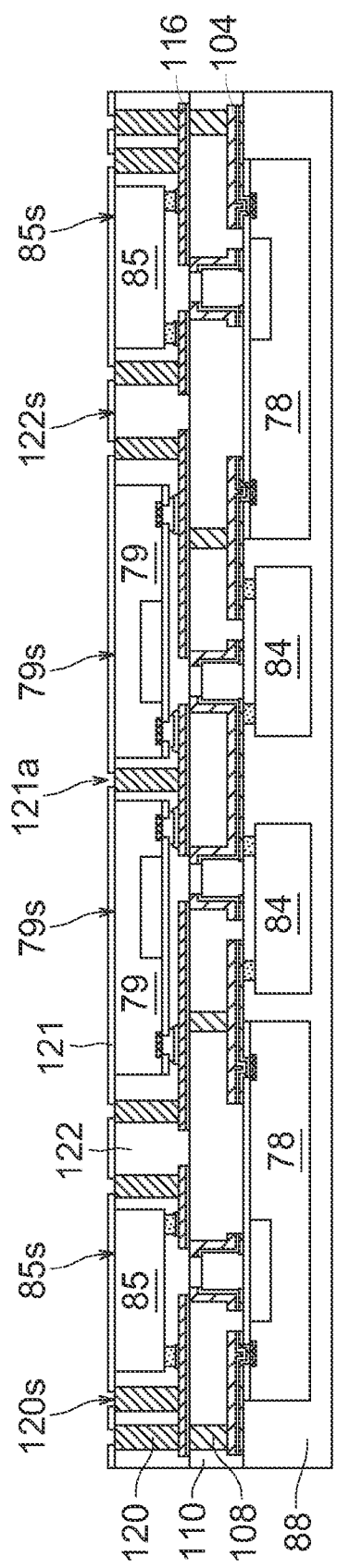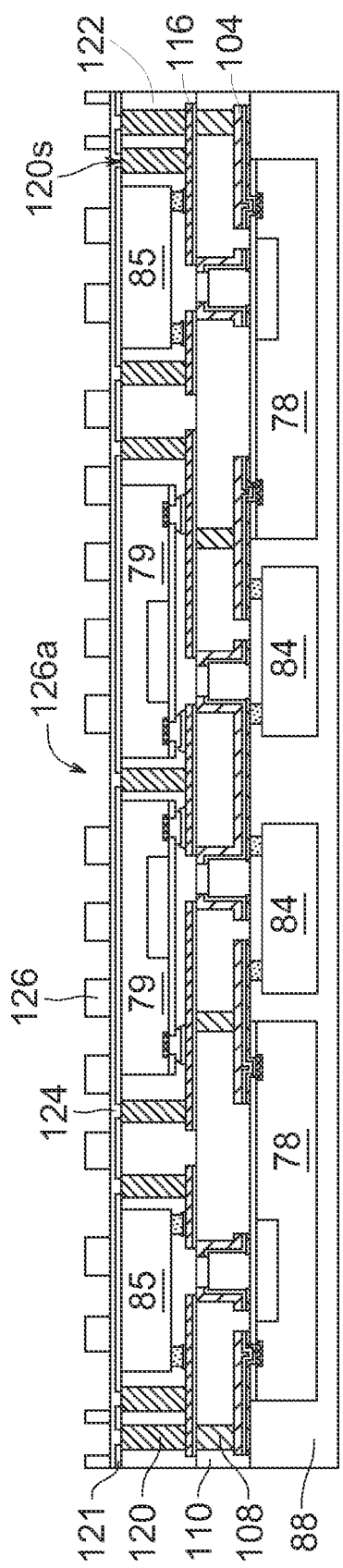
Fig. 5Z
Fig. 5AA

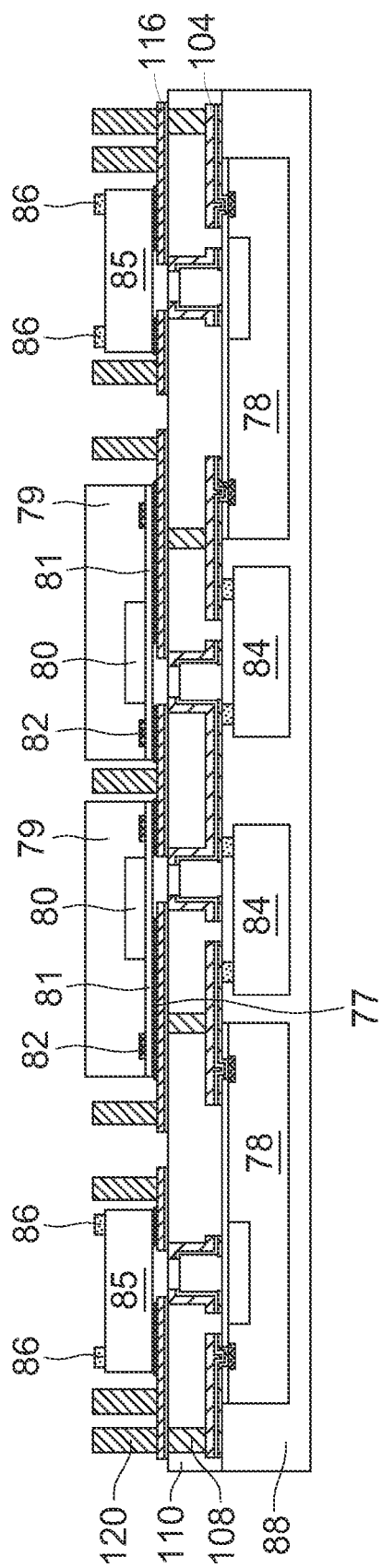
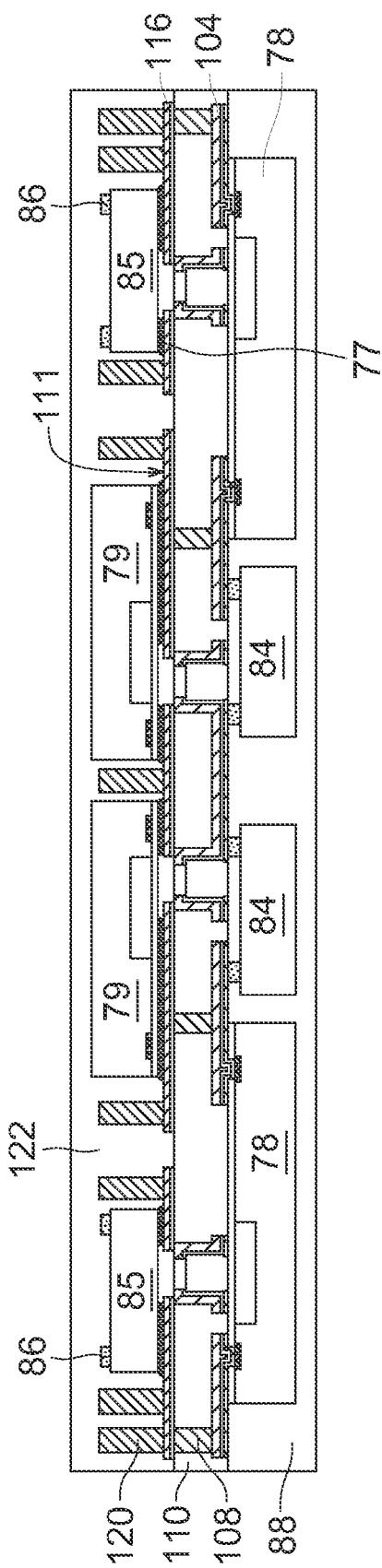
Fig. 6A
Fig. 6B

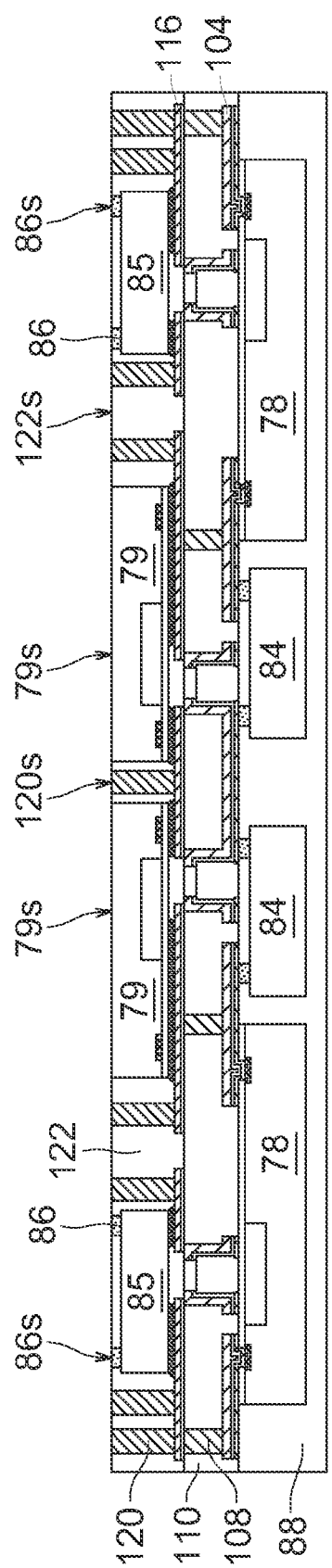
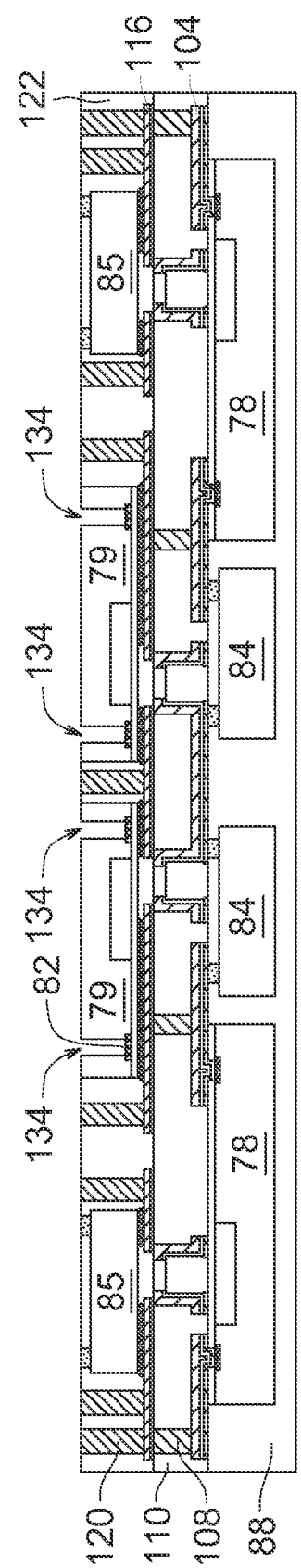
Fig. 6C
Fig. 6D

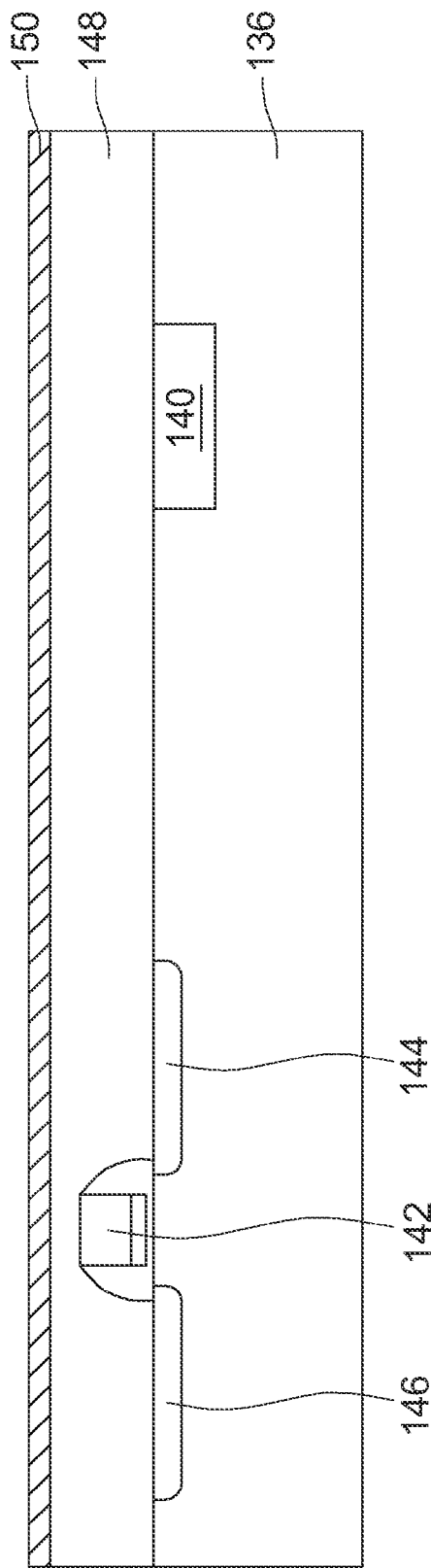
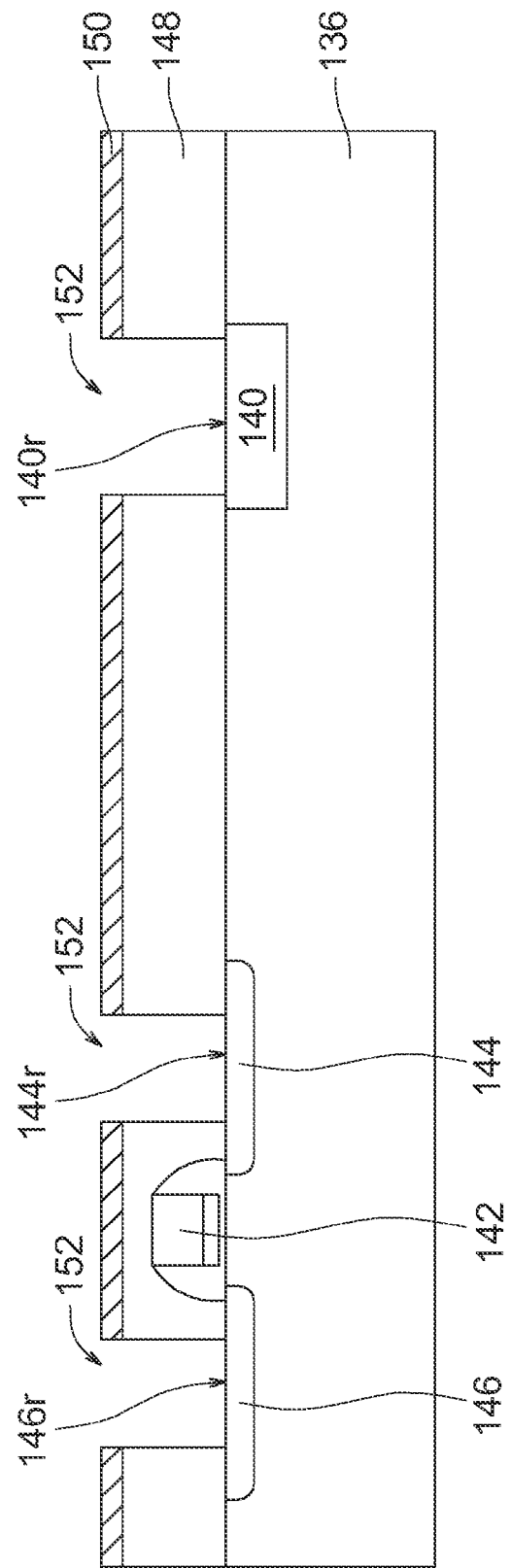

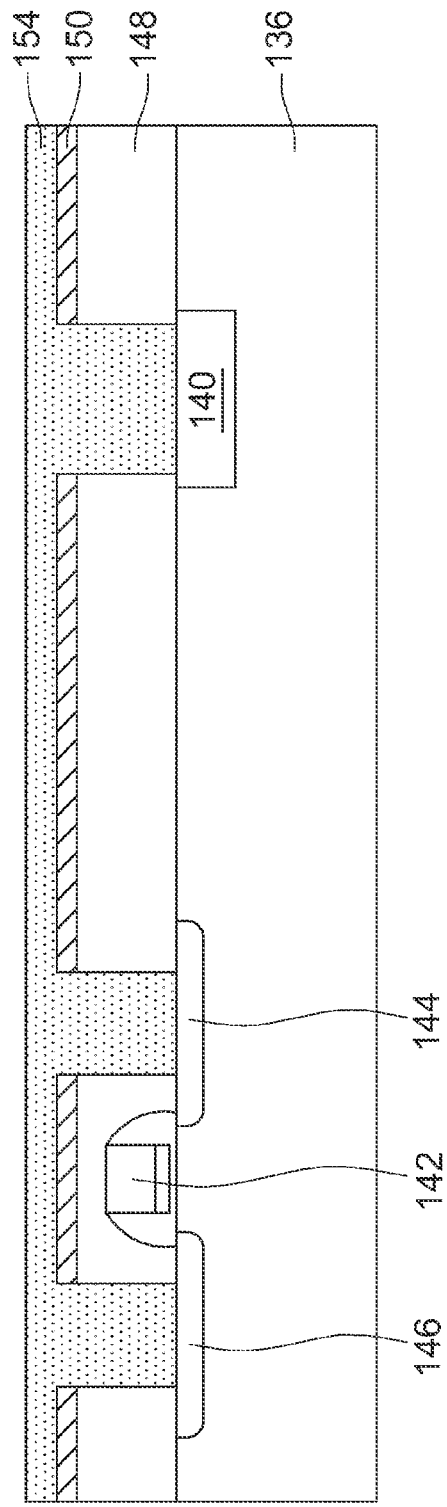
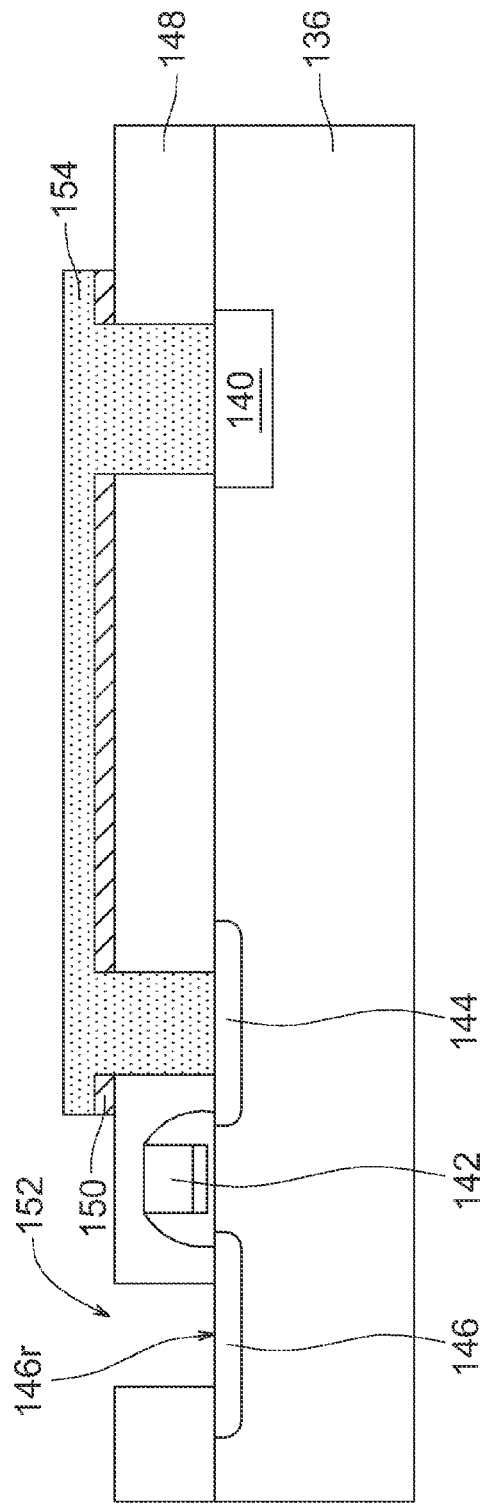
Fig. 7E
Fig. 7F

WAVEGUIDE STRUCTURES FOR SIGNAL AND/OR POWER TRANSMISSION IN A SEMICONDUCTOR DEVICE This application claims priority to U.S. Provisional Application No. 61/428,821, filed on Dec. 30, 2010, which is incorporated herein by reference.

BACKGROUND OF THE DISCLOSURE

1. Field of the Disclosure

The disclosure relates to forming a waveguide structure in a device, and more particularly to forming a waveguide structure for optical-signal transmission and power/ground delivery in a semiconductor device.

2. Brief Description of the Related Art

Progress in computer technology (and the continuation of Moore's Law) may become increasingly dependent on ultrafast data transfer between and/or within microchips. In this regard, high speed optical interconnects may be a promising way forward. Optical interconnects may require the integration of a range of technologies, including a laser source, a means to modulate light, a means to transfer light to a different chip (or a different region of the same chip), such as a waveguide, and a means to detect light and convert the data back into electronic form.

Waveguides used at optical frequencies may typically be dielectric waveguides, structures in which a dielectric material with permittivity, and thus high index of refraction, is surrounded by a material with lower permittivity. The waveguide structure may guide optical waves by total internal refraction. However, a photon transmitted in such a waveguide may be easily scattered out of the waveguide, for example, if external light comes into the photon channel of the waveguide. The scattering effect may cause the photon signals to have critical noises. Furthermore, semiconductor devices may have limited space for positioning waveguides.

SUMMARY OF THE DISCLOSURE

The present disclosure is directed to a chip or device that includes a waveguide structure which is used for optical-signal transmission and power/ground delivery. The waveguide structure can transmit optical signals in a horizontal direction and/or in a vertical direction, and can deliver power/ground in a horizontal direction and/or in a vertical direction.

Exemplary embodiments of the present disclosure provide a chip or device having a waveguide structure which can be used for transmitting optical signals and delivering power/ground. In one aspect, a chip or device may include a substrate, an illuminant device in or on the substrate, a sensor device in or on the substrate, and multiple power/ground traces in or on the substrate. Also included are a first reflecting layer, a transparent layer, a second reflecting layer, a metal layer, and multiple metal bumps. The first reflecting layer is on the substrate, the illuminant device, the sensor device, and the power/ground traces. A first opening in the first reflecting layer exposes a first contact area of the illuminant device, and a second opening in the first reflecting layer exposes a second contact area of the sensor device. The transparent layer is on a first region of the first reflecting layer, on the first contact area of the illuminant device, on the second contact area of the sensor device, and in the first and second openings. The transparent layer contacts the first region of the first reflecting layer, the first contact area of the illuminant device, the second contact area of the sensor device, and sidewalls of the first and second openings. The transparent layer can be configured for transmitting optical signals from the illuminant device to the sensor device. The second reflecting layer is on the transparent layer and on a second region of the first reflecting layer. The second reflecting layer contacts a top surface and sidewalls of the transparent layer and the second region of first reflecting layer. The metal layer is on the second reflecting layer, and the metal bumps are on or over the metal layer. The metal layer contacts a top surface of the second reflecting layer. The metal bumps are connected to the metal layer. The metal bumps can be connected to the power/ground traces through multiple metal traces composed of the metal layer, the second reflecting layer, and the first reflecting layer. The metal traces can be configured for delivering power/ground.

Furthermore, exemplary embodiments can be used in multi-chip packaging.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIGS. 1A-1L show a process for forming a device with waveguide structures for signal transmission and power/ground delivery according to an exemplary embodiment of the present disclosure;

FIG. 1O illustrates a three-dimensional view of a device with waveguide structures for signal transmission and power/ground delivery according to an embodiment of the present disclosure;

FIGS. 6A-6J show a process for forming a multi-chip package with waveguide structures for signal transmission and power/ground delivery according to an exemplary embodiment of the present disclosure.

Figure 1C:
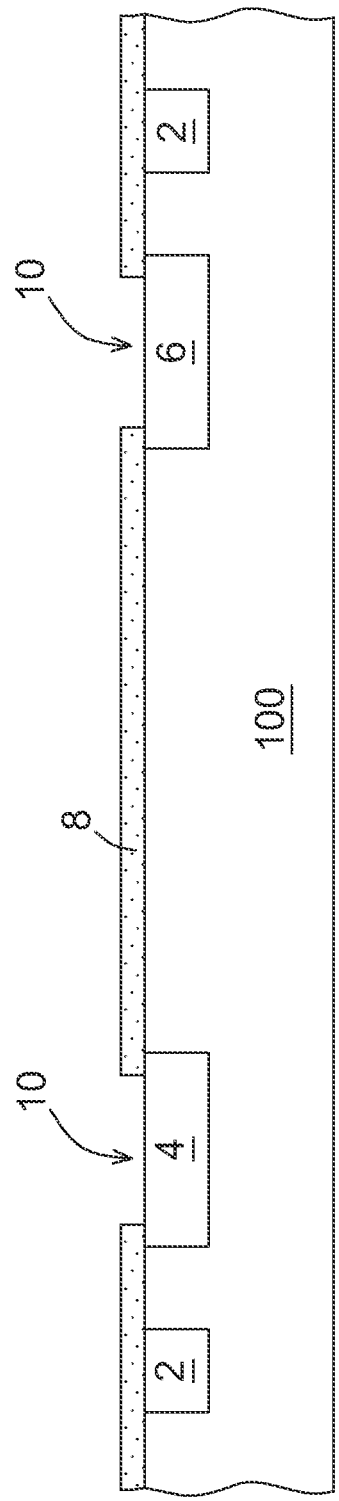

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Figure 1D:
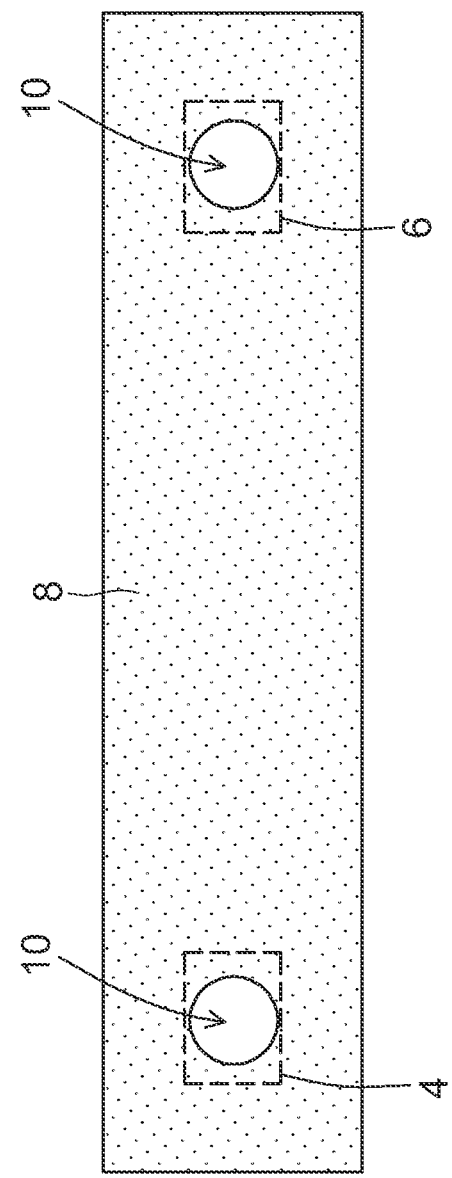
Figure 1M:
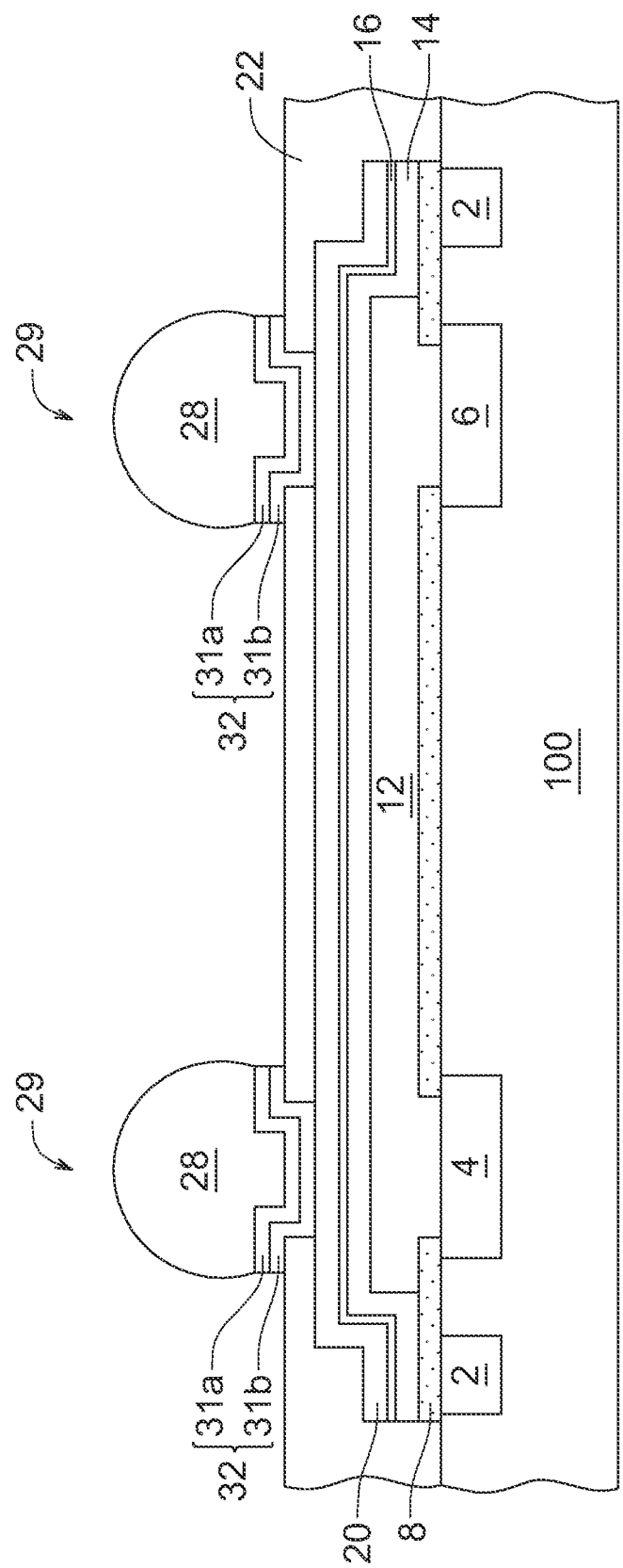
FIG. 1M shows a cross-sectional view of a device with waveguide structures for signal transmission and power/ground delivery according to an embodiment of the present disclosure.
Figure 1N:
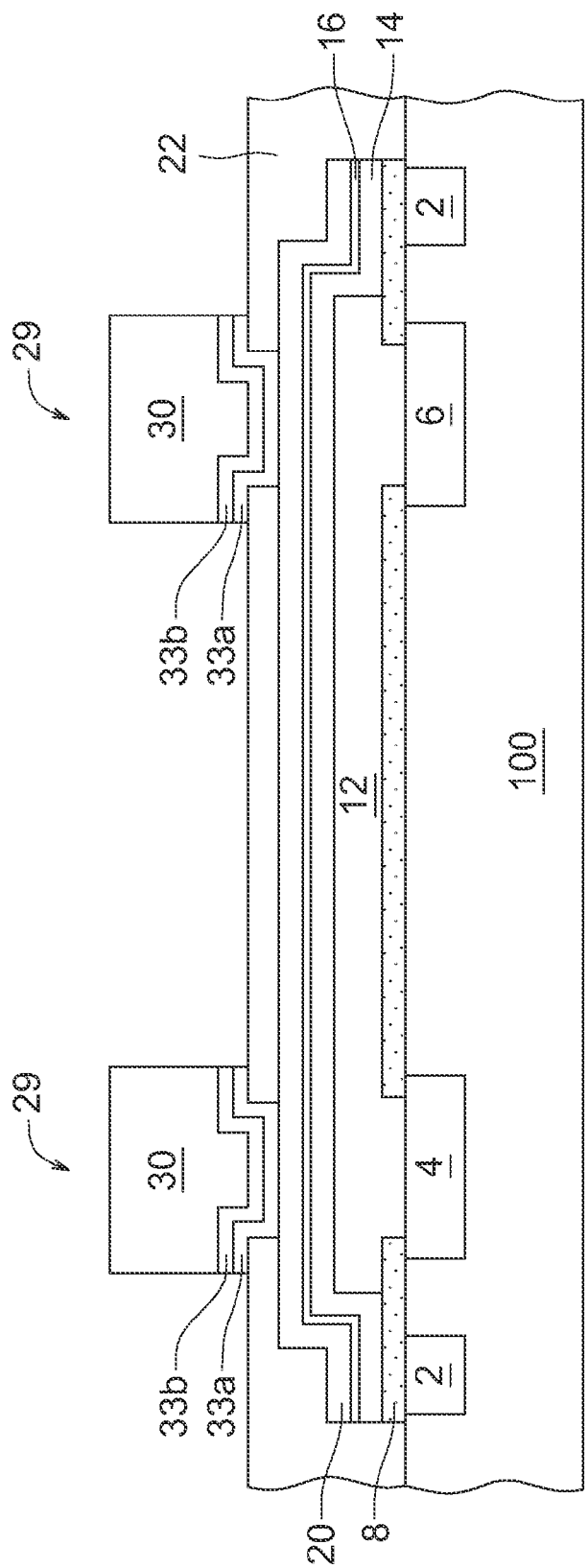
FIG. 1N shows a cross-sectional view of a device with waveguide structures for signal transmission and power/ground delivery according to an embodiment of the present disclosure.
Figure 10:
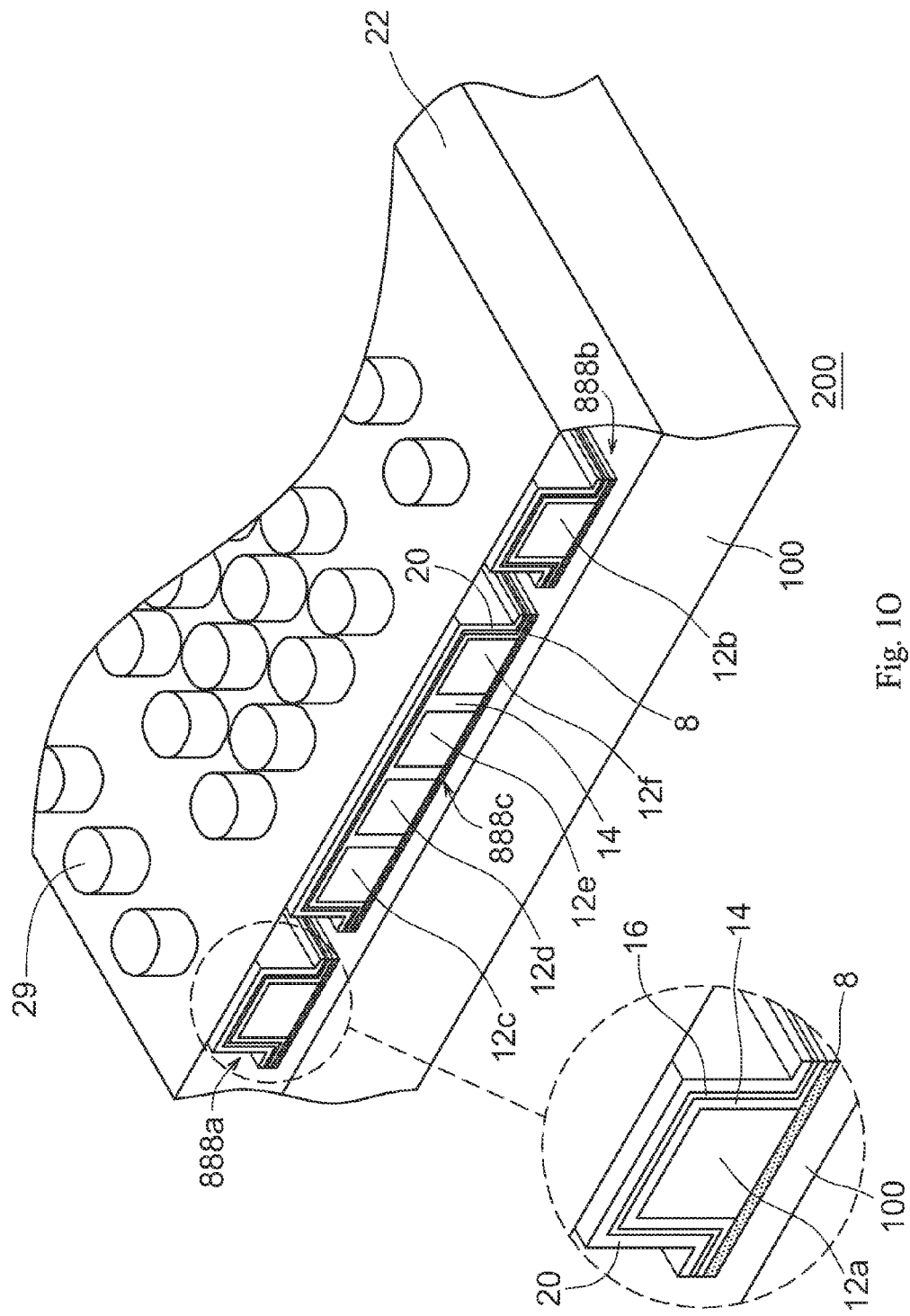

FIGS. 1A-1N illustrate a process of forming a device with waveguide structures for signal transmission and power/ground delivery.

FIG. 1A illustrates a cross-section view of a substrate 100, in or on which multiple illuminant devices 4 (one of them is shown) and multiple sensor devices 6 (one of them is shown) are provided. Multiple power/ground contacts 2 may also be provided in or on the substrate 100.

The substrate 100, for example, may be a semiconductor substrate, such as silicon based substrate, gallium arsenide (GaAs) based substrate, silicon indium based (SiIn) substrate, silicon antimony based (SiSb) substrate, indium antimony (InSb) based substrate, or silicon germanium (SiGe) based substrate. Alternatively, the substrate 100 may be a glass substrate, a flexible substrate, a printed circuit board (PCB) substrate, a metal substrate, a ceramic substrate, or a polymer substrate. The power/ground contacts 2 may be power/ground pads or power/ground connections. The illuminant device 4 may be a light emitting diode (LED), a laser device, or generally any light emitting device. Alternatively or in addition, the illuminant device 4 may be included within a chip, and/or the illuminant device 4 may include germanium and/or aluminum. The sensor device 6 may be a light sensor, an image sensor, a complementary metal-oxide-semiconductor (CMOS) sensor, or generally any sensor capable of detecting light emitted from the illuminant device 4.

Next, referring to FIG. 1B, a first reflecting layer 8 is formed on the substrate 100, the illuminant device 4, the sensor device 6, and the power/ground contacts 2 by a suitable process, such as vacuum deposition process, plasma-enhanced chemical-vapor Deposition (PECVD) process, or physical-vapor deposition (PVD) process. The physical-vapor deposition process can be a sputtering process or an evaporation process. The first reflecting layer 8 may include or may be a layer of one or more of chromium, nickel, titanium, tantalum, copper, gold, silver, and aluminum. The first reflecting layer 8 may have a suitable thickness, e.g., smaller than 3 micrometers, such as between 0.5 and 3 micrometers, or between 20 nanometers and 1.5 micrometers.

Next, referring to FIG. 1C, using a suitable process, such as etching process, multiple openings 10 are formed in the first reflecting layer 8 and expose the illuminant device 4 and the sensor device 6. FIG. 1D shows a schematic top view of the illuminant device 4, the sensor device 6, the first reflecting layer 8 and the openings 10 as illustrated in FIG. 1C.

Next, referring to FIG. 1E, a patterned transparent layer 12 can be formed on the first reflecting layer 8, the illuminant device 4, and the sensor device 6 by a suitable process, such as spin-on coating process or chemical-vapor-deposition (CVD) process. The patterned transparent layer 12 may include or may be a transparent polymer layer or a diamond layer. Alternatively, the patterned transparent layer 12 may include or may be a layer of one or more of polyimide, Polymethylmethacrylate (PMMA), Polystyrene (PS), Polycarbonate (PC), glass, and glass fiber. The patterned transparent layer 12 may have a suitable thickness, e.g., smaller than 50 micrometers, such as between 2 and 20 micrometers, between 0.1 and 2 micrometers, or between 2 nanometers and 50 micrometers. For example, the patterned transparent layer 12 can be formed by spin-on coating a polymer layer on the first reflecting layer 8, the illuminant device 4 and the sensor device 6, next exposing the spin-on coated polymer layer, next developing the exposed polymer layer, and then curing the developed polymer layer.

Next, referring to FIG. 1F, a second reflecting layer 14 can be formed on the patterned transparent layer 12 and on the first reflecting layer 8 not under the patterned transparent layer 12. The second reflecting layer 14 covers and contacts a top surface of the patterned transparent layer 12 and sidewalls of the patterned transparent layer 12. The second reflecting layer 14 also contacts a top surface of the first reflecting layer 8 not under the patterned transparent layer 12. The second reflecting layer 14 may include or may be a layer of one or more of chromium, nickel, titanium, copper, gold, silver, and aluminum formed or deposited using a suitable process, such as vacuum deposition, PVD, or PECVD. The second reflecting layer 14 may include a material same as a material of the first reflecting layer 8. The second reflecting layer 14 may have a suitable thickness, e.g., smaller than 3 micrometers, such as between 0.5 and 3 micrometers, or between 20 nanometers and 1.5 micrometers. The second reflecting layer 14 may have a first top surface vertically over the patterned transparent layer 12 and a second top surface not vertically over the patterned transparent layer 12, and the first top surface of the second reflecting layer 14 is higher than the second top surface of the second reflecting layer 14.

Next, referring to FIG. 1G, a seed layer 16 can be formed on the second reflecting layer 14 by a suitable process, such as physical-vapor deposition (PVD) process, sputtering process, or evaporation process. The seed layer 16 may include or may be a layer of one or more of gold, copper, silver, nickel, palladium, and platinum. The seed layer 16 may have a suitable thickness, e.g. smaller than 2 micrometers, such as between 0.3 and 2 micrometers or between 20 nanometers and 1.5 micrometers.

Next, referring to FIG. 1H, a photoresist layer 18 is formed on the seed layer 16 by using, e.g., a spin coating process, a screen printing process or a lamination process, and then a photo exposure process and a development process can be employed to form multiple openings 18a (one of them is shown) in the photoresist layer 18. The openings 18a in the photoresist layer 18 expose multiple regions of the seed layer 16. The photoresist layer 18 may include or may be a polymer layer.

Next, referring to FIG. 1I, a metal layer 20 is formed in the openings 18a and on the seed layer 16 exposed by the openings 18a. The metal layer 20 can be formed by a suitable process, such as electroplating process and/or electroless plating process. The metal layer 20 may include or may be a layer of one or more of gold, copper, silver, nickel, palladium, and platinum. The metal layer 20 may have a suitable thickness, e.g. smaller than 50 micrometers, such as between 1 and 20 micrometers, between 3 and 15 micrometers, or between 2 nanometers and 50 micrometers. For example, the metal layer 20 can be an electroplated copper layer having a thickness, e.g. smaller than 15 micrometers, such as between 2 nanometers and 10 micrometers or between 3 and 15 micrometers.

Next, referring to FIG. 1J, the photoresist layer 18 is removed by using, e.g., an organic chemical, and then the three layers 8, 14 and 16 not under the metal layer 20 are removed by a suitable process, such as dry etching process, wet etching process, chemical etching process or plasma etching process. Accordingly, the remaining reflecting layer 8, the patterned transparent layer 12, the remaining reflecting layer 14, the remaining seed layer 16, and the metal layer 20 compose multiple waveguide structures 888 (one of them is shown). Alternatively, the two layers 16 and 20 can be replaced with an aluminum-containing layer such as aluminum layer or aluminum-alloy layer, and the aluminum-containing layer could be formed on the second reflecting layer 14.

The remaining reflecting metal layers 8 and 14 have a good reflectivity of light and contact the top surface, bottom surface and sidewalls of the patterned transparent layer 12. Thus, attenuation of optical signal transmitted through the patterned transparent layer 12 can be reduced.

Each of the waveguide structures 888 may include an optical-signal transmission part and a power/ground delivery part. The optical-signal transmission part is composed of a piece of the patterned transparent layer 12 and transmits an optical signal from one or more of the illuminant devices 4 to one or more of the sensor devices 6. The optical-signal transmission part is used for a waveguide. The power/ground delivery part is composed of the layers 16 and 20 and is connected to one or more of the power/ground contacts 2.

Alternatively, the layers 16 and 20 may be configured for transmitting an electrical signal. Accordingly, two kinds of the waveguide structures 888 could be formed on the substrate 100. One of them includes an optical-signal transmission part composed of a piece of the patterned transparent layer 12 for transmitting an optical signal from one or more of the illuminant devices 4 to one or more of the sensor devices 6 and includes a power/ground delivery part composed of the layers 16 and 20 for connecting one or more of the power/ground contacts 2. The other includes an optical-signal transmission part composed of a piece of the patterned transparent layer 12 for transmitting an optical signal from one or more of the illuminant devices 4 to one or more of the sensor devices 6 and includes an electrical-signal transmission part composed of the layers 16 and 20 for connecting one or more of devices (not shown) in or on the substrate 100.

The illuminant device 4 shown in FIG. 1J could be connected to the left power/ground contact 2 shown in FIG. 1J, and the sensor device 6 shown in FIG. 1J could be connected to the right power/ground contact 2 shown in FIG. 1J. In one case, the left and right power/ground contacts 2 shown in FIG. 1J can be two power contacts, and the above-mentioned power/ground delivery part can be a power delivery part connecting the two power contacts to each other. Also, in another case, the left and right power/ground contacts 2 shown in FIG. 1J can be two ground contacts, and the above-mentioned power/ground delivery part can be a ground delivery part connecting the two ground contacts to each other.

Next, referring to FIG. 1K, an insulating layer 22 is formed on the substrate 100 and the waveguide structures 888, and multiple openings 24 in the insulating layer 22 are over multiple contact points of the metal layer 20 and expose the contact points of the metal layer 20. The contact points of the metal layer 20 are at bottoms of the openings 24. The insulating layer 22 may include or may be a layer of one or more of silicon nitride, silicon oxynitride, silicon oxide, epoxy, polyimide, benzocyclobutene (BCB), acrylic, and SU-8 formed using a suitable process. For example, the insulating layer 22 includes or is a nitride layer, such as silicon-nitride layer or silicon-oxynitride layer, formed by a suitable process such as chemical vapor deposition (CVD) process. Alternatively, the insulating layer 22 includes or is a polymer layer, such as epoxy, polyimide or benzocyclobutene (BCB), formed by a suitable process such as spin coating process, dispensing process, molding process, or screen printing process. Alternatively, the insulating layer 22 includes a nitride layer, such as silicon-nitride layer or silicon-oxynitride layer, and an oxide layer, such as silicon-oxide layer, over or under the nitride layer. Alternatively, the insulating layer 22 includes a nitride layer such as silicon-nitride layer or silicon-oxynitride layer, an oxide layer such as silicon-oxide layer over or under the nitride layer, and a polymer layer over the nitride layer and the oxide layer.

Next, referring to FIG. 1L, multiple bonding wires 26 can be bonded to the contact points of the metal layer 20 through the openings 24 in the insulating layer 22 by a wirebonding process. The wires 26 may include gold, copper, or aluminum. The waveguide structures 888 can be connected to one or more of other components through the wirebonded wires 26.

Referring to FIG. 1M or 1N, alternatively or in addition to forming the wirebonded wire 26, multiple metal bumps or interconnects 29 may be formed on the contact points of the metal layer 20, on a top surface of the insulating layer 22 and in the openings 24.

For example, referring to FIG. 1M, each of the metal bumps 29 may include an under-bump-metal (UBM) layer 32 and a solder bump or ball 28 on the UBM layer 32. The UBM layers 32 are formed on the contact points of the metal layer 20, on the top surface of the insulating layer 22 and in the openings 24. Each of the UBM layers 32 may include a metal layer 31a and a metal layer 31b on the metal layer 31a. The meal layer 31a may be or may include a titanium-containing layer, such as titanium layer or titanium-tungsten-alloy layer, or a tantalum-containing layer, such as tantalum layer or tantalum-nitride layer. The metal layer 31b may include a copper layer over the metal layer 31a and may further include a nickel-containing layer on the copper layer. The solder bumps or balls 28 are connected to the contact points of the metal layer 20 through the UBM layers 32. The solder bumps or balls 28 are formed by a suitable process which may include screen plating process, ball mounting process, or electroplating process. Each of the solder bumps or balls 28 may be or may include gold-tin alloy, tin-silver alloy, tin-silver-copper alloy, indium, tin-bismuth or other lead-free alloys. Alternatively or in addition, each of the solder bumps or balls 28 may be or may include a lead alloy. Each of the solder bumps or balls 28 may have a suitable width, such as between 10 and 300 micrometers.

Alternatively, referring to FIG. 1N, each of the metal bumps 29 may include an adhesion/barrier layer 33a, a seed layer 33b on the adhesion/barrier layer 33a, and a metal layer 30 on the seed layer 33b. The adhesion/barrier layers 33a can be formed on the contact points of the metal layer 20, on the top surface of the insulating layer 22 and in the openings 24.

The adhesion/barrier layers 33a and the seed layers 33b are vertically under the metal layers 30. Each of the metal layers 30 has a sidewall or sidewalls not covered with the adhesion/barrier layers 33a and the seed layers 33b. The metal layers 30 are connected to the contact points of the metal layer 20 through the adhesion/barrier layers 33a and the seed layers 33b. The adhesion/barrier layers 33a can be formed by a physical-vapor deposition (PVD) process, such as sputtering process or evaporation process, by a chemical-vapor deposition (CVD) process, or by other thin-film deposition processes, such as atomic layer deposition (ALD). The seed layers 33b can be formed by a physical-vapor deposition (PVD) process, such as sputtering process or evaporation process, by a chemical-vapor deposition (CVD) process, or by other thin-film deposition processes, such as atomic layer deposition (ALD). The metal layers 30 can be formed by a suitable process. For example, the metal layers 30 can be formed by a process including electroplating and/or electroless plating.

Each of the adhesion/barrier layers 33a may be or may include a titanium-containing layer, such as titanium layer or titanium-tungsten-alloy layer. Alternatively, each of the adhesion/barrier layers 33a may be or may include a tantalum-containing layer, such as tantalum layer or tantalum-nitride layer. Each of the seed layers 33b can be a copper layer, a gold layer, a nickel layer, a silver layer, a palladium layer, or a platinum layer. Alternatively, each of the seed layers 33b may include copper, gold, nickel, silver, palladium, or platinum. Each of the metal layers 30 may be or may include an electroplated copper layer having a thickness between 5 and 100 micrometers, an electroplated gold layer having a thickness between 5 and 100 micrometers, an electroplated nickel layer having a thickness between 5 and 100 micrometers, an electroplated palladium layer having a thickness between 5 and 100 micrometers, an electroplated silver layer having a thickness between 5 and 100 micrometers, an electroplated platinum layer having a thickness between 5 and 100 micrometers, or a tin-containing solder having a thickness between 10 and 150 micrometers. Alternatively, each of the metal layers 30 may include an electroplated copper layer having a thickness between 5 and 100 micrometers on the seed layer 33b and a gold or palladium layer having a thickness smaller than 2 micrometers on the copper layer. Alternatively, each of the metal layers 30 may include an electroplated copper layer having a thickness between 5 and 100 micrometers on the seed layer 33b, a nickel layer having a thickness smaller than 2 micrometers on the copper layer, and a gold or palladium layer having a thickness smaller than 2 micrometers on the nickel layer. Alternatively, each of the metal layers 30 may include an electroplated copper layer having a thickness between 5 and 100 micrometers on the seed layer 33b, a nickel-containing layer on the copper layer, and a tin-containing solder having a thickness between 10 and 150 micrometers on the nickel-containing layer. The tin-containing solder can be formed by a suitable process, such as electroplating process.

FIG. 1O shows a perspective view of a device 200. The device 200 can be formed by a suitable process including the steps illustrated in FIGS. 1A-1K and FIG. 1M or 1N. Thus, the device 200 includes the substrate 100, the first reflecting layer 8, the patterned transparent layer 12, the second reflecting layer 14, the seed layer 16, the metal layer 20, the insulating layer 22, and the metal bumps 29 illustrated in FIG. 1M or 1N. The device 200 has the above-mentioned waveguide structures 888, and the waveguide structures 888 of the device 200 include three waveguide structures 888a, 888b and 888c. Each of the waveguide structures 888a and 888b can be illustrated as the waveguide structure 888 shown in FIG. 1J. The waveguide structure 888a can be composed of the reflecting layer 8, a piece 12a of the patterned transparent layer 12 on the reflecting layer 8, the reflecting layer 14 on the reflecting layer 8 and on a top surface and sidewalls of the piece 12a, the seed layer 16 on the reflecting layer 14, and the metal layer 20 on the seed layer 16. The waveguide structure 888b can be composed of the reflecting layer 8, a piece 12b of the patterned transparent layer 12 on the reflecting layer 8, the reflecting layer 14 on the reflecting layer 8 and on a top surface and sidewalls of the piece 12b, the seed layer 16 on the reflecting layer 14, and the metal layer 20 on the seed layer 16. The waveguide structure 888c can be composed of the reflecting layer 8, four pieces 12c, 12d, 12e and 12f of the patterned transparent layer 12 on the reflecting layer 8, the reflecting layer 14 on the reflecting layer 8, on top surfaces and sidewalls of the pieces 12c, 12d, 12e and 12f, in a gap between the pieces 12c and 12d, in a gap between the pieces 12d and 12e and in a gap between the pieces 12e and 12f, the seed layer 16 on the reflecting layer 14, and the metal layer 20 on the seed layer 16. The metal bumps 29 are connected to the metal layer 20 of the waveguide structures 888 including the waveguide structures 888a, 888b and 888c. Each of the pieces 12a, 12b, 12c, 12d, 12e and 12f can be the optical-signal transmission part illustrated in FIG. 1J. The layers 16 and 20 of each of the waveguide structures 888a, 888b and 888c can be the power/ground delivery part or the electrical-signal transmission part, as illustrated in FIG. 1J. The piece 12d has a portion spaced apart from the pieces 12c and 12e, and the piece 12f has a portion spaced apart from the pieces 12b and 12e.

The device 200 may be or may include a semiconductor chip, such as central-processing-unit (CPU) chip, graphics-processing-unit (GPU) chip, digital-signal-processing (DSP) chip, baseband chip, wireless local area network (WLAN) chip, memory chip (such as flash memory chip, dynamic-random-access-memory (DRAM) chip or static-random-access-memory (SRAM) chip), logic chip, analog chip, global-positioning-system (GPS) chip, or system-on chip (SOC) including a graphics-processing-unit (GPU) circuit block, a wireless local area network (WLAN) circuit block, a central-processing-unit (CPU) circuit block, a baseband circuit block and a memory circuit block (such as flash memory circuit block, dynamic-random-access-memory (DRAM) circuit block or static-random-access-memory (SRAM) circuit block). The waveguide structures 888, including the waveguide structures 888a, 888b and 888c, of the device 200 can be connected to multiple contact points of a circuit component through the metal bumps 29, and the circuit component may be or may include a mother board, a wafer, a panel, a chip, a glass substrate, a printed-circuit board (PCB), a ball-grid-array (BGA) substrate, an organic substrate, a ceramic substrate or a flexible substrate.

Figure 2C:
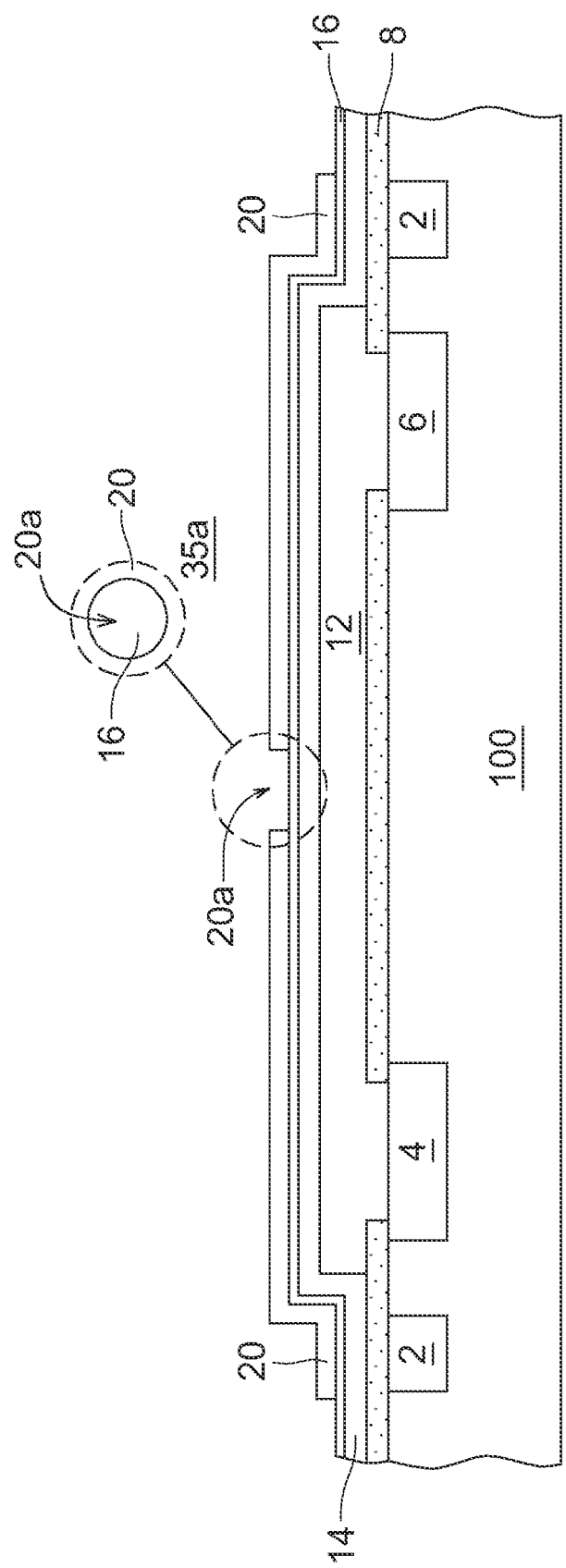
FIGS. 2A-2Q show a process for forming a device with waveguide structures for signal transmission and power/ground delivery according to an exemplary embodiment of the present disclosure.
Figure 2D:
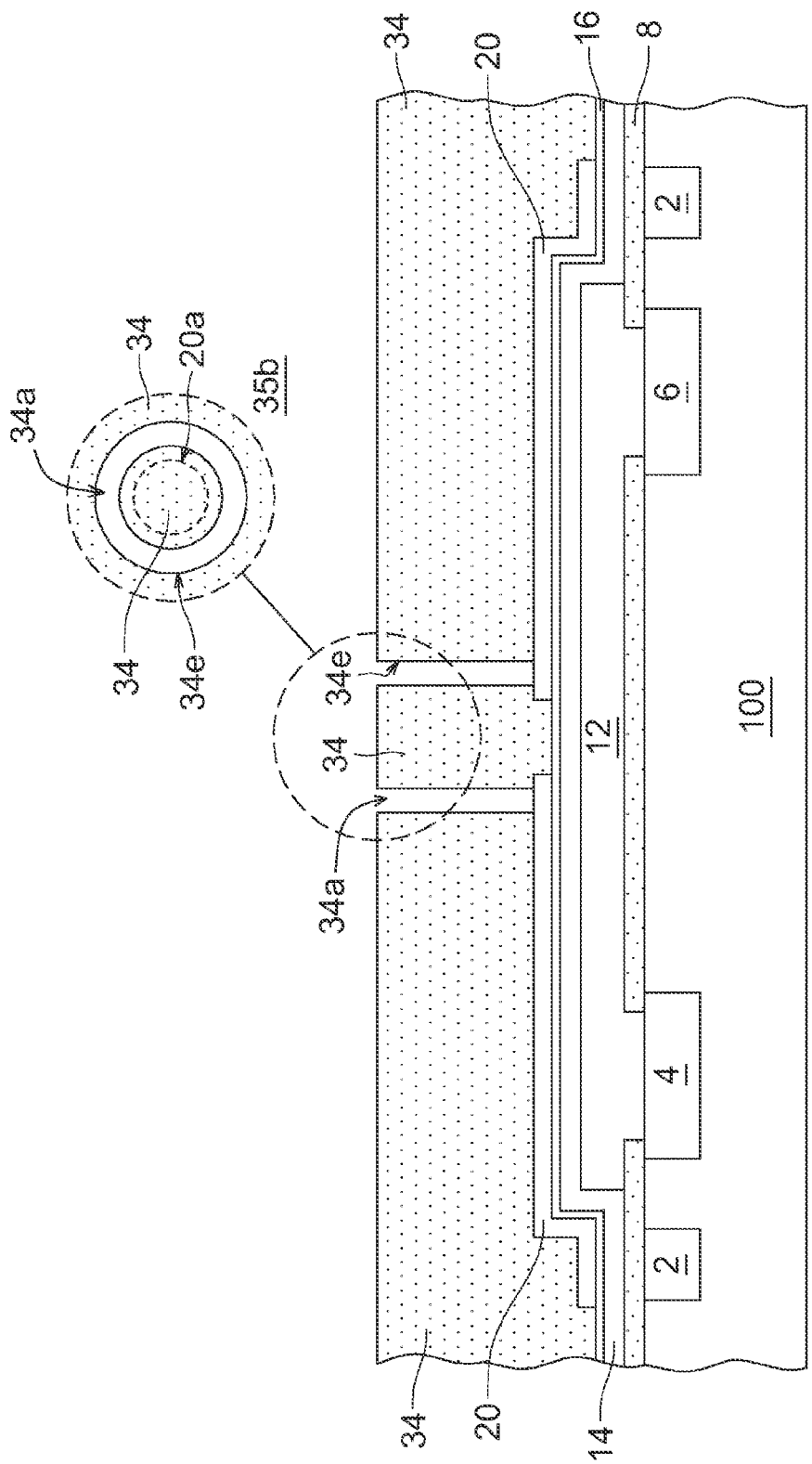
Figure 2E:
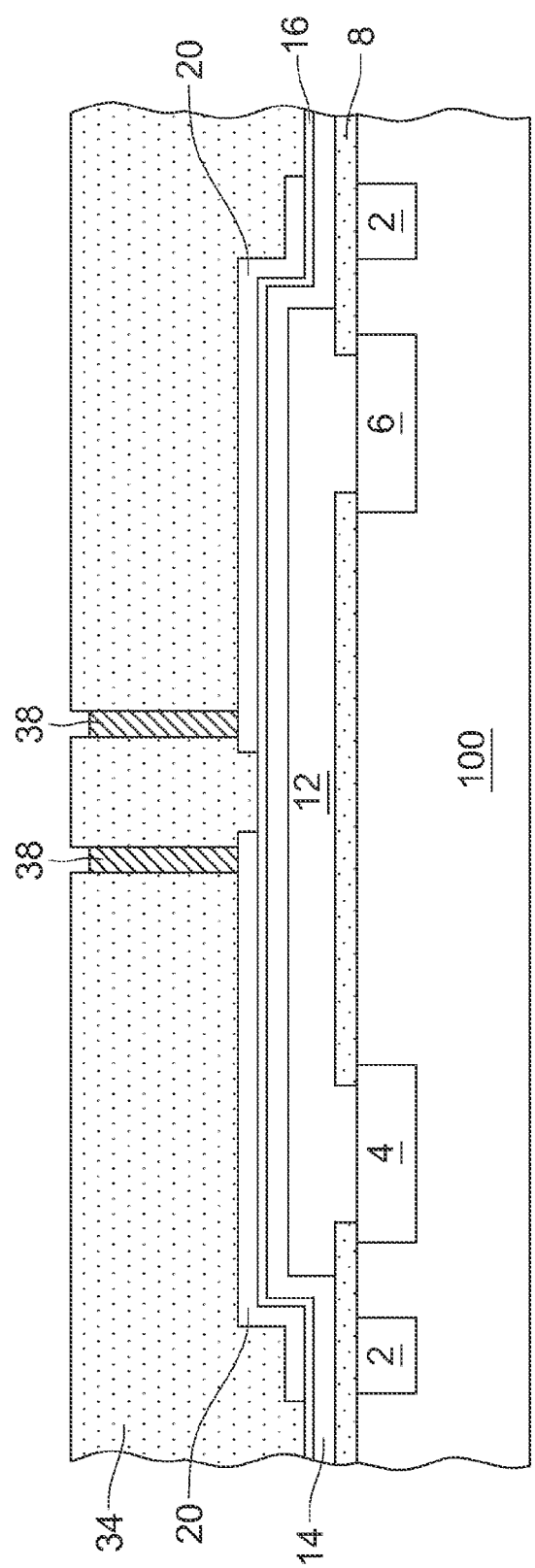
Figure 2F:
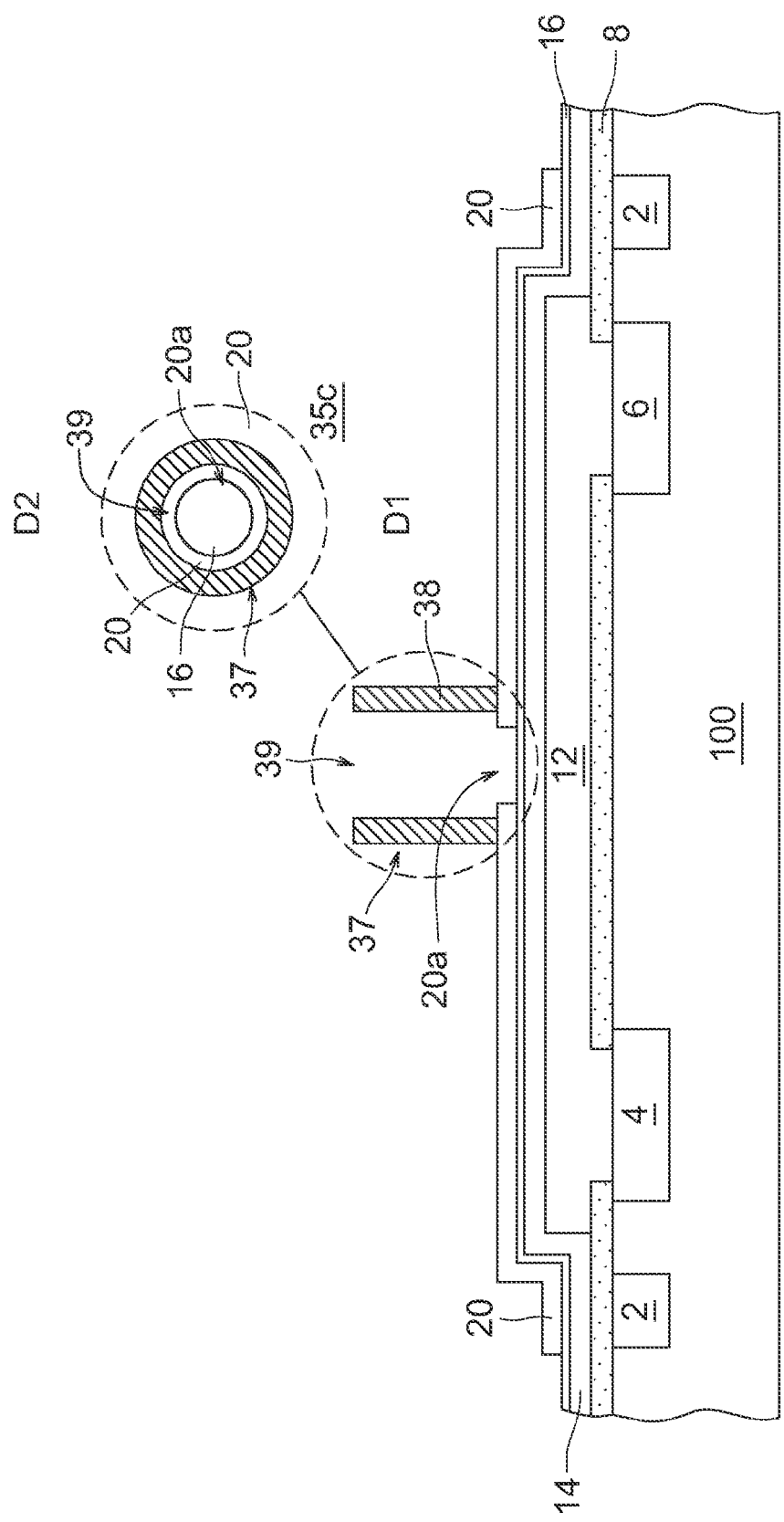
Figure 2I:
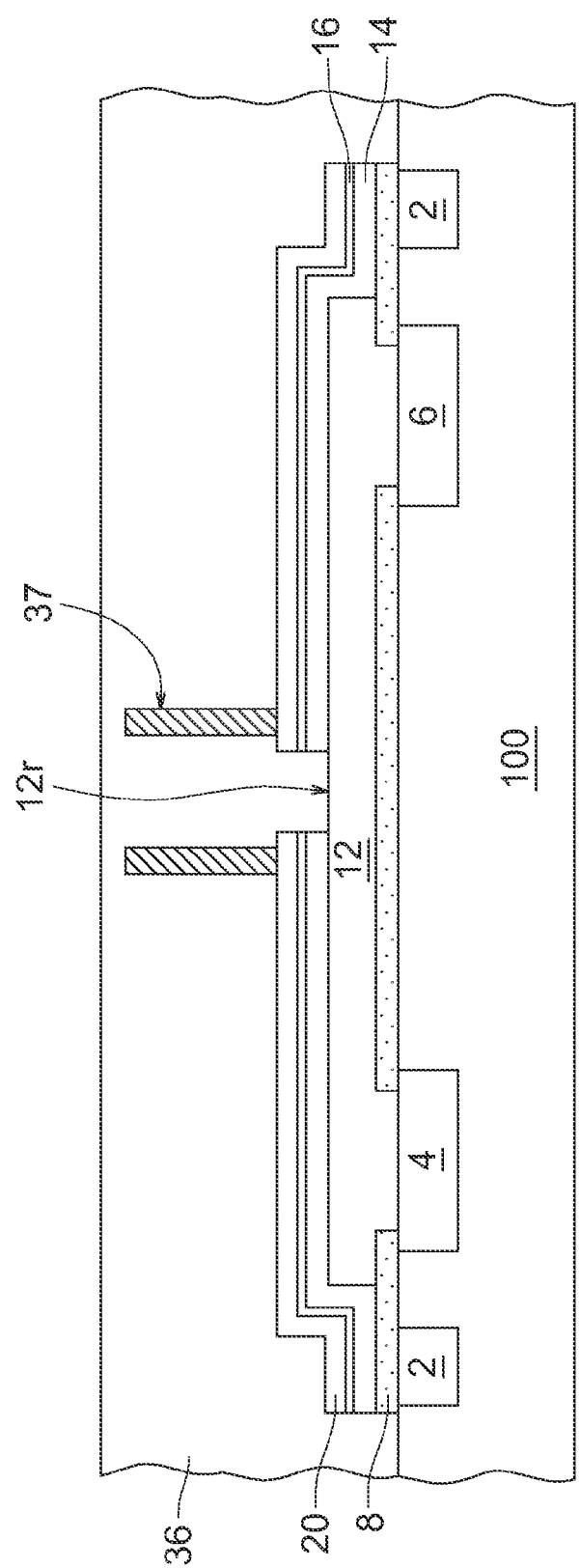
Figure 2J:
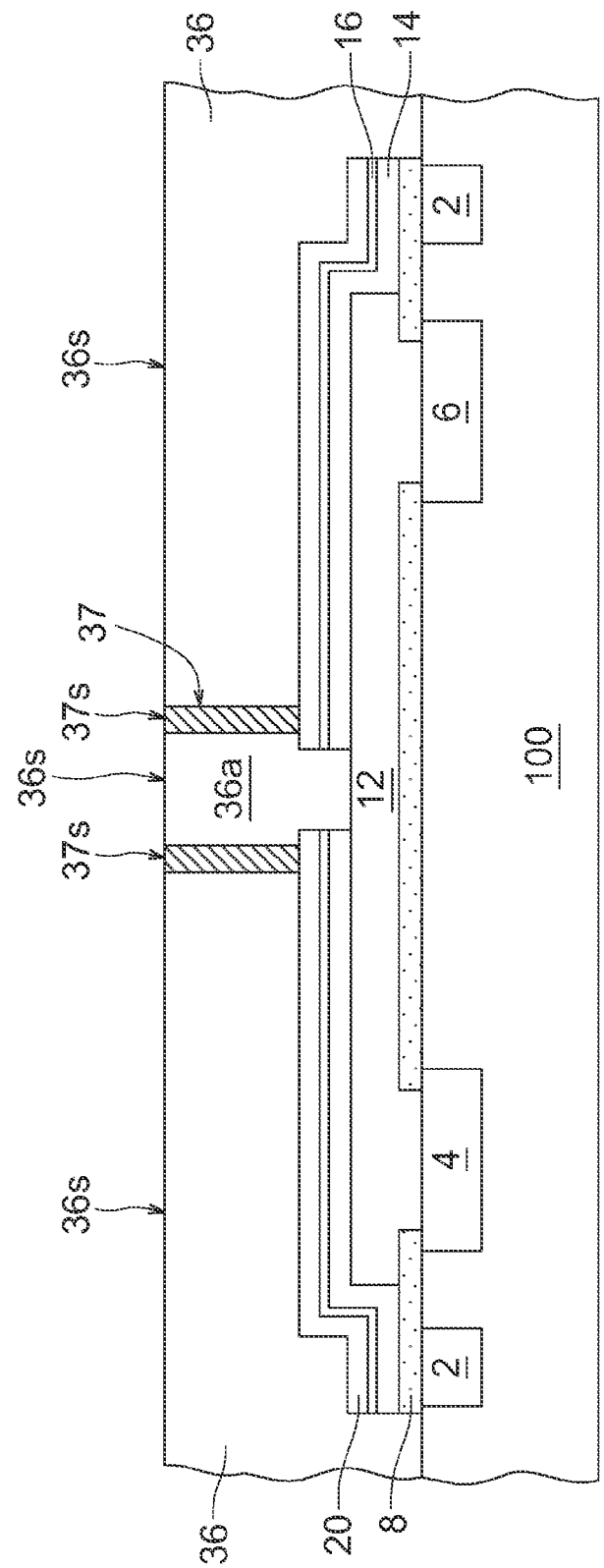
Figure 2K:
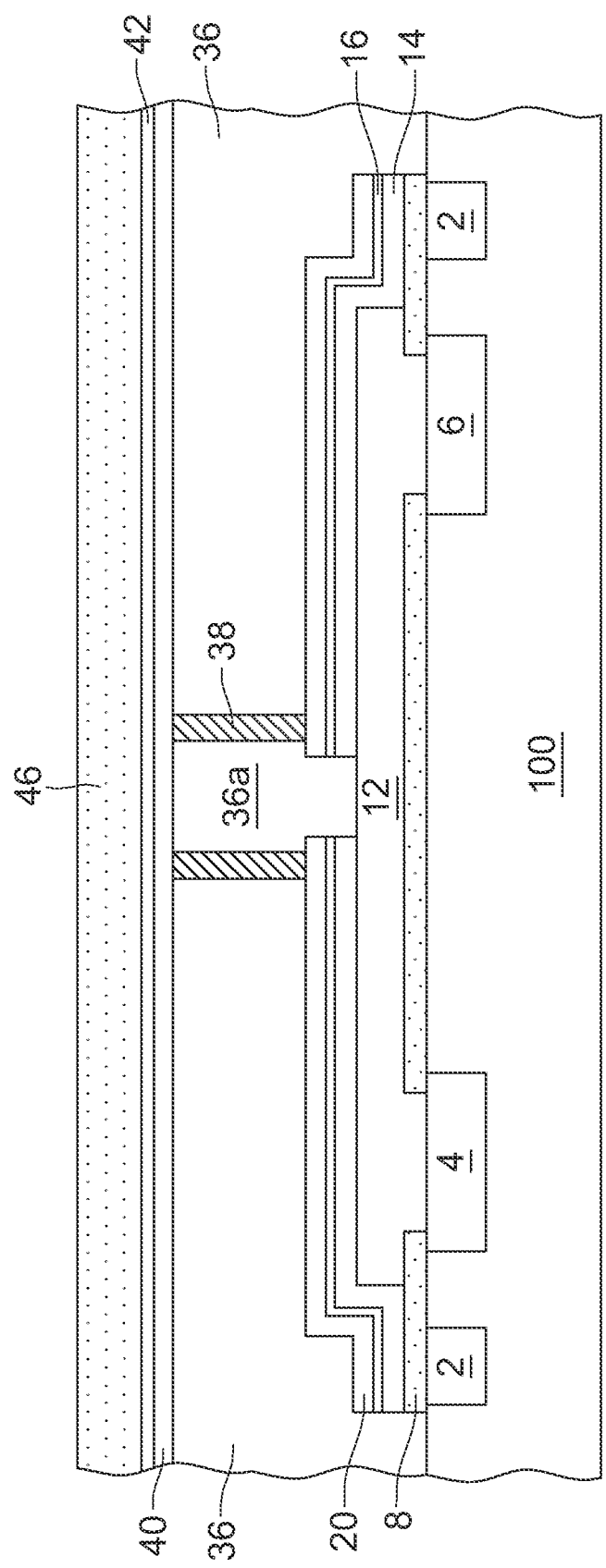
Figure 2N:
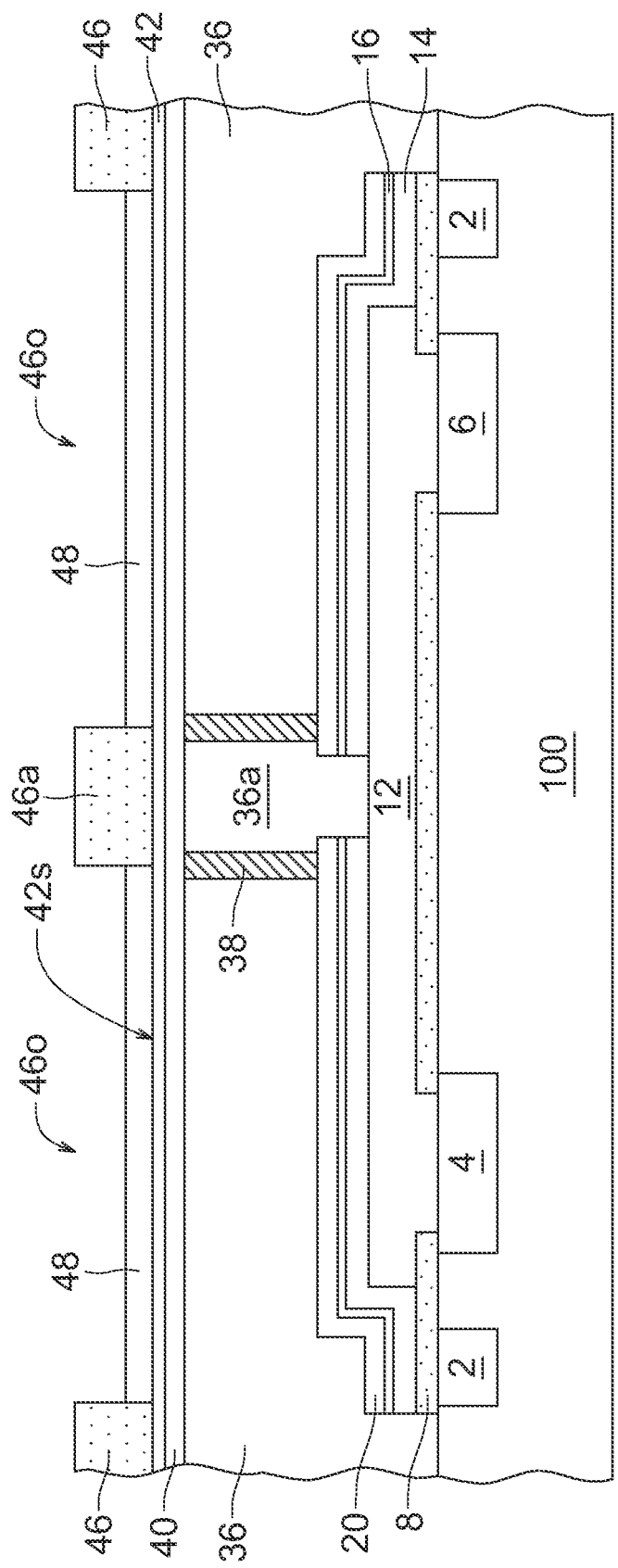
Figure 2Q:
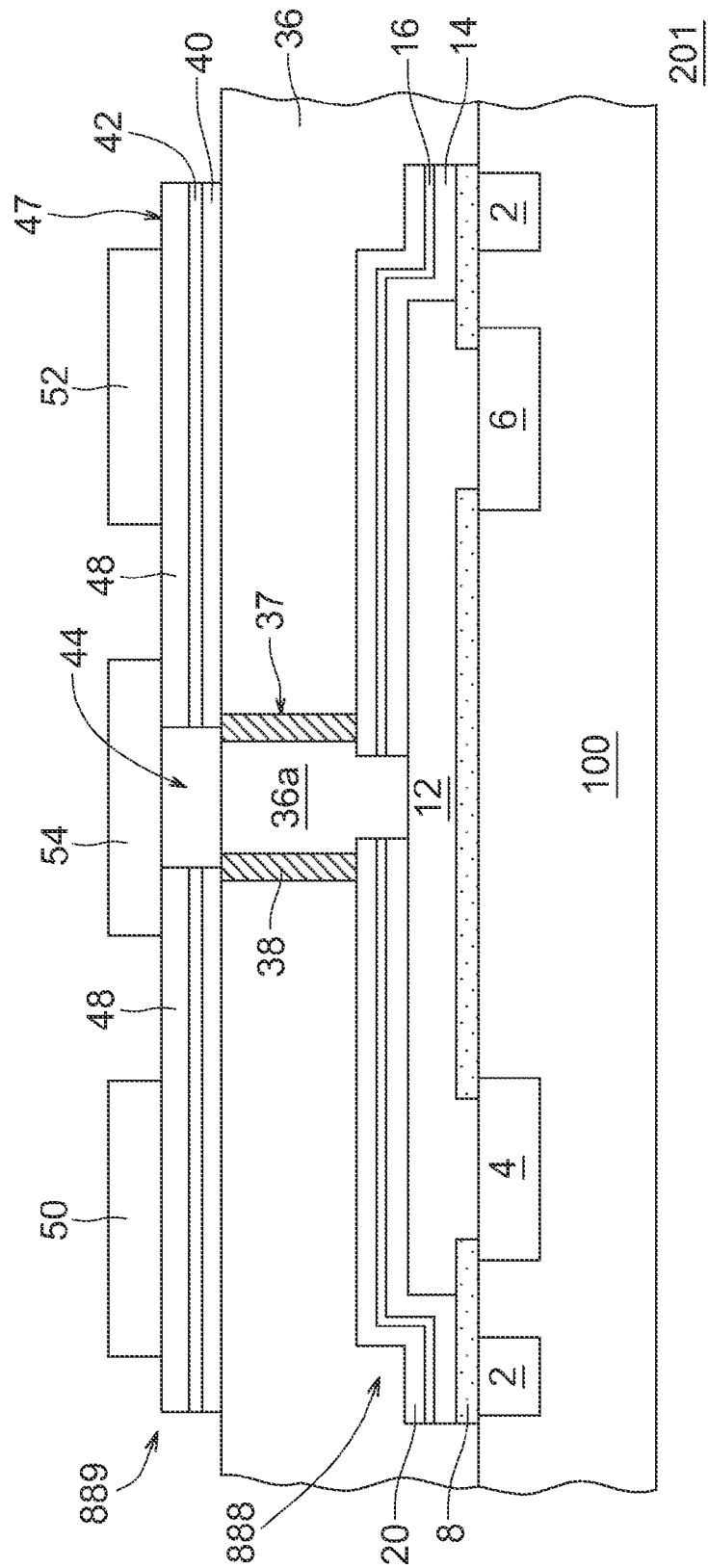

FIGS. 2A-2Q illustrate a process of forming a device with a waveguide structure for signal transmission and power/ground delivery.

FIG. 2A illustrates a process continuing from FIG. 1G. After the seed layer 16 illustrated in FIG. 1G is formed, a photoresist layer 19 is formed on the seed layer 16 by using, e.g., a spin coating process, a screen printing process or a lamination process, and then a photo exposure process and a development process can be employed to form multiple openings, exposing multiple regions of the seed layer 16, in the photoresist layer 19. The openings in the photoresist layer 19 include an opening 19o in the photoresist layer 19, and the photoresist layer 19 includes a portion 19a surrounded by the opening 19o and spaced apart from a peripheral sidewall or peripheral sidewalls of the opening 19o. The peripheral sidewall or peripheral sidewalls of the opening 19o may create any suitable shape, such as linear shape. From a top perspective view the shape may extend a distance greater than a width of the shape. The portion 19a can be any suitable shape, such as circle, square, rectangle, polygon or ellipse. The portion 19a does not contact any peripheral sidewall of the opening 19o. The photoresist layer 19 may include or may be a layer of polymer.

Next, referring to FIG. 2B, a metal layer 20 is formed in the openings including the opening 19o and on the seed layer 16 exposed by the openings in the photoresist layer 19. The metal layer 20 may include or may be a layer of one or more of gold, copper, silver, nickel, palladium, and platinum formed using a suitable process, such as electroplating process. The metal layer 20 may have a suitable thickness, e.g. smaller than 50 micrometers, such as between 1 and 20 micrometers, between 3 and 15 micrometers, or between 2 nanometers and 50 micrometers. For example, the metal layer 20 can be a copper layer having a thickness, e.g. smaller than 15 micrometers, such as between 2 nanometers and 10 micrometers or between 3 and 15 micrometers.

Next, referring to FIG. 2C, the photoresist layer 19 is removed by using, e.g., an organic chemical. After the photoresist layer 19 is removed, multiple openings 20a (one of them is shown) in and through the metal layer 20 expose multiple regions of the seed layer 16. From a top perspective view, the openings 20a can be circular openings, elliptic openings, rectangular openings, square openings, polygon openings, or any other type of openings. From a top perspective view, each of the openings 20a may have a width, e.g., smaller than 30 micrometers, such as between 2 and 20 micrometers or between 5 and 15 micrometers. A partial top view 35a in FIG. 2C is an example showing that one of the openings 20a in and through the metal layer 20 can be a circular opening having a diameter, e.g., smaller than 30 micrometers, such as between 2 and 20 micrometers or between 5 and 15 micrometers.

Next, referring to FIG. 2D, a patterned photoresist layer 34 is formed on the metal layer 20, in the openings 20a, and on the seed layer 16 not covered by the metal layer 20. The patterned photoresist layer 34 can be a patterned polymer layer. The patterned photoresist layer 34 can be formed by a process including a spin coating process, a photo exposure process, and a development process. Multiple openings 34a (one of them is shown) in and through the photoresist layer 34 expose multiple regions of the metal layer 20. Each of the openings 34a can be a ring-shaped opening having an outer peripheral edge 34e with a suitable shape such as circle, square, rectangle, polygon or ellipse, and the ring-shaped opening encloses the photoresist layer 34 on the seed layer 16 exposed by the corresponding opening 20a. A partial top view 35b in FIG. 2D is an example showing that one of the openings 34a in the photoresist layer 34 has the outer peripheral edge 34e with a circular shape.

Next, referring to FIG. 2E, a metal layer 38 is formed in the openings 34a and on the metal layer 20 exposed by the openings 34a. The metal layer 38 may include or may be a layer of one or more of chromium, nickel, titanium, copper, gold, silver, and aluminum formed using a suitable process, such as electroplating process. The metal layer 38 may have a suitable thickness, e.g. smaller than 50 micrometers, such as between 2 and 20 micrometers or between 2 nanometers and 50 micrometers. For example, the metal layer 38 can be a gold or nickel layer having a suitable thickness, e.g. smaller than 30 micrometers, such as between 2 and 10 micrometers.

Next, referring to FIG. 2F, the patterned photoresist layer 34 is removed by using, e.g., an organic chemical, leaving the metal layer 38 formed on the metal layer 20. Accordingly, multiple metal rings 37 (one of them is shown) provided by the metal layer 38 are formed on the metal layer 20, and multiple holes 39 (one of them is shown) surrounded by the metal rings 37 are over the openings 20a. From a top perspective view, the holes 39 can be circular holes, elliptic holes, rectangular holes, square holes, polygon holes, or any other type of holes. From a top perspective view, each of the holes 39 may have a width greater than the width of the corresponding opening 20a and smaller than 40 micrometers, such as between 3 and 35 micrometers or between 7 and 20 micrometers. A partial top view 35c in FIG. 2F is an example showing that one of the holes 39 surrounded by one of the metal rings 37 on the metal layer 20 is over one of the openings 20a and can be a circular shape having a diameter D1, e.g., smaller than 40 micrometers, such as between 2 and 20 micrometers or between 5 and 15 micrometers, and greater than a diameter D2 of the corresponding opening 20a.

Next, referring to FIG. 2G, the seed layer 16 not under the metal layer 20 is removed by using a suitable process, such as wet etching process or dry etching process. Next, the second reflecting layer 14 not under the metal layer 20 is removed by using a suitable process, such as wet etching process or dry etching process. Next, the first reflecting layer 8 not under the metal layer 20 or the patterned transparent layer 12 is removed by using a suitable process, such as wet etching process or dry etching process. The wet etching process, for example, can be a chemical etching process. The dry etching process, for example, can be a plasma etching process.

Accordingly, the seed layer 16 vertically under the openings 20a and the second reflecting layer 14 vertically under the openings 20a are removed so that multiple holes 41 (one of them is shown) are formed through the layers 14, 16 and 20 and expose multiple regions 12r (one of them is shown) of the patterned transparent layer 12. From a top perspective view, each of the holes 41 may have a shape depended on the shape of the corresponding opening 20a. The holes 39 surrounded by the metal rings 37 are over the holes 41 and expose the regions 12r of the patterned transparent layer 12. The remaining reflecting layer 8, the patterned transparent layer 12, the remaining reflecting layer 14, the remaining seed layer 16, and the metal layer 20 compose multiple lower waveguide portions 888 (one of them is shown). The lower waveguide portions 888 shown in FIG. 2G are similar to the waveguide structures 888 illustrated in FIG. 1J except that the holes 41, which expose the regions 12r of the patterned transparent layer 12, are in the metal layers 14, 16 and 20 of the lower waveguide portions 888. The details of the lower waveguide portions 888 shown in FIG. 2G can be referred to as the details of the waveguide structures 888 as illustrated in FIG. 1J. One or more of the metal rings 37 may be formed on each of the lower waveguide portions 888 and is/are aligned with one or more of the holes 41.

FIG. 2H is an example illustrating a partial perspective top view of one of the lower waveguide portions 888 shown in FIG. 2G. FIG. 2G can be the cross-sectional view cut along the line A-A shown in FIG. 2H.

Next, referring to FIG. 2I, a transparent polymer layer 36 can be formed on the metal layer 20, on the substrate 100, on the regions 12r of the patterned transparent layer 12, on the metal rings 37, in the holes 39, and in the holes 41 by a suitable process, such as spin coating process, dispensing process, molding process, or screen printing process. The transparent polymer layer 36 covers the metal rings 37 and the lower waveguide portions 888. The transparent polymer layer 36 may include or may be a layer of one or more of epoxy, polyimide, benzocyclobutene (BCB), Polymethylmethacrylate (PMMA), Polystyrene (PS), and Polycarbonate (PC). The transparent polymer layer 36 shown in FIG. 2I may have a suitable thickness, e.g., smaller than 50 micrometers, such as between 2 and 20 micrometers or between 20 nanometers and 50 micrometers, and greater than that of each of the metal rings 37.

Next, referring to FIG. 2J, the transparent polymer layer 36 can be ground or polished by, e.g., a chemical-mechanical-polishing (CMP) process, a mechanical polishing process, a mechanical grinding process, or a process including mechanical polishing and chemical etching until each of the metal rings 37 has a top end with an exposed surface 37s, over which there is no portion of the transparent polymer layer 36. The ground or polished transparent polymer layer 36 may have a top surface 36s substantially coplanar with the exposed surfaces 37s of the metal rings 37. In addition, the transparent polymer layer 36 includes multiple transparent polymer portions 36a (one of them is shown) in the holes 41 and in the holes 39 surrounded by the metal rings 37.

Next, referring to FIG. 2K, an adhesion/barrier layer 40 is formed on the exposed surface 37s and the top surface 36s by a suitable process, such as physical vapor deposition (PVD) process, chemical-vapor deposition (CVD) process, or atomic layer deposition (ALD) process. Next, a seed layer 42 is formed on the adhesion/barrier layer 40 by a suitable process, such as physical vapor deposition (PVD) process or chemical-vapor deposition (CVD) process. The above-mentioned physical vapor deposition (PVD) process may be a sputtering process or an evaporation process. Next, a photoresist layer 46 is formed on the seed layer 42 by a suitable process, such as spin coating process or lamination process.

The adhesion/barrier layer 40 may include or may be a layer of one or more of titanium-nitride, titanium-tungsten-alloy, tantalum-nitride, titanium, and tantalum. The adhesion/barrier layer 40 may have a suitable thickness, e.g. smaller than 1 micrometer or smaller than 1.5 micrometers. For example, the thickness of the adhesion/barrier layer 40 is between 0.2 and 1.5 micrometers or between 0.1 and 0.8 micrometers. The seed layer 42 may include or may be a layer of one or more of gold, copper, silver, nickel, palladium, and platinum. The seed layer 42 may have a suitable thickness, e.g. smaller than 1 micrometer or smaller than 2 micrometers. For example, the thickness of the seed layer 42 is between 0.3 and 2 micrometers, between 20 nanometers and 1.5 micrometers, or between 15 nanometers and 0.8 micrometers. The photoresist layer 46 may include or may be a polymer layer.

Next, referring to FIG. 2L, after the photoresist layer 46 is formed on the seed layer 42, a photo exposure process and a development process can be employed to form multiple openings 46o (one of them is shown), exposing multiple regions 42s of the seed layer 42, in the photoresist layer 46. After the photo exposure process and the development process, the photoresist layer 46 may include multiple photoresist portions 46a (one of them is shown) vertically over the metal rings 37 and the transparent polymer portions 36a. Each of the photoresist portions 46a is surrounded by one of the openings 46o and is spaced apart from a peripheral sidewall or peripheral sidewalls of the opening 46o. FIG. 2M is an example illustrating a partial perspective top view of the photoresist layer 46 including one of the photoresist portions 46a shown in FIG. 2L. FIG. 2L can be the cross-sectional view cut along the line B-B shown in FIG. 2M.

Next, referring to FIG. 2N, a metal layer 48 is formed on the regions 42s of the seed layer 42 by a suitable process, such as electroplating process. The metal layer 48 may include or may be a layer of one or more of gold, copper, silver, nickel, palladium, and platinum. The metal layer 48 may have a suitable thickness, e.g. greater than 2 micrometers or smaller than 50 micrometers. For example, the thickness of the metal layer 48 is between 1 micrometer and 20 micrometers, between 2 micrometers and 20 micrometers, or between 2 nanometers and 50 micrometers.

Next, referring to FIG. 2O, the photoresist layer 46 is removed by using, e.g., an organic chemical. Next, the seed layer 42 not under the metal layer 48 is removed by a suitable process, such as dry etching process, wet etching process, chemical etching process, or plasma etching process. Next, the adhesion/barrier layer 40 not under the metal layer 48 is removed by a suitable process, such as dry etching process, wet etching process, chemical etching process, or plasma etching process. Accordingly, a patterned metal layer 47 composed of the metal layers 40, 42 and 48 can be formed on the exposed surface 37s and the top surface 36s, and multiple holes 44 (one of them is shown) are formed in the patterned metal layer 47 and vertically over the transparent polymer portions 36a surrounded by the metal rings 37. The patterned metal layer 47 can be connected to the metal layer 20 through the metal rings 37. The holes 44 may be optionally filled with a transparent polymer (not shown).

The patterned metal layer 47, the metal rings 37 and the transparent polymer portions 36a compose multiple upper waveguide portions 889. FIG. 2P is an example illustrating a partial perspective top view of one of the upper waveguide portions 889 shown in FIG. 2O. FIG. 2O can be the cross-sectional view cut along the line C-C shown in FIG. 2P.

The upper waveguide portions 889 may include power/ground delivery parts, optical-signal transmission parts, and electrical-signal transmission parts. Each of the optical-signal transmission parts of the upper waveguide portions 889 is composed of one of the transparent polymer portions 36a and transmits an optical signal from one of the illuminant devices 4. Each of the power/ground delivery parts of the upper waveguide portions 889 can be composed of a portion of the patterned metal layer 47 and one or more of the metal rings 37 and is connected to one or more of the power/ground delivery parts of the lower waveguide portions 888. Each of the electrical-signal transmission parts of the upper waveguide portions 889 also can be composed of a portion of the patterned metal layer 47 and one or more of the metal rings 37 and is connected to one or more of the electrical-signal transmission parts of the lower waveguide portions 888. The lower waveguide portions 888 and the upper waveguide portions 889 compose a waveguide structure 7.

Next, referring to FIG. 2Q, multiple chips 50 (one of them is shown), multiple chips 52 (one of them is shown), and multiple sensor devices 54 (one of them is shown) are mounted on the metal layer 48 of the upper waveguide portions 889, which leads a device 201 to be formed. Each of the sensor devices 54 is vertically over one of the holes 44, vertically over one of the metal rings 37, and vertically over one of the transparent polymer portions 36a. The chips 50 can be memory chips, such as dynamic-random-access memory (DRAM) chips, static-random-access memory (SRAM) chips, or flash memory chips (such as NAND flash memory chips or NOR flash memory chips). The chips 52 can be logic chips, processors (such as central-processing-unit (CPU) chips, graphics-processing-unit (GPU) chips), power management chips, digital-signal-processing (DSP) chip, baseband chip, wireless local area network (WLAN) chip, analog chip, global-positioning-system (GPS) chip, or system-on chip (SOC). Each of the sensor devices 54 can be a light sensor, an image sensor, a complementary metal-oxide-semiconductor (CMOS) sensor, or generally any sensor capable of detecting light emitted from one of the illuminant devices 4.

The sensor devices 54 of the device 201 can be configured for receiving signals, from the illuminant devices 4, through the optical-signal transmission parts of the lower and upper waveguide portions 888 and 889. The process illustrated in FIGS. 2A-2Q may be used in multi-chip packaging, such as 3D chip packaging.

In the device 201, each of the illuminant devices 4 can be configured for emitting a light that can be detected by one or more of the sensor devices 6 and one or more of the sensor devices 54 through the optical-signal transmission parts of the lower and upper waveguide portions 888 and 889. The light passes one or more of the optical-signal transmission parts of the lower waveguide portions 888, reaching one or more of the sensor devices 6, and further passes one or more of the holes 44 and one or more of the optical-signal transmission parts of the upper waveguide portions 889, reaching one or more of the sensor devices 54.

Figure 3A:
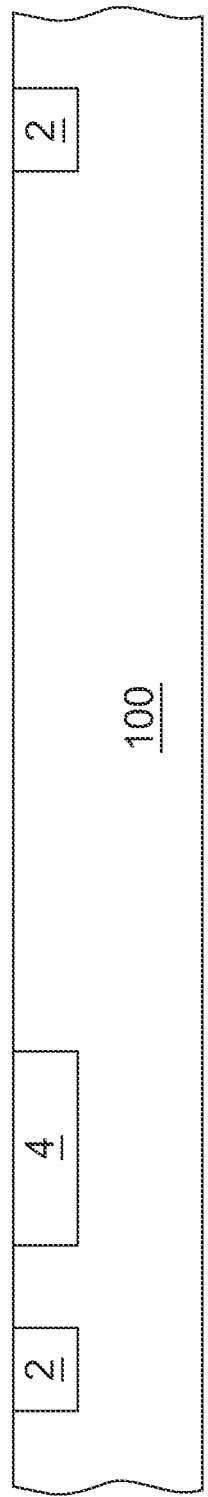
FIGS. 3A-3X show a process for forming a device with waveguide structures for signal transmission and power/ground delivery according to an exemplary embodiment of the present disclosure.
Figure 3B:
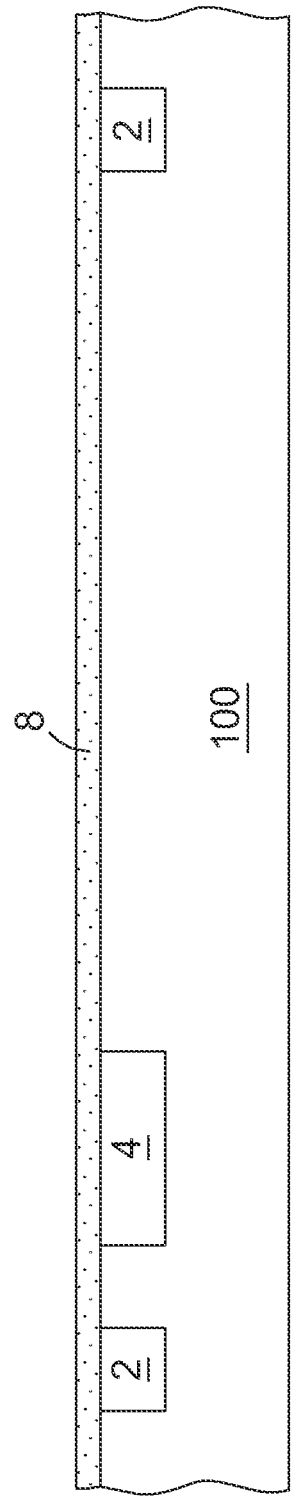
Figure 3C:
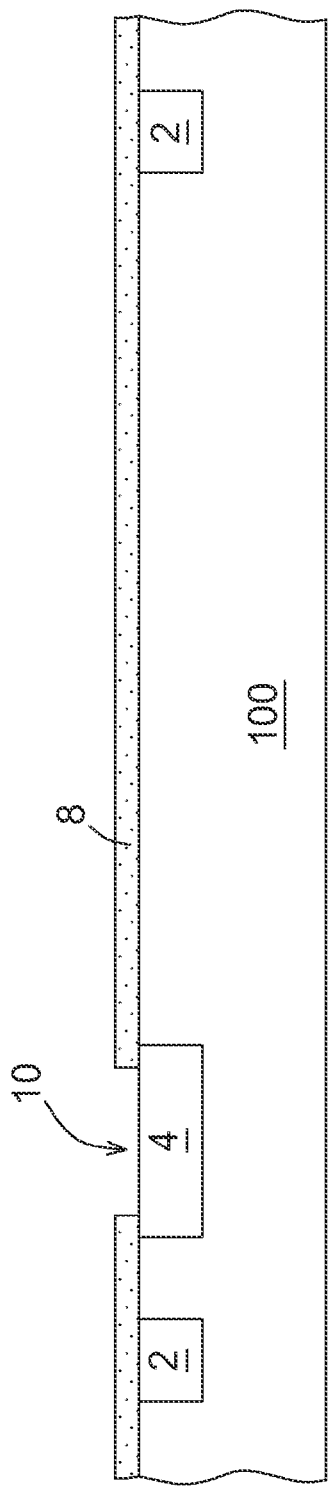
Figure 3D:
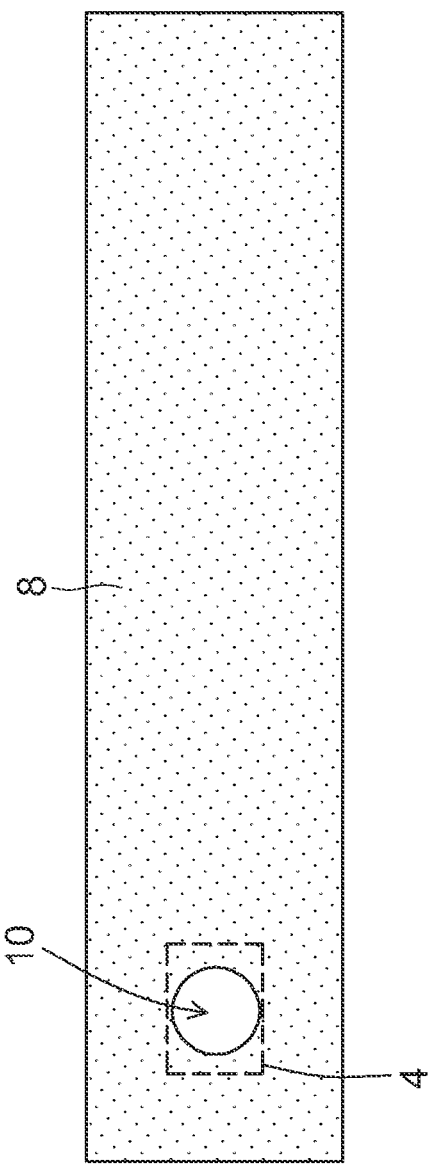
Figure 3G:
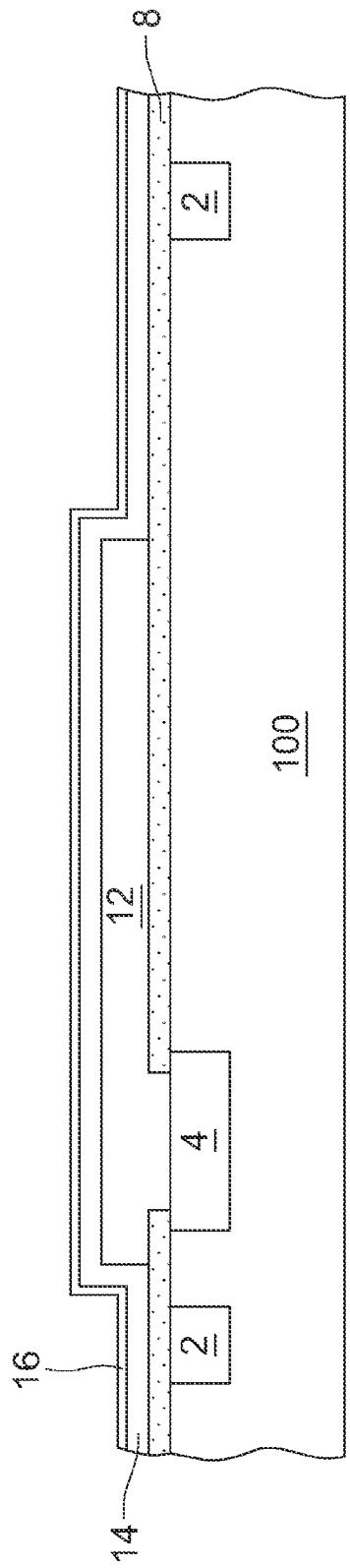
Figure 3H:
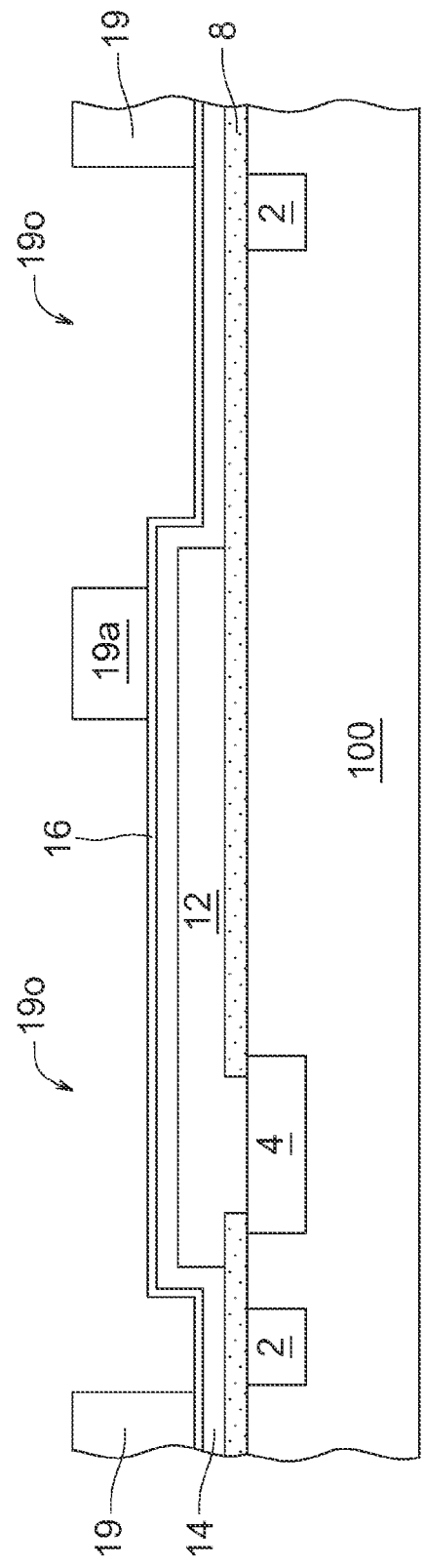
Figure 3I:
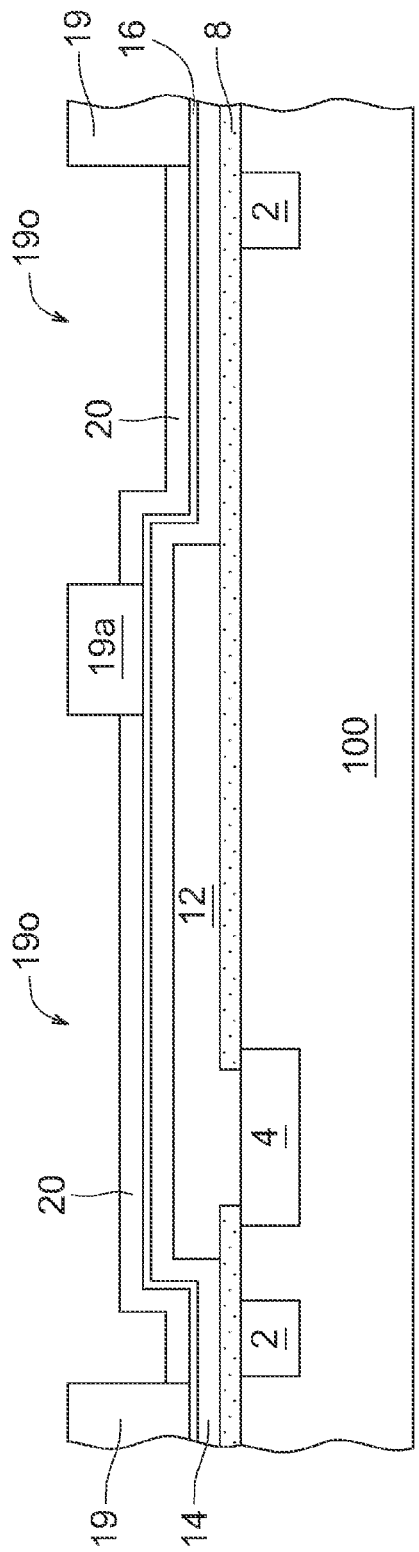
Figure 3J:
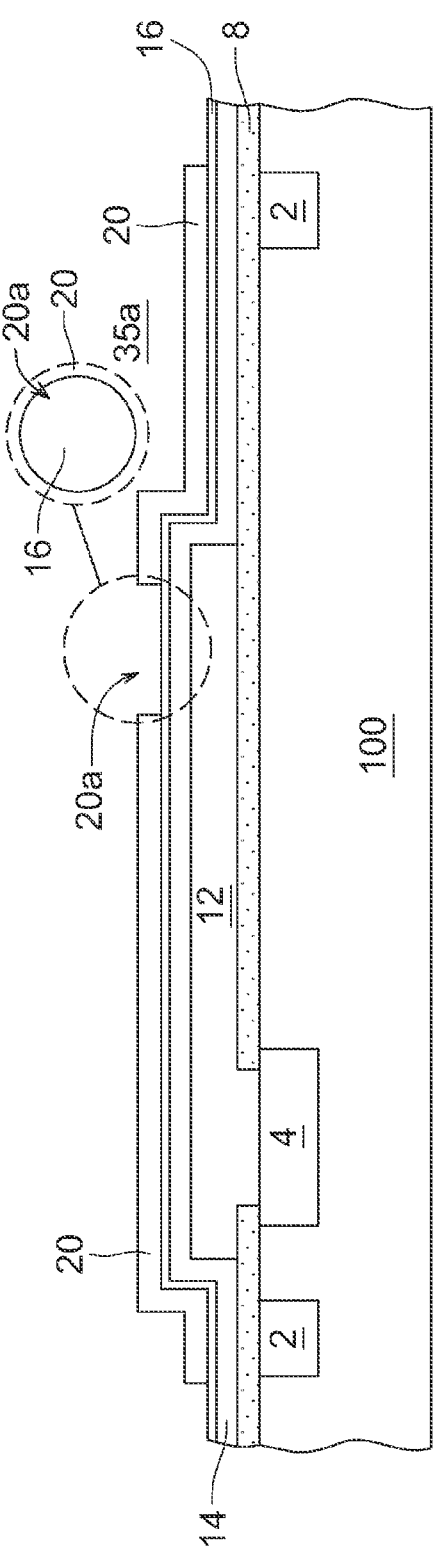
Figure 3L:
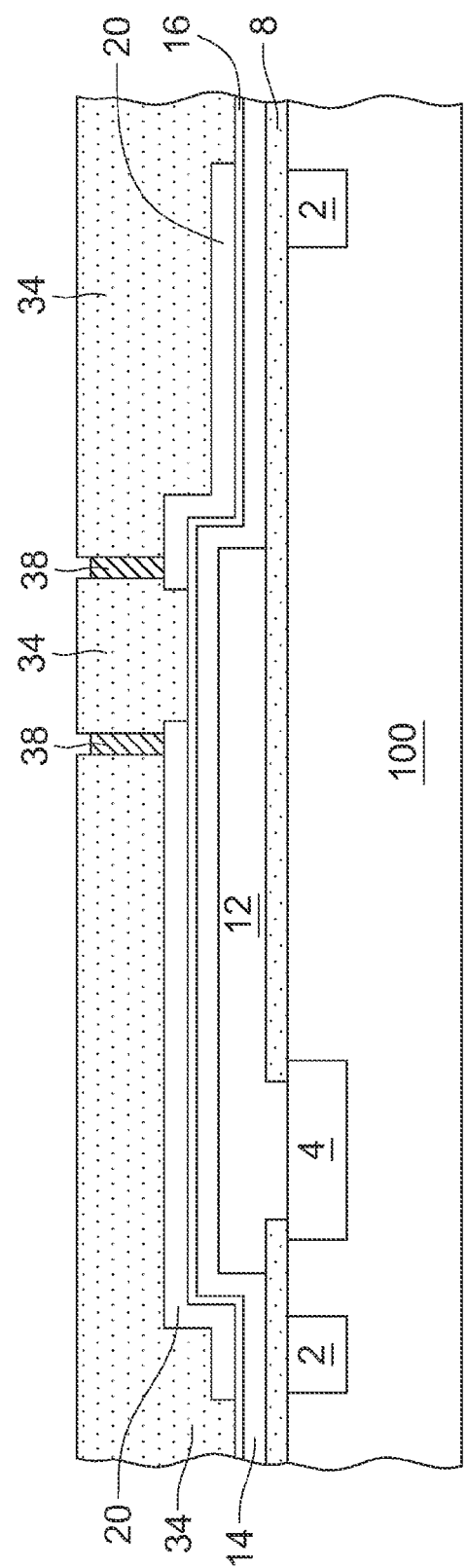
Figure 3N:
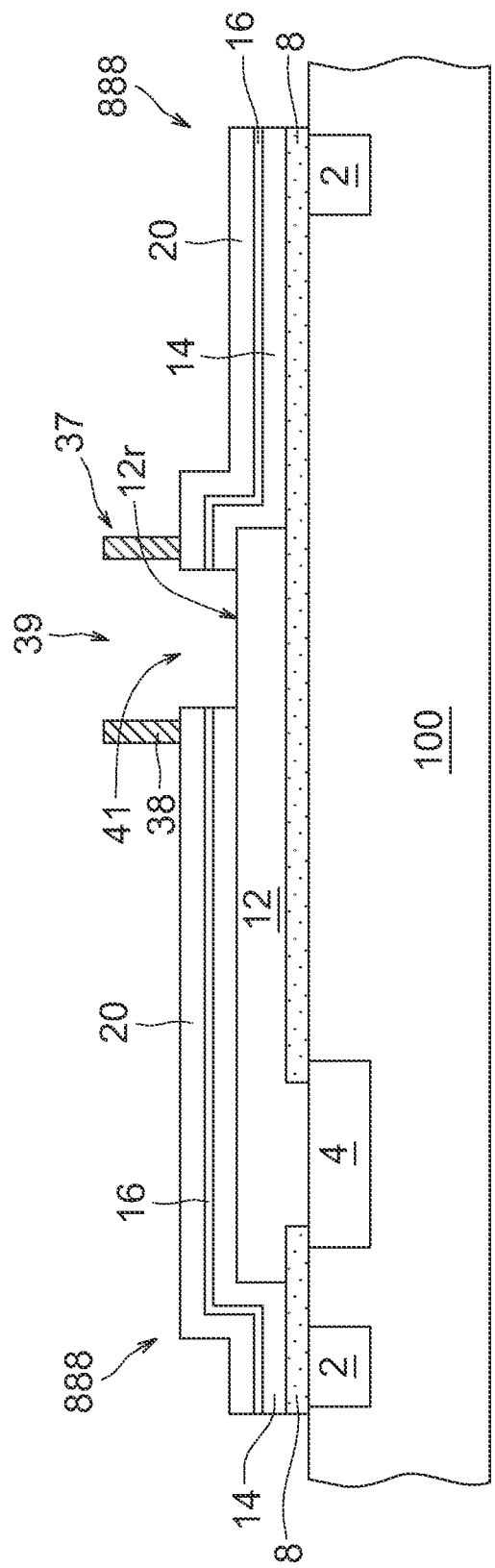
Figure 3O:
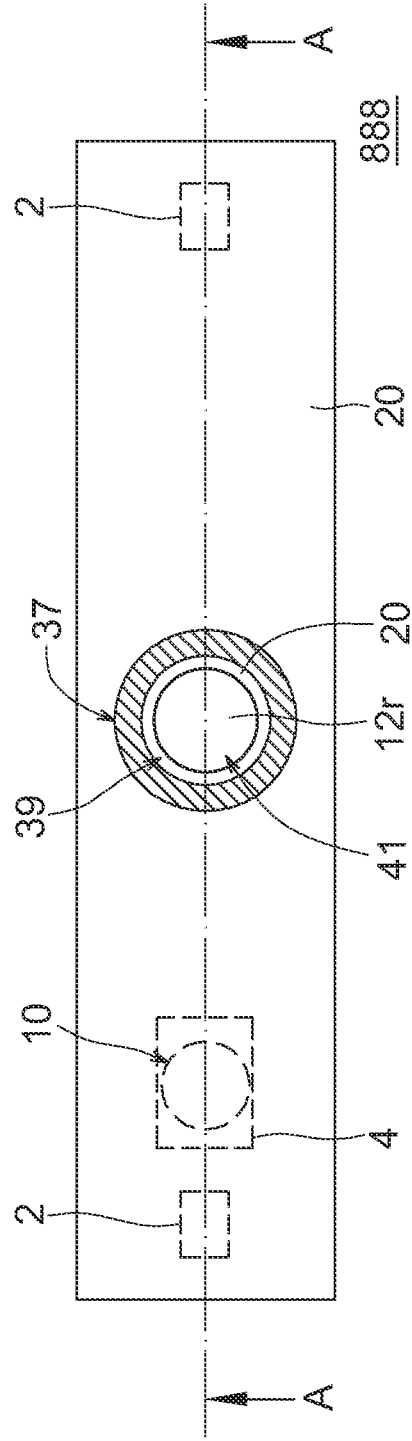
Figure 3P:
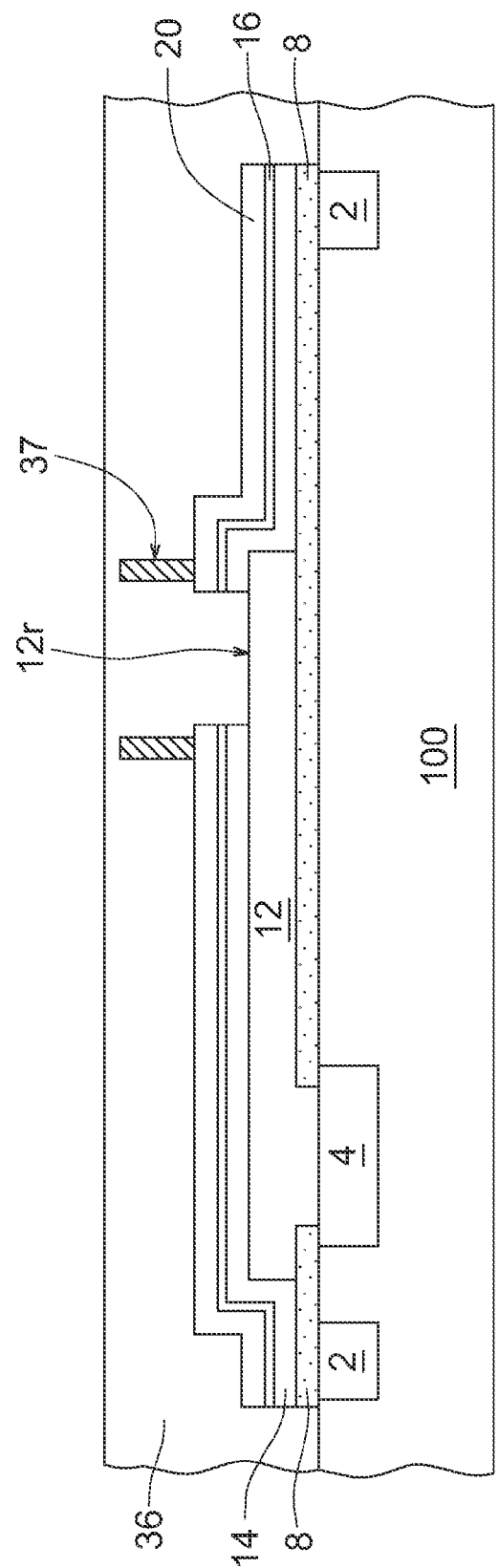
Figure 3Q:
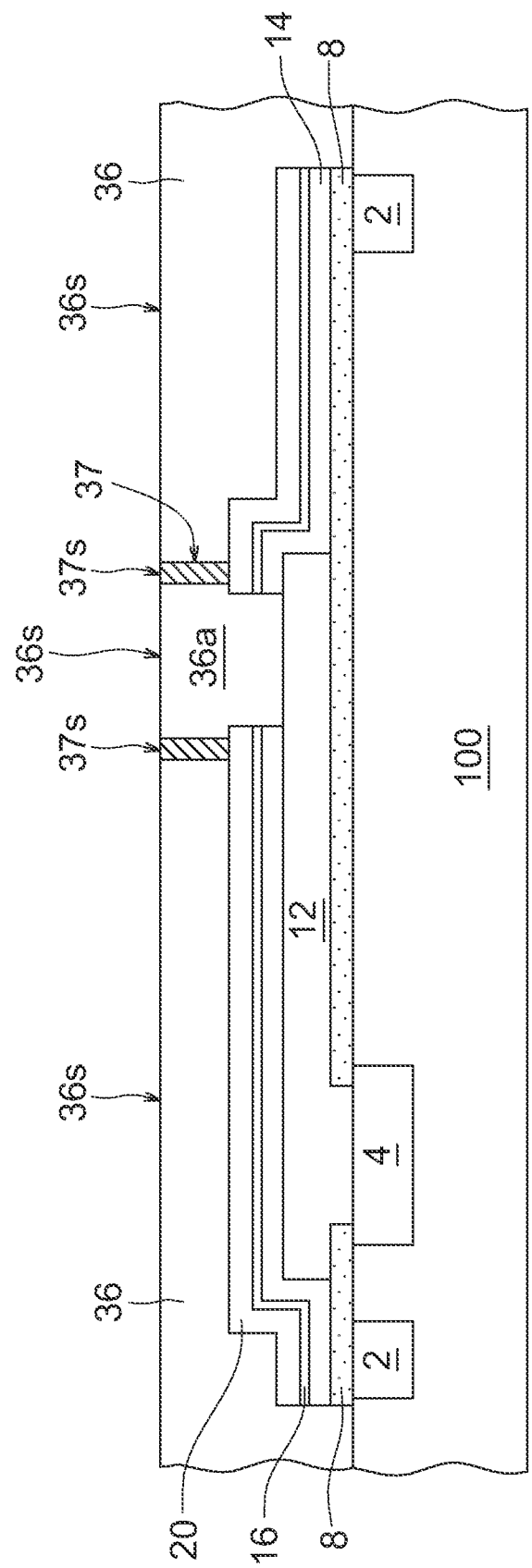
Figure 3R:
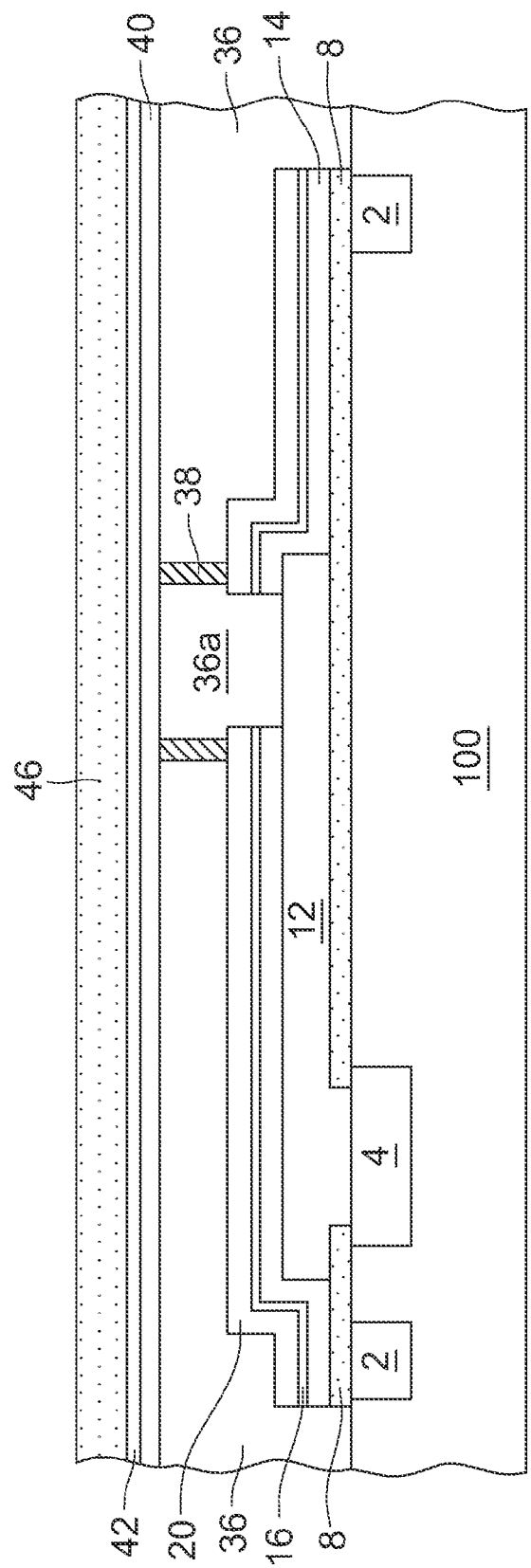
Figure 3U:
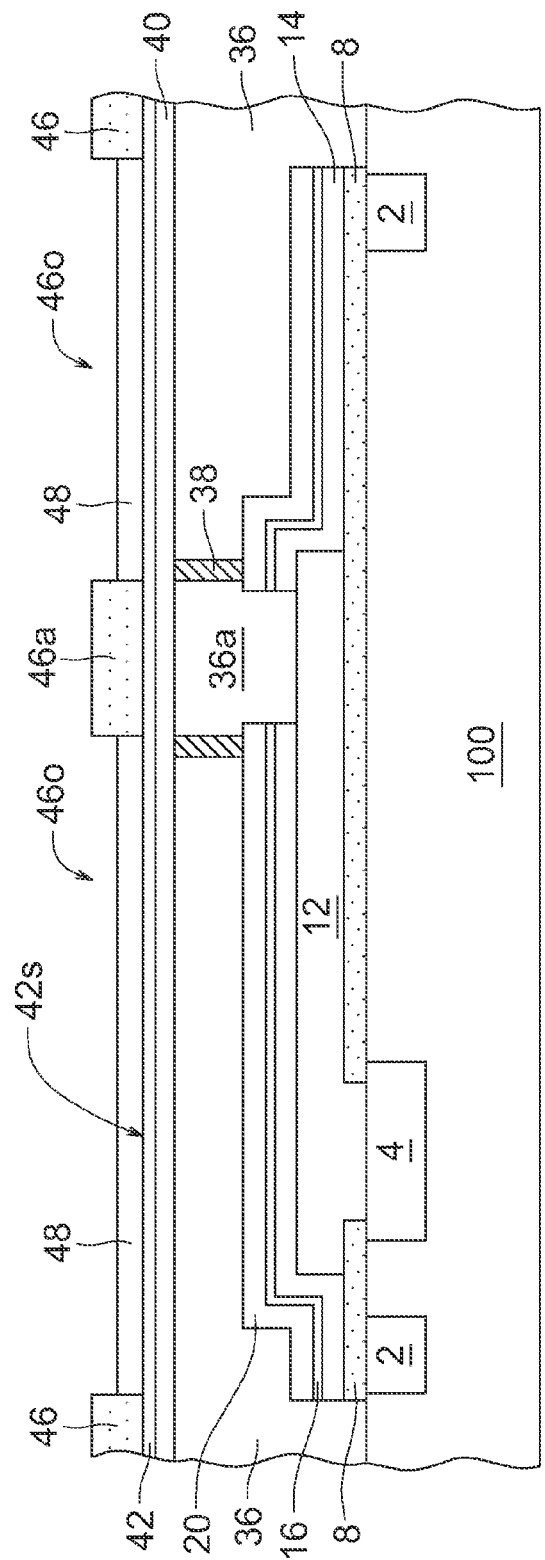
Figure 3V:
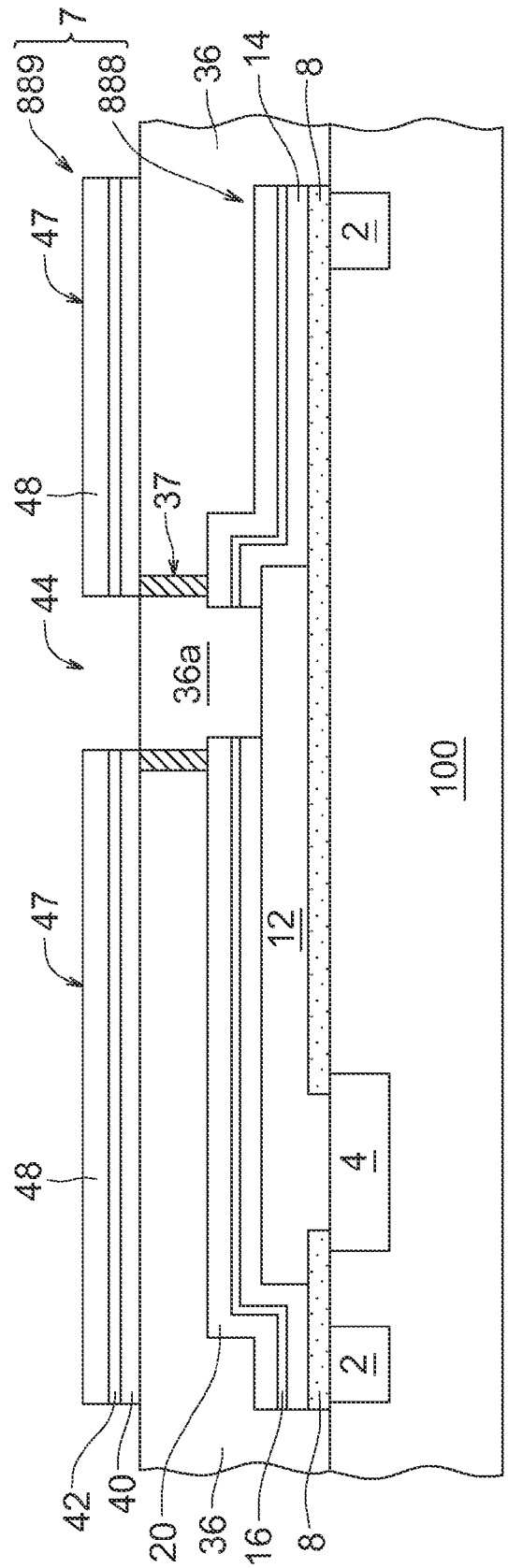
Figure 3W:
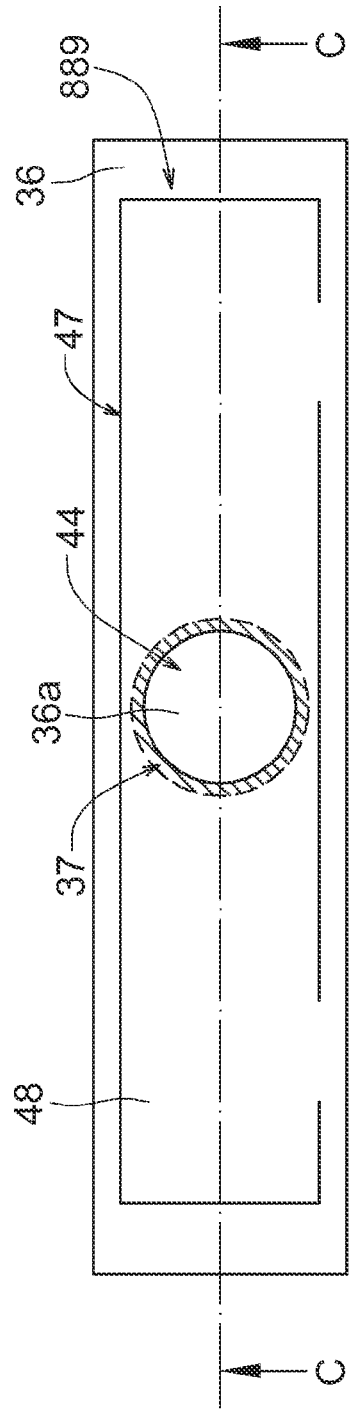
Figure 3X:
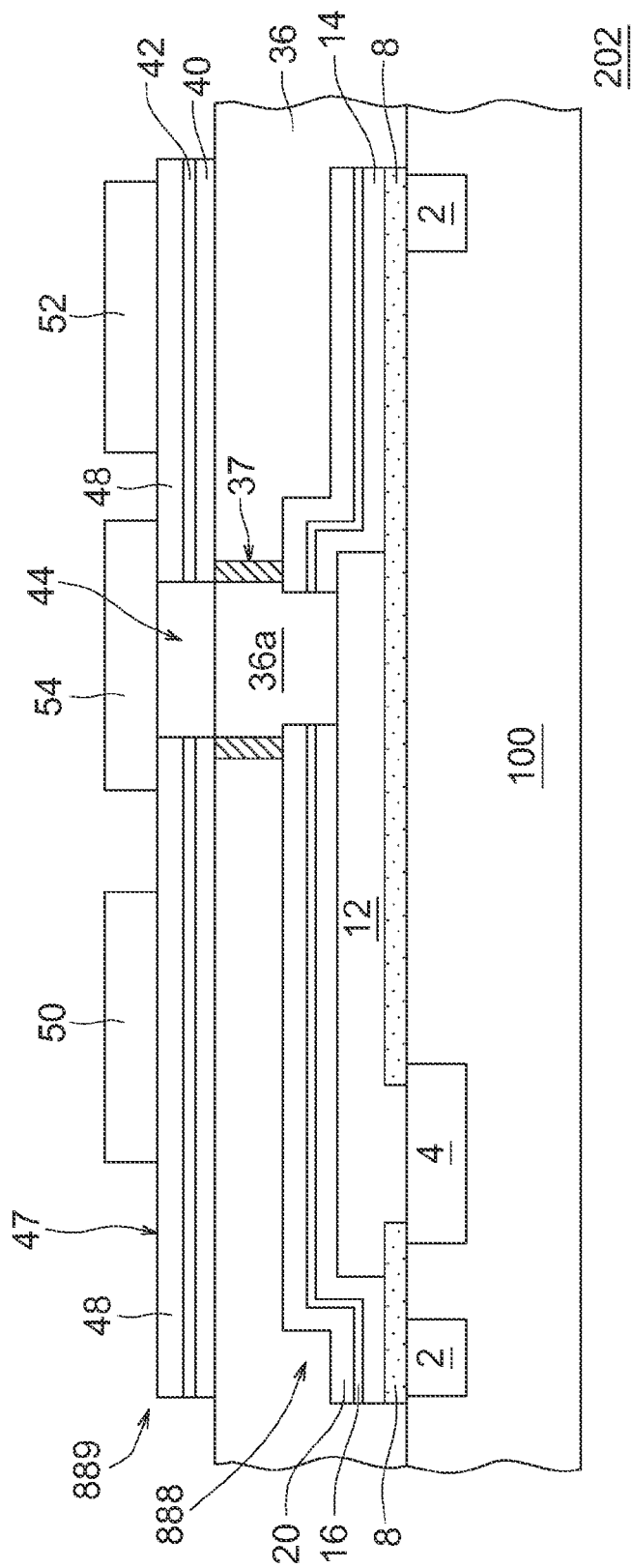

FIGS. 3A-3X illustrate a process of forming a device 202 with a waveguide structure for signal transmission and power/ground delivery. The device 202 shown in FIG. 3X is similar to the device 201 illustrated in FIG. 2Q except that the patterned transparent layer 12 of the device 202 does not contact or is not vertically over any above-mentioned sensor device 6. The process of forming the device 202 can be referred to as the process of forming the device 201 as illustrated in FIGS. 1A-1G and FIG. 2A-2Q. The specification of the device 202 shown in FIG. 3X can be referred to as the specification of the device 201 as illustrated in FIG. 2Q.

Figure 4:
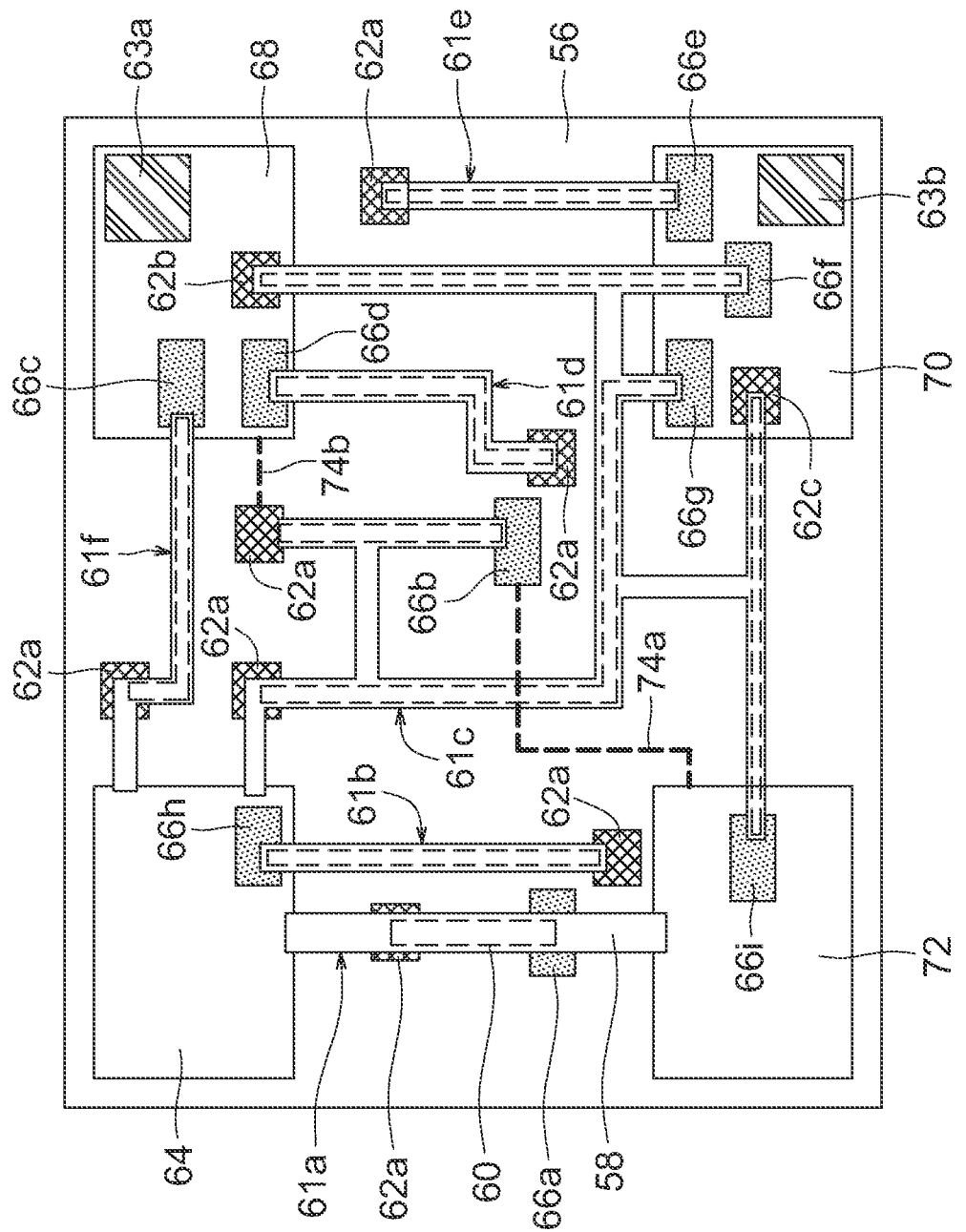
FIG. 4 shows a top view of a device including waveguide structures for signal transmission and power/ground delivery according to an exemplary embodiment of the present disclosure.

FIG. 4 is an example showing a top view of a device including waveguide structures for signal transmission and power/ground delivery. The device includes a substrate 56, multiple waveguide structures 61a-61i over the substrate 56, multiple illuminant devices 62a in or on the substrate 56, a power management chip 64 in or on the substrate 56, two sensor devices 66a and 66b in or on the substrate 56, two logic chips 68 and 70 in or on the substrate 56, a memory device 72 in or on the substrate 56, and multiple metal traces 74a and 74b in or on the substrate 56. The logic chip 68 includes an illuminant circuit 62b, a memory circuit 63a, and two sensor circuits 66c and 66d. The logic chip 70 includes an illuminant circuit 62c, a memory circuit 63b, and three sensor circuits 66e, 66f and 66g. The power management chip 64 includes a sensor circuit 66h connected to one of the illuminant devices 62a through the waveguide structure 61b. The memory device 72 includes a sensor circuit 66i connected to the illuminant circuit 62c through the waveguide structure 61i.

The substrate 56 can be a printed-circuit board (PCB), a ball-grid-array (BGA) substrate, a glass substrate, a panel, a mother board, a flexible substrate, a metal substrate, an organic substrate, a ceramic substrate, or a polymer substrate. Alternatively, the substrate 56 may be a semiconductor substrate, such as silicon based substrate, gallium arsenide (GaAs) based substrate, silicon indium based (SiIn) substrate, silicon antimony based (SiSb) substrate, or indium antimony (InSb) based substrate, silicon germanium (SiGe) based substrate. The logic chip 68, for example, can be a central-processing-unit (CPU) chip, and the logic chip 70 can be a graphics-processing-unit (GPU) chip or a digital-signal-processing (DSP) chip. The memory circuit 63a of the logic chip 68 can be a dynamic-random-access-memory (DRAM) circuit, a static-random-access-memory (SRAM) circuit, or a NAND-flash-memory circuit. The memory circuit 63b of the logic chip 70 can be a DRAM circuit, a SRAM circuit, or a NAND-flash-memory circuit. The memory device 72, for example, can be a memory chip, such as flash memory chip, DRAM chip or SRAM chip. Alternatively, the memory device 72 can be a multi-chip memory package, which includes multiple non-volatile memory chips, one or more volatile memory chips, and a memory control chip. The non-volatile memory chips can be NAND flash memory chips or NOR flash memory chips. The volatile memory chips can be DRAM chips. Each of the illuminant devices 62a can be a light emitting diode (LED), a laser device, or any other light-emitting device. The illuminant devices 62a may include germanium and aluminum. Each of the sensor devices 66a and 66b can be a light sensor, an image sensor, a complementary metal-oxide-semiconductor (CMOS) sensor, or any other light-detecting device.

Each of the waveguide structures 61a-61f includes a metal shielding 58 and at least one waveguide 60 surrounded by the metal shielding 58. The metal shielding 58 can be used for delivering power or ground, and the waveguide 60 can be used for transmitting optical signals from one of the light-emitting device 62a-62c to one of the sensor 66a-66i. The metal shielding 58 can be composed of the metal layers 8, 14, 16 and 20 illustrated in FIG. 1J, and the waveguide 60 can be composed of a piece of the patterned transparent layer 12 illustrated in FIG. 1J. The process of forming the waveguide structures 61a-61f can be referred to as the process of forming the waveguide structures 888 as illustrated in FIGS. 1A-1J.

The illuminant devices 62a and the illuminant circuits 62b and 62c can transform electrical signals into optical signals, and the optical signals can be detected by the sensor 66a-66i through the waveguides 60 of the waveguide structures 61a-61f. The sensor 66a-66i can transform the received optical signals into electrical signals.

For example, the illuminant circuit 62b of the logic chip 68 can transform electrical signals coming from other circuits of the logic chip 68 into optical signals. Next, the optical signals from the illuminant circuit 62b can be detected by the sensor circuit 66f of the logic chip 70 through one of the waveguides 60 of the waveguide structure 61c. Next, the sensor circuit 66f transforms the received optical signals into electrical signals. Finally, the electrical signals from the sensor circuit 66f can be transmitted to other circuits of the logic chip 70.

One of the illuminant devices 62a connected to the waveguide structure 61c can transform electrical signals coming from an external device of the substrate 56 into optical signals. Next, the optical signals from the illuminant device 62a can be detected by the sensor circuit 66g of the logic chip 70 through another one of the waveguides 60 of the waveguide structure 61c. Next, the sensor circuit 66g transforms the received optical signals into electrical signals. Finally, the electrical signals from the sensor circuit 66g can be transmitted to other circuits of the logic chip 70.

The metal shielding 58 of the waveguide structure 61c is connected to a terminal of the power management chip 64, multiple terminals of the illuminant devices 62a, a terminal of the sensor device 66b, a terminal of the logic chip 68, multiple terminals of the logic chip 70, and a terminal of the memory chip 72. Accordingly, the power management chip 64 can supply a power voltage to the illuminant devices 62a, the sensor device 66b, the logic chip 68, the logic chip 70, and the memory chip 72 through the metal shielding 58 of the waveguide structure 61c.

Figure 5A:
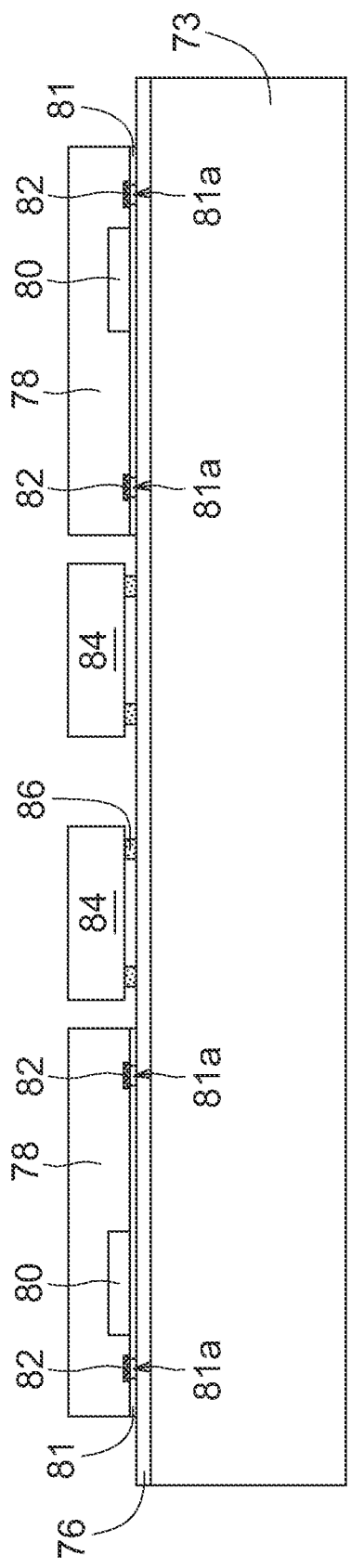
FIGS. 5A-5Z and FIGS. 5AA-5AE show a process for forming a multi-chip package with waveguide structures for signal transmission and power/ground delivery according to an exemplary embodiment of the present disclosure.

FIGS. 5A-5Z and FIGS. 5AA-5AE illustrate a process of forming a multi-chip package including waveguide structures for signal transmission and power/ground delivery.

Referring to FIG. 5A, a glue material 76 is first formed on a temporary substrate 73 by a suitable process, such as dispensing process or screen printing process. Next, multiple logic chips 78 (only two of them are shown) and multiple illuminant devices 84 (only two of them are shown) are mounted onto the glue material 76 to be adhered to the temporary substrate 73, and then the glue material 76 is baked at a temperature of between 100 and 200° C. Accordingly, the logic chips 78 and illuminant devices 84 can be adhered to the temporary substrate 73 using the glue material 76.

Each of the logic chips 78 shown in FIG. 5A includes a passivation layer 81, a semiconductor substrate (not shown) over the passivation layer 81, multiple metal pads 82 over the passivation layer 81, and a sensor area 80 over the passivation layer 81. The passivation layer 81 can be an insulating layer, such as silicon-nitride layer, silicon-oxide layer, or silicon-oxynitride layer, having a suitable thickness, e.g., smaller than 1 micrometer, such as between 0.2 and 0.9 micrometers. Multiple openings 81a in the passivation layer 81 expose multiple contact points of the metal pads 82. The contact points of the metal pads 82 are at tops of the openings 81a, and the openings 81a are under the contact points of the metal pads 82. The metal pads 82 can be copper pads, aluminum pads, or gold pads. The sensor area 80 can be a light detector, an image sensor, or a CMOS sensor.

The logic chips 78 can be central-processing-unit (CPU) chips, graphics-processing-unit (GPU) chips, or digital-signal-processing (DSP) chips. Alternatively, one of the logic chips 78 can be a central-processing-unit (CPU) chip, and the other is a processing-unit (GPU) chip or a digital-signal-processing (DSP) chip. The passivation layers 81 of the logic chips 78 contact the glue material 76.

Each of the illuminant devices 84 can be a light emitting diode (LED), a laser device, or any other light emitting device. Alternatively, the illuminant devices 84 can be chips that can emit light. Each of the illuminant devices 84 has metal pads or bumps 86 contacting the glue material 76. The metal pads or bumps 86 can be copper pads or bumps, aluminum pads or bumps, or gold pads or bumps.

The temporary substrate 73 can be a semiconductor substrate, such as silicon substrate, gallium arsenide (GaAs) based substrate, silicon indium based (SiIn) substrate, silicon antimony based (SiSb) substrate, indium antimony (InSb) based substrate, or silicon germanium (SiGe) based substrate. Alternatively, the temporary substrate 73 can be a glass substrate, a flexible substrate, a printed-circuit board (PCB), a metal substrate, a ceramic substrate, or a polymer substrate.

Figure 5B:
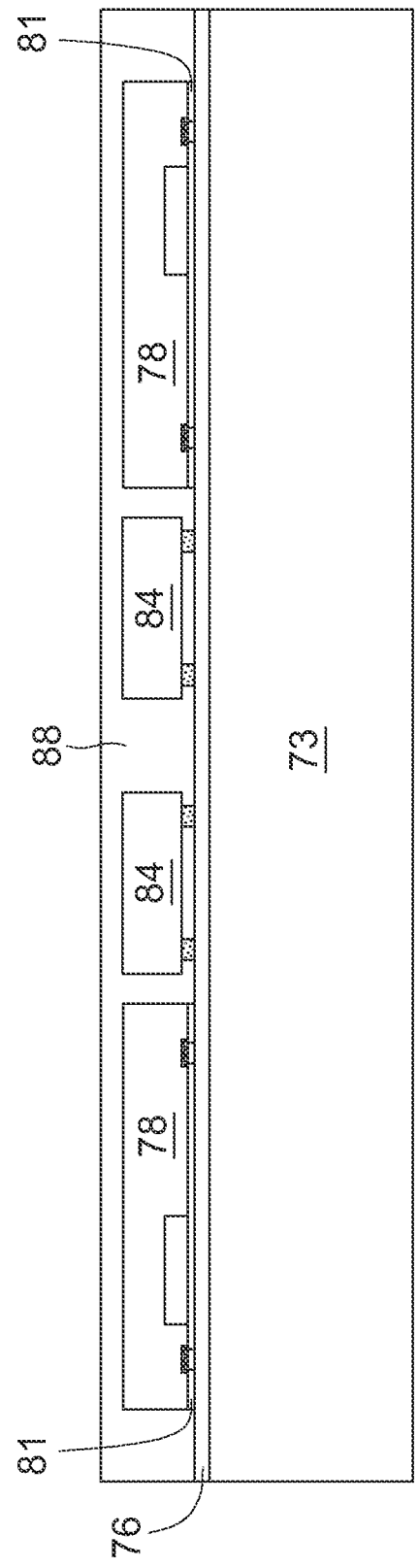

Next, referring to FIG. 5B, a polymer layer 88 is formed on the logic chips 78, the illuminant devices 84, and the glue material 76 by a suitable process, such as spin coating process, dispensing process, molding process, or screen printing process. The polymer layer 88 may include or may be a layer of one or more of epoxy, polyimide, benzocyclobutene (BCB), Polystyrene (PS), Polymethylmethacrylate (PMMA), and Polycarbonate (PC).

Figure 5C:
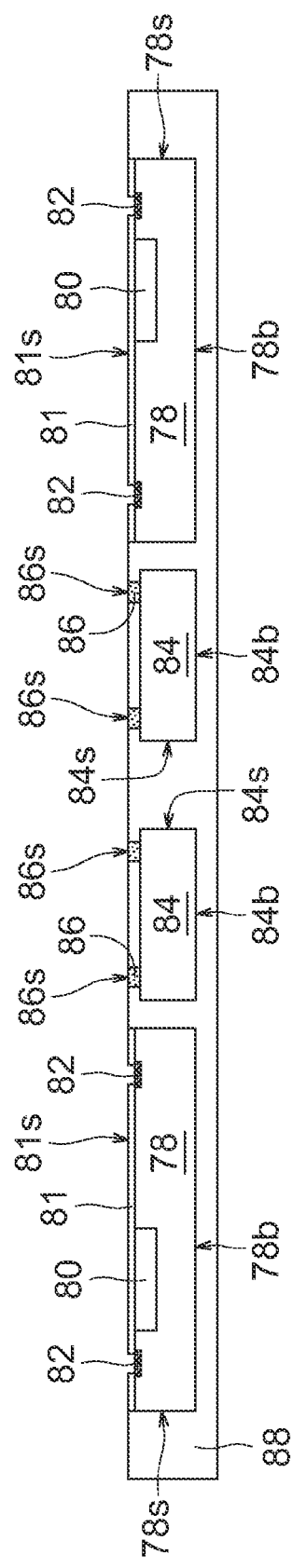

Next, referring to FIG. 5C, the temporary substrate 73 and the glue material 76 are removed. Accordingly, the polymer layer 88 can act as a carrier to carry the logic chips 78 and the illuminant devices 84. The structure of FIG. 5C is inverted from the structure of FIG. 5B. The polymer layer 88 shown in FIG. 5C contacts the semiconductor substrates of the logic chips 78, bottom surfaces 78b and sidewalls 78s of the logic chips 78, and bottom surfaces 84b and sidewalls 84s of the illuminant devices 84. The passivation layers 81 of the logic chips 78 shown in FIG. 5C have top surfaces 81s not contacting with the polymer layer 88. The metal pads or bumps 86 of the illuminant devices 84 shown in FIG. 5C have top surfaces 86s not contacting with the polymer layer 88.

Figure 5D:
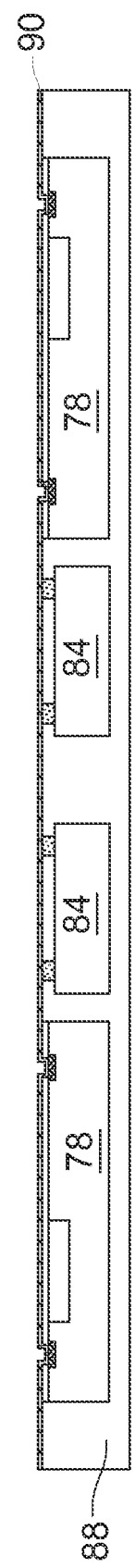

Next, referring to FIG. 5D, a reflecting layer 90 is formed on a top surface of the polymer layer 88, on the top surfaces 81s of the passivation layer 81 of the logic chips 78, on the metal pads 82 of the logic chips 78, on the top surfaces 86s of the metal pads or bumps 86 of the illuminant devices 84, and in the openings 81a in the passivation layers 81 by a suitable process, such as vacuum deposition, Physical-Vapor Deposition (PVD), or Plasma Enhanced Chemical Vapor Deposition (PECVD). The reflecting layer 90 may include or may be a layer of one or more of chromium, nickel, titanium, copper, gold, silver, and aluminum. The reflecting layer 90 may have a suitable thickness, e.g., smaller than 3 micrometers, such as between 0.5 and 3 micrometers, or between 20 nanometers and 1.5 micrometers.

Figure 5E:
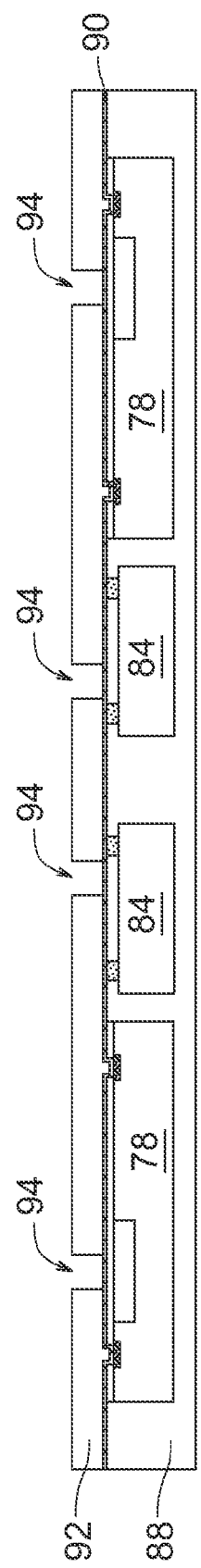

Next, referring to FIG. 5E, a photoresist layer 92 is formed on the reflecting layer 90 by a suitable process, such as spin coating process or lamination process, and then a photo exposure process and a development process can be employed to form multiple openings 94 in the photoresist layer 92. The openings 94 in the photoresist layer 92 expose multiple regions of the reflecting layer 90. The photoresist layer 92 may include or may be a polymer layer.

Figure 5F:
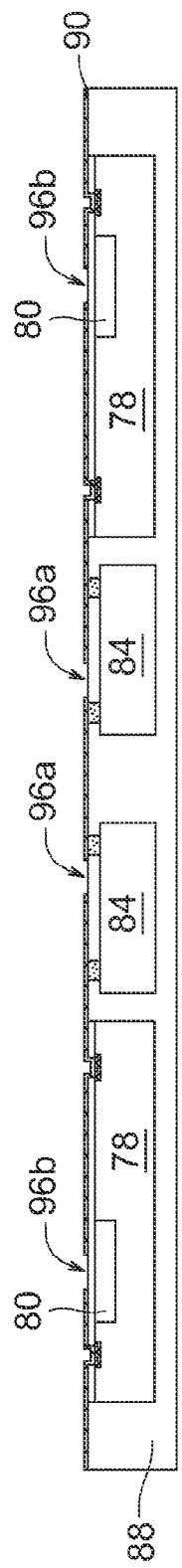

Next, referring to FIG. 5F, the reflecting layer 90 under the openings 94 are removed by a suitable process, such as dry etching process or wet etching process, and then the photoresist layer 92 is removed by using, e.g., an organic chemical. Accordingly, multiple openings 96a and 96b are formed in the reflecting layer 90. The openings 96a in the reflecting layer 90 are vertically over the illuminant devices 84, and the openings 96b in the reflecting layer 90 are vertically over the sensor areas 80 of the logic chips 78. The openings 96b expose the top surfaces 81s of the passivation layers 81 vertically over the sensor areas 80 of the logic chips 78.

Figure 5G:
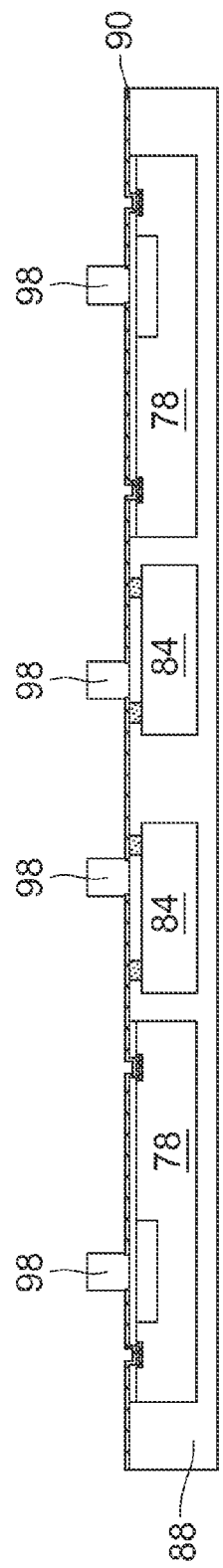

Next, referring to FIG. 5G, multiple transparent bumps 98 are formed in the openings 96a and 96b, on the top surfaces 81s exposed by the openings 96b, and over the illuminant devices 84. The transparent bumps 98 may include or may be a layer of one or more of polyimide, diamond, glass, transparent polymer, Polymethylmethacrylate (PMMA), Polystyrene (PS), and Polycarbonate (PC). The transparent bumps 98 can be formed by a process including a spin coating process, an exposing process, a developing process, and a curing process. The transparent bumps 98 may have a suitable thickness, e.g., smaller than 50 micrometers, such as between 2 and 20 micrometers or between 1 and 50 micrometers.

Figure 5H:
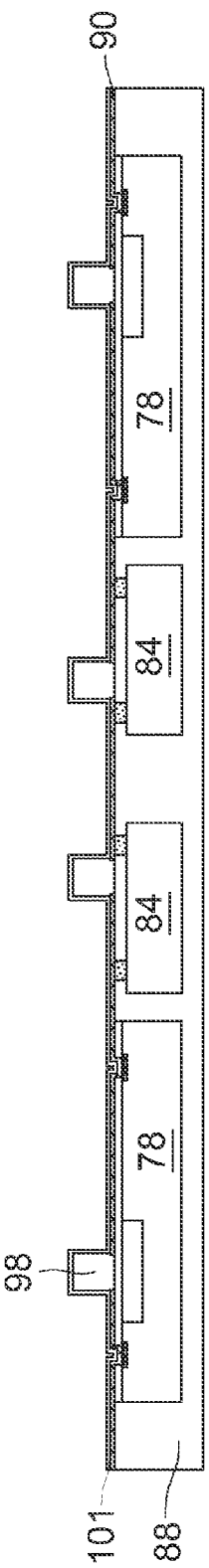

Next, referring to FIG. 5H, a metal layer 101 can be formed on the transparent bumps 98 and on the reflecting layer 90. The metal layer 101 contacts top surfaces and sidewalls of the transparent bumps 98 and a top surface of the reflecting layer 90. The metal layer 101, for example, can be composed of a reflecting layer and a seed layer. The reflecting layer of the metal layer 101 can be formed on the top surfaces and the sidewalls of the transparent bumps 98 and on the top surface of the reflecting layer 90 by a suitable process, such as vacuum deposition process, PVD process, PECVD process, or sputtering process. The reflecting layer of the metal layer 101 may include or may be a layer of one or more of chromium, nickel, titanium, copper, gold, silver, and aluminum and may have a suitable thickness, e.g., smaller than 3 micrometers, such as between 0.5 and 3 micrometers, between 20 nanometers and 1.5 micrometers or between 0.1 and 1 micrometers. The seed layer of the metal layer 101 can be formed on the reflecting layer of the metal layer 101 by a suitable process, such as PVD process or sputtering process. The seed layer of the metal layer 101 may include or may be a layer of one or more of gold, copper, silver, nickel, palladium, and platinum and may have a suitable thickness, e.g. smaller than 2 micrometers, such as between 0.3 and 2 micrometers, between 20 nanometers and 1.5 micrometers, or between 0.1 and 1 micrometers.

Figure 5I:
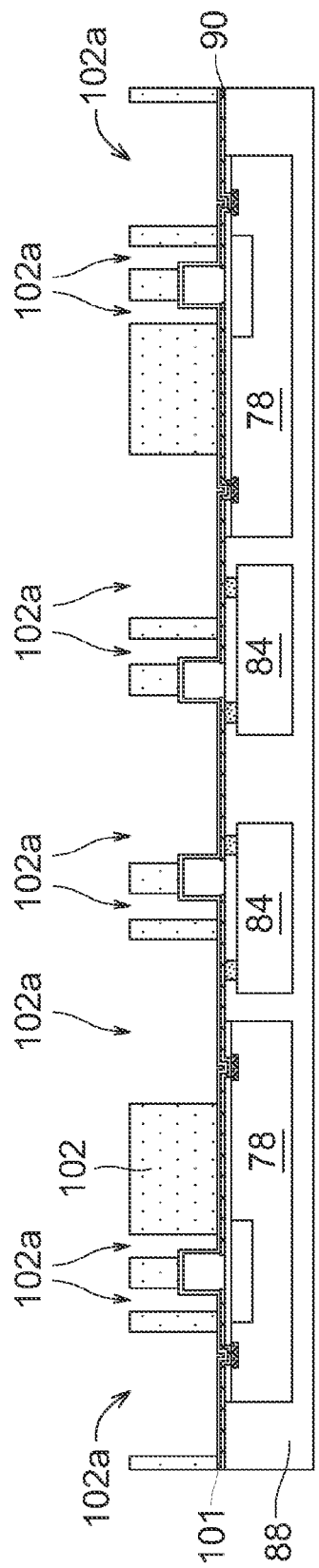

Next, referring to FIG. 5I, a photoresist layer 102 is formed on the seed layer of the metal layer 101 by a suitable process, such as spin coating process or lamination process, and then a photo exposure process and a development process can be employed to form multiple openings 102a in the photoresist layer 102. The openings 102a in the photoresist layer 102 expose multiple regions of the seed layer of the metal layer 101. The photoresist layer 102 may include or may be a polymer layer.

Figure 5J:
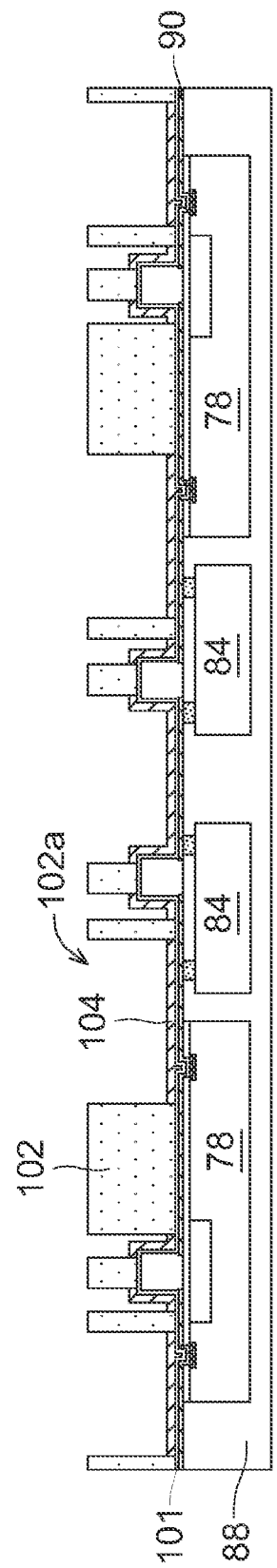

Next, referring to FIG. 5J, a metal layer 104 can be formed on the seed layer of the metal layer 101 exposed by the openings 102a in the photoresist layer 102. The metal layer 104 can be formed by a suitable process, such as electroplating process and/or electroless plating process. The metal layer 104 may include or may be a layer of one or more of gold, copper, silver, nickel, aluminum, palladium, and platinum. The metal layer 104 may have a suitable thickness, e.g. smaller than 50 micrometers, such as between 1 and 20 micrometers, between 2 nanometers and 50 micrometers, or between 2 and 15 micrometers. For example, the metal layer 104 can be a single layer of electroplated copper or electroplated gold having a thickness, e.g., smaller than 25 micrometers, such as between 2 and 15 micrometers. Alternatively, the metal layer 104 can be composed of an electroplated copper layer having a thickness between 2 and 15 micrometers, a nickel layer having a thickness between 0.1 and 5 micrometers on the copper layer, and a gold or palladium layer having a thickness between 0.1 and 2 micrometers on the nickel layer.

Figure 5K:
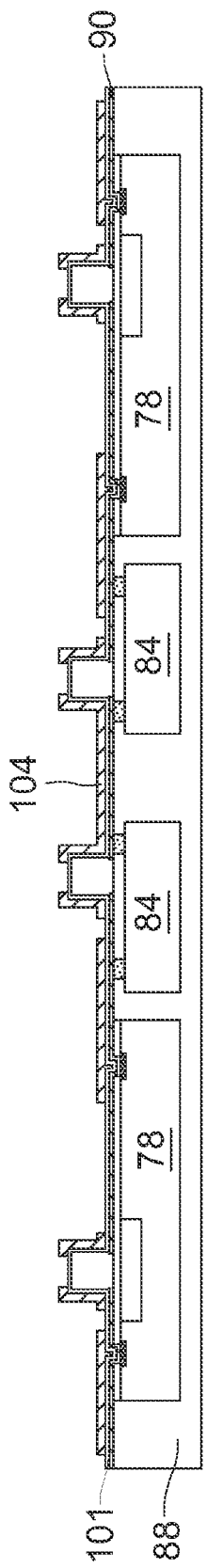
Figure 5L:
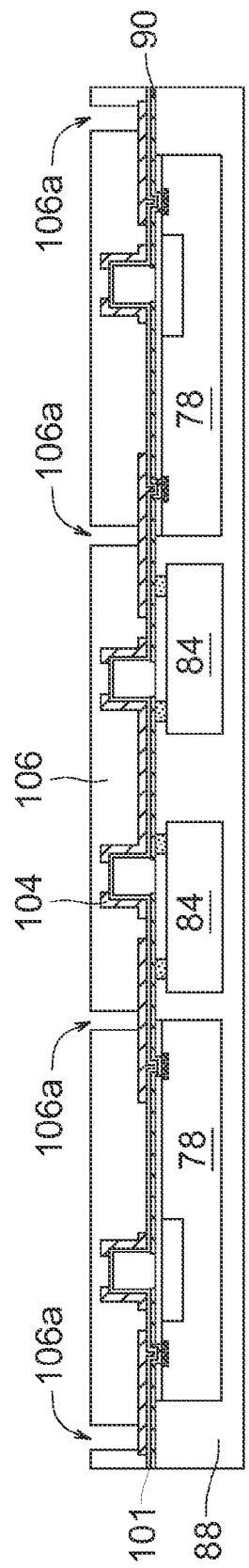

Next, referring to FIG. 5K, the photoresist layer 102 is removed by using, e.g., an organic chemical. Next, referring to FIG. 5L, a photoresist layer 106 is formed on the metal layer 104 and the seed layer of the metal layer 101 by a suitable process, such as spin coating process or lamination process, and then a photo exposure process and a development process can be employed to form multiple openings 106a in the photoresist layer 106. The openings 106a in the photoresist layer 106 expose multiple regions of the metal layer 104. The photoresist layer 106 may include or may be a polymer layer.

Figure 5M:
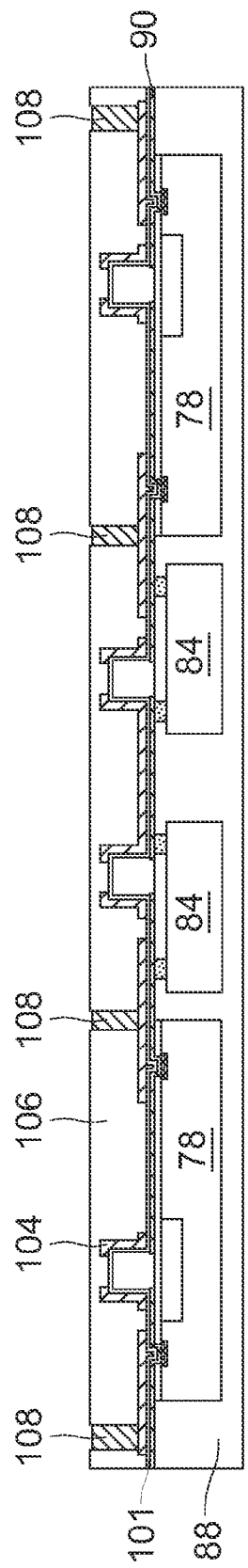

Next, referring to FIG. 5M, a metal layer 108 can be formed on the metal layer 104 exposed by the openings 106a in the photoresist layer 106. The metal layer 108 can be formed by a suitable process, such as electroplating process and/or electroless plating process. The metal layer 108 may include or may be a layer of one or more of gold, copper, silver, nickel, palladium, and platinum. The metal layer 108 may have a suitable thickness, e.g. smaller than 50 micrometers, such as between 1 and 20 micrometers, between 2 nanometers and 50 micrometers, between 3 and 25 micrometers, or between 5 and 50 micrometers. For example, the metal layer 108 can be a single layer of electroplated copper or electroplated gold having a thickness, e.g., smaller than 25 micrometers, such as between 5 and 15 micrometers. Alternatively, the metal layer 108 can be composed of an electroplated copper layer having a thickness between 2 and 15 micrometers, a nickel layer having a thickness between 0.1 and 5 micrometers on the copper layer, and a gold or palladium layer having a thickness between 0.1 and 2 micrometers on the nickel layer.

Figure 5N:
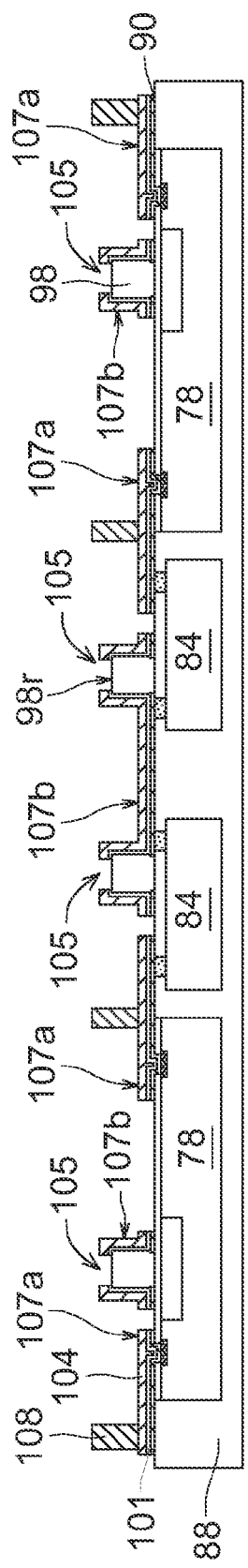

Next, referring to FIG. 5N, the photoresist layer 106 is removed by using, e.g., an organic chemical. After the photoresist layer 106 is removed, the metal layer 101 not under the metal layer 104 can be removed by a suitable process, such as dry etching process, wet etching process, chemical etching process or plasma etching process, and then the reflecting layer 90 not under the metal layer 104 can be removed by a suitable process, such as dry etching process or wet etching process.

Accordingly, the remained reflecting layer 90, the remained metal layer 101, and the metal layer 104 compose multiple metal interconnects 107a and 107b over the carrier 88. Multiple metal bumps or posts composed of the metal layer 108 are formed on the metal layer 104 of the metal interconnects 107a. Each of the metal bumps or posts 108 can be connected to one or more of the metal pads 82 of the logic chips 78 and/or one or more of the metal pads or bumps 86 of the illuminant devices 84 through one of the metal interconnects 107a. One or more of the metal pads 82 of the logic chips 78 can be connected to the one or more of the metal pads or bumps 86 of the illuminant devices 84 through one of the metal interconnects 107a. The transparent bumps 98 can be used as waveguides and are surrounded by the metal interconnects 107b. Each of the metal interconnects 107b can be used as a metal shielding and surrounds one or more of the transparent bumps 98. The middle metal interconnect 107b shown in FIG. 5N surrounds two of the transparent bumps 98, and the right and left metal interconnects 107b shown in FIG. 5N surround one of the transparent bumps 98, respectively. The metal interconnects 107a and the metal bumps or posts 108 can be configured for delivering power/ground or transmitting electrical signals. The metal interconnects 107b can be configured for delivering power/ground or transmitting electrical signals.

In addition, multiple holes or vias 105 are formed through the metal layers 101 and 104 of the metal interconnects 107b vertically over the transparent bumps 98. The holes or vias 105 expose multiple regions 98r of the top surfaces of the transparent bumps 98, and the regions 98r of the top surfaces of the transparent bumps 98 are at bottoms of the holes or vias 105. However, the holes or vias 105 do not expose the sidewalls of the transparent bumps 98.

Figure 5O:
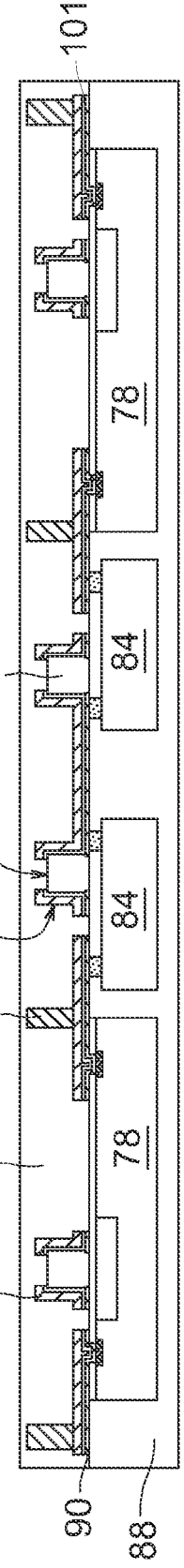

Next, referring to FIG. 5O, a transparent layer 110 can be formed over the carrier 88, on the metal layer 104 of the metal interconnects 107a and 107b, on top surfaces and sidewalls of the metal bumps or posts 108, on the regions 98r of the top surfaces of the transparent bumps 98, and in the holes or vias 105. The transparent layer 110 can be formed by a suitable process, such as spin coating process, dispensing process, molding process, or screen printing process. The transparent layer 110 may include or may be a layer of one or more of polyimide, benzocyclobutene (BCB), Polymethylmethacrylate (PMMA), Polystyrene (PS), Polycarbonate (PC), and epoxy.

Figure 5P:
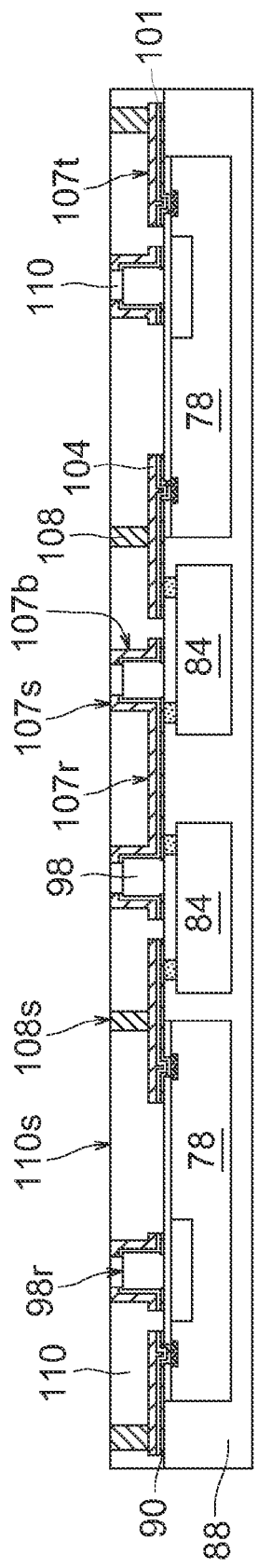

Next, referring to FIG. 5P, the transparent layer 110 can be ground or polished by, e.g., a chemical-mechanical-polishing (CMP) process, a mechanical polishing process, a mechanical grinding process, or a process including mechanical polishing and chemical etching until each of the metal bumps or posts 108 has an exposed top surface 108s and each of the metal interconnects 107b has an exposed top surface 107s. Each of the metal interconnects 107b further has a top surface 107r, which is lower than its exposed top surface 107s and is covered by the ground or polished transparent layer 110. The exposed top surfaces 107s and the top surfaces 107r are provided by the metal layer 104 of the metal interconnects 107b. Each of the metal interconnects 107a has a top surface 107t, which is lower than the exposed top surfaces 107s of the metal interconnects 107b and is covered by the ground or polished transparent layer 110. The top surfaces 107t are provided by the metal layer 104 of the metal interconnects 107a. The ground or polished transparent layer 110 may have a top surface 110s substantially coplanar with the exposed top surfaces 107s and 108s.

Figure 5Q:
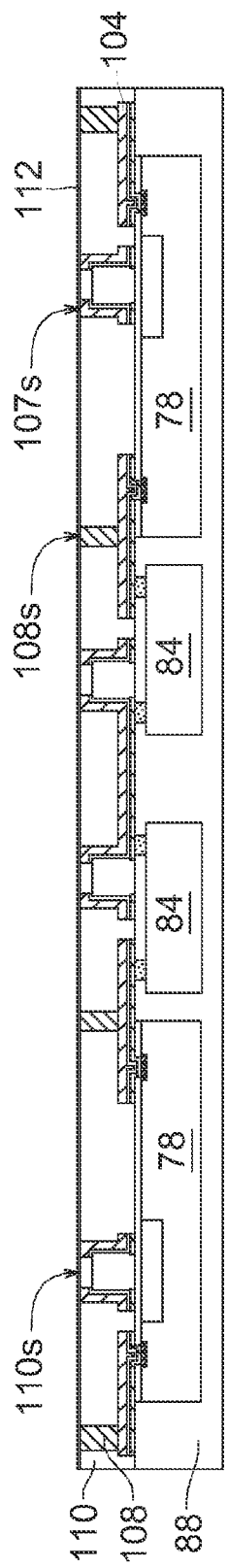

Next, referring to FIG. 5Q, a metal layer 112 can be formed on the top surface 110 and the exposed top surfaces 107s and

108s by a suitable process, such as physical-vapor deposition (PVD) process, chemical-vapor deposition (CVD) process, or atomic layer deposition (ALD) process. The physical vapor deposition (PVD) process can be a sputtering process or an evaporation process. The metal layer 112, for example, can be composed of an adhesion/barrier layer and a seed layer on the adhesion/barrier layer. The adhesion/barrier layer of the metal layer 112 can be formed on the top surface 110 and the exposed top surfaces 107s and 108s by a suitable process, such as physical-vapor deposition (PVD) process, chemical-vapor deposition (CVD) process, or atomic layer deposition (ALD) process. The adhesion/barrier layer of the metal layer 112 may include or may be a layer of one or more of titanium-nitride, titanium-tungsten-alloy, tantalum-nitride, titanium, and tantalum. The adhesion/barrier layer of the metal layer 112 may have a suitable thickness, e.g. smaller than 1 micrometer, such as between 0.1 and 1 micrometers or between 0.05 and 0.8 micrometers. The seed layer of the metal layer 112 can be formed by a suitable process, such as physical-vapor deposition (PVD) process, chemical-vapor deposition (CVD) process, or atomic layer deposition (ALD) process. The seed layer of the metal layer 112 may include or may be a layer of one or more of gold, copper, silver, nickel, palladium, and platinum. The seed layer of the metal layer 112 may have a suitable thickness, e.g. smaller than 2 micrometers, such as between 0.3 and 2 micrometers, between 20 nanometers and 1.5 micrometers, or between 0.1 and 1 micrometers.

Figure 5R:
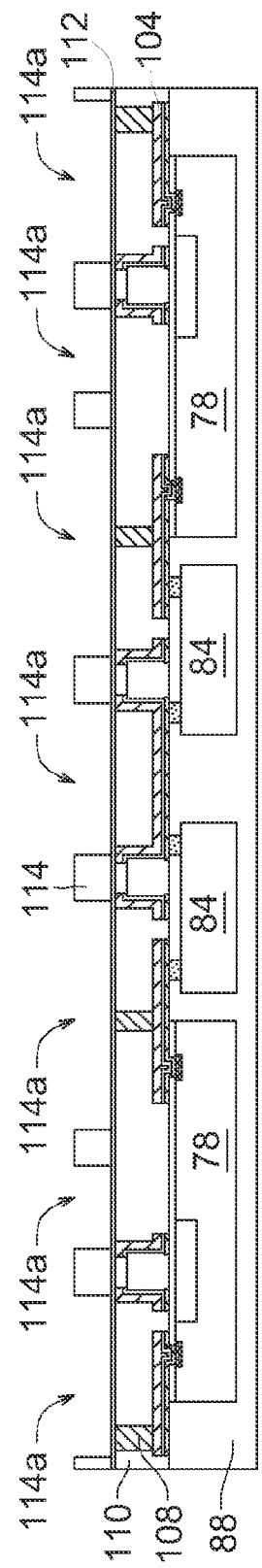

Next, referring to FIG. 5R, a photoresist layer 114 is formed on the seed layer of the metal layer 112 by a suitable process, such as spin coating process or lamination process, and then a photo exposure process and a development process can be employed to form multiple openings 114a in the photoresist layer 114. The openings 114a in the photoresist layer 114 expose multiple regions of the seed layer of the metal layer 112. The photoresist layer 114 may include or may be a polymer layer.

Figure 5S:
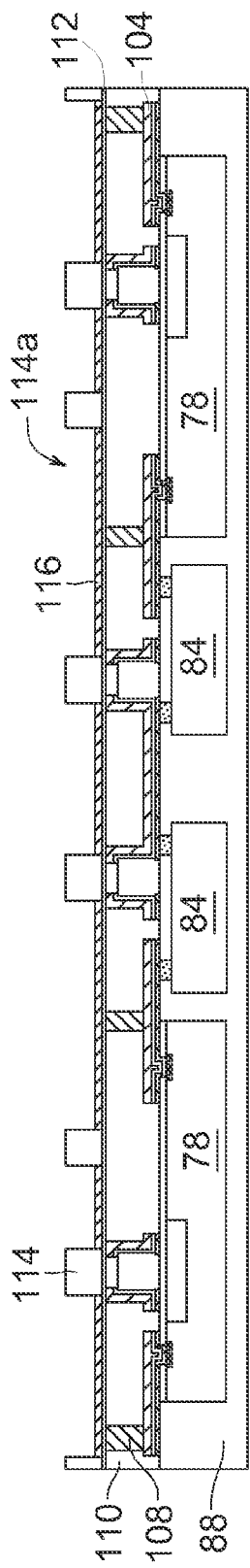

Next, referring to FIG. 5S, a metal layer 116 is formed on the seed layer of the metal layer 112 exposed by the openings 114a in the photoresist layer 114. The metal layer 116 can be formed by a suitable process, such as electroplating process and/or electroless plating process. The metal layer 116 may include or may be a layer of one or more of gold, copper, silver, nickel, aluminum, palladium, and platinum. The metal layer 116 may have a suitable thickness, e.g. smaller than 50 micrometers, such as between 1 and 20 micrometers, between 2 nanometers and 50 micrometers, or between 2 and 15 micrometers. For example, the metal layer 116 can be a single layer of electroplated copper or electroplated gold having a thickness, e.g., smaller than 25 micrometers, such as between 2 and 15 micrometers. Alternatively, the metal layer 116 can be composed of an electroplated copper layer having a thickness between 2 and 15 micrometers, a nickel layer having a thickness between 0.1 and 5 micrometers on the copper layer, and a gold or palladium layer having a thickness between 0.1 and 2 micrometers on the nickel layer.

Next, referring to FIG. 5T, the photoresist layer 114 is removed by using, e.g., an organic chemical, and then a photoresist layer 118 is formed on the seed layer of the metal layer 112 and the metal layer 116 by a suitable process. Multiple openings 118a in the photoresist layer 118 expose multiple regions of a top surface of the metal layer 116. The photoresist layer 118 may include or may be a polymer layer.

Next, referring to FIG. 5U, a metal layer 120 is formed on the top surface of the metal layer 116 exposed by the openings 118a in the photoresist layer 118. The metal layer 120 can be formed by a suitable process, such as electroplating process and/or electroless plating process. The metal layer 120 may include or may be a layer of one or more of gold, copper, silver, nickel, palladium, and platinum. The metal layer 120 may have a suitable thickness, e.g. smaller than 50 or 150 micrometers, such as between 1 and 20 micrometers, between 2 nanometers and 50 micrometers, between 20 and 50 micrometers, or between 30 and 150 micrometers. For example, the metal layer 120 can be a single layer of electroplated copper or electroplated gold having a thickness, e.g., smaller than 50 or 150 micrometers, such as between 30 and 150 micrometers or between 20 and 50 micrometers.

Figure 5V:
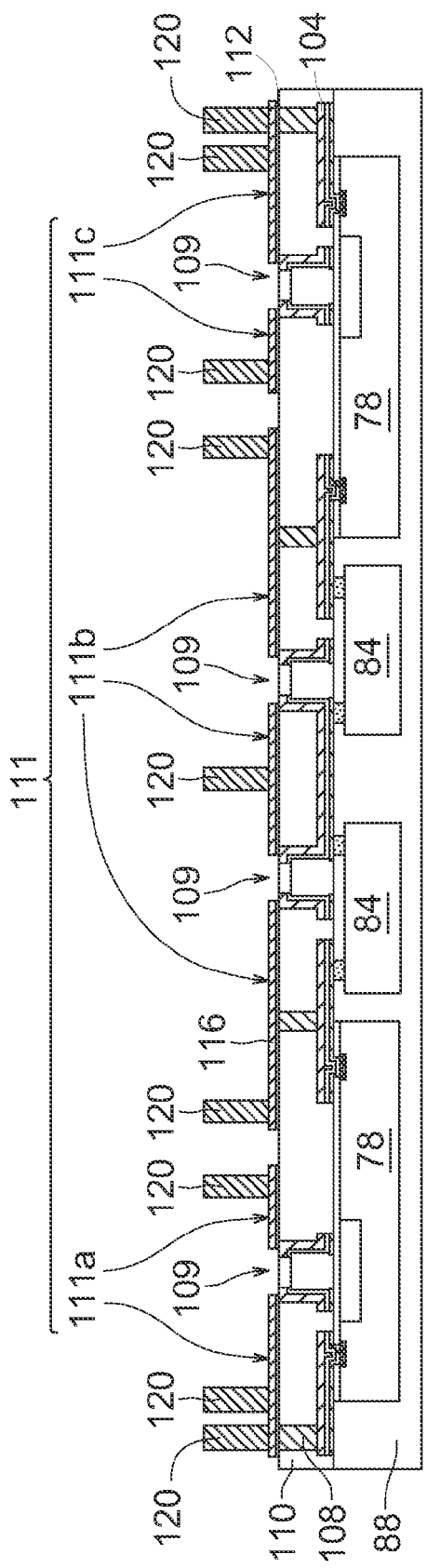

Next, referring to FIG. 5V, the photoresist layer 118 is removed by using, e.g., an organic chemical, and then the metal layer 112 not under the metal layer 116 is removed by a suitable process, such as wet etching process, dry etching process, chemical etching process, or plasma etching process. Accordingly, the remained metal layer 112 and the metal layer 116 compose multiple metal traces or interconnects 111 on the top surface 110s of the transparent layer 110, on the top surfaces 107s of the metal interconnects 107b, and on the top surfaces 108s of the metal bumps or posts 108. Multiple metal bumps or posts composed of the metal layer 120 are formed on the metal traces or interconnects 111. In addition, multiple holes or vias 109 are formed in and through the metal traces or interconnects 111 and expose the transparent layer 110 in the holes or vias 105 and on the regions 98r of the top surfaces of the transparent bumps 98. The metal bumps or posts 120 can be connected to the metal bumps or posts 108 and the metal interconnects 107a and 107b through the metal traces or interconnects 111. One of the metal bumps or posts 120 can be connected to another one or more of the metal bumps or posts 120 through one of the metal traces or interconnects 111. Each of the metal traces or interconnects 111 can be configured for delivering power/ground or transmitting electrical signals.

As shown in FIG. 5V, the metal traces or interconnects 111 includes three metal traces or interconnects 111a, 111b and 111c. At least three metal bumps or posts 120 are formed on the metal layer 116 of the metal trace or interconnect 111a, and at least one hole or via 109 are formed in and through the metal trace or interconnect 111a. The metal bumps or posts 120 on the metal trace or interconnect 111a can be connected to each other through the metal trace or interconnect 111a. At least three metal bumps or posts 120 are formed on the metal layer 116 of the metal trace or interconnect 111b, and at least two holes or vias 109 are formed in and through the metal trace or interconnect 111b. The metal bumps or posts 120 on the metal trace or interconnect 111b can be connected to each other through the metal trace or interconnect 111b. At least three metal bumps or posts 120 are formed on the metal layer 116 of the metal trace or interconnect 111c, and at least one hole or via 109 are formed in and through the metal trace or interconnect 111c. The metal bumps or posts 120 on the metal trace or interconnect 111c can be connected to each other through the metal trace or interconnect 111c. The metal traces or interconnects 111a, 111b and 111c may be separated each other or may be connected to each other.

Figure 5W:
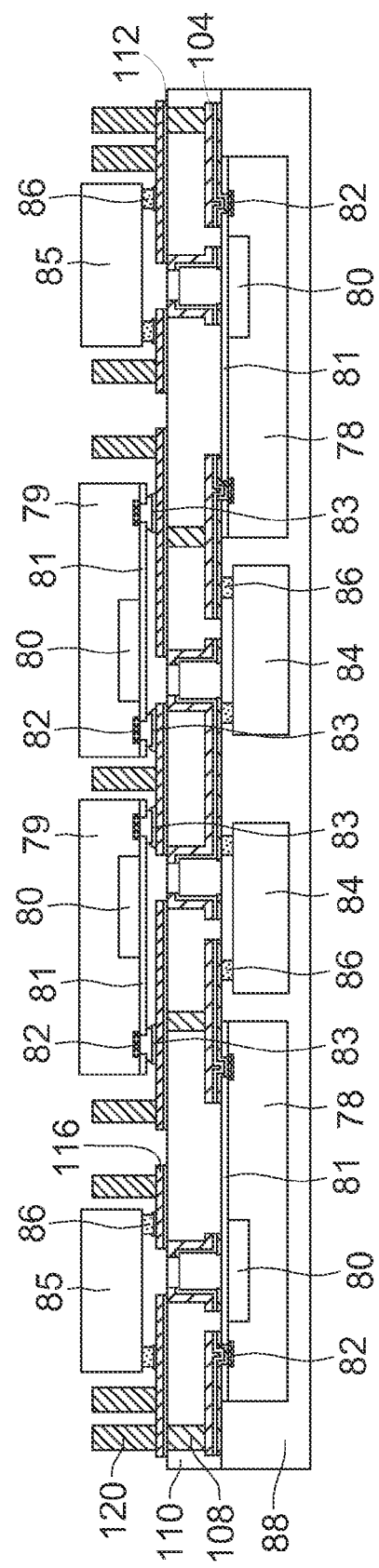
Figure 5A:
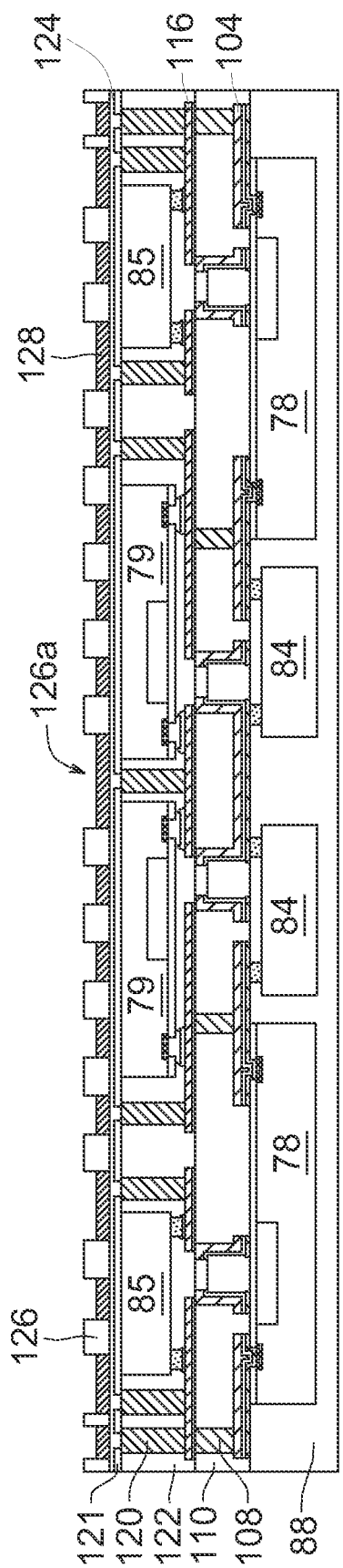
Figure 5A:
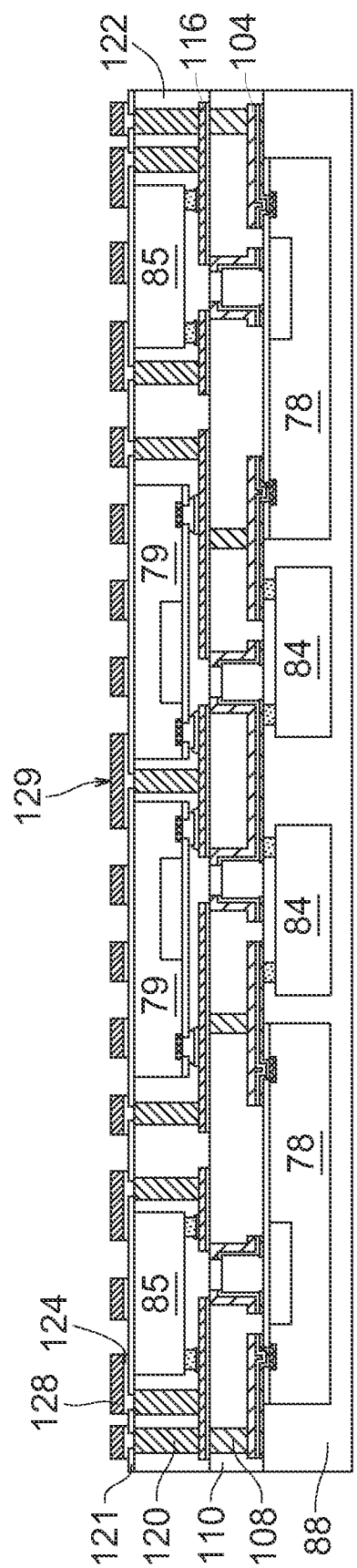
Figure 5A:
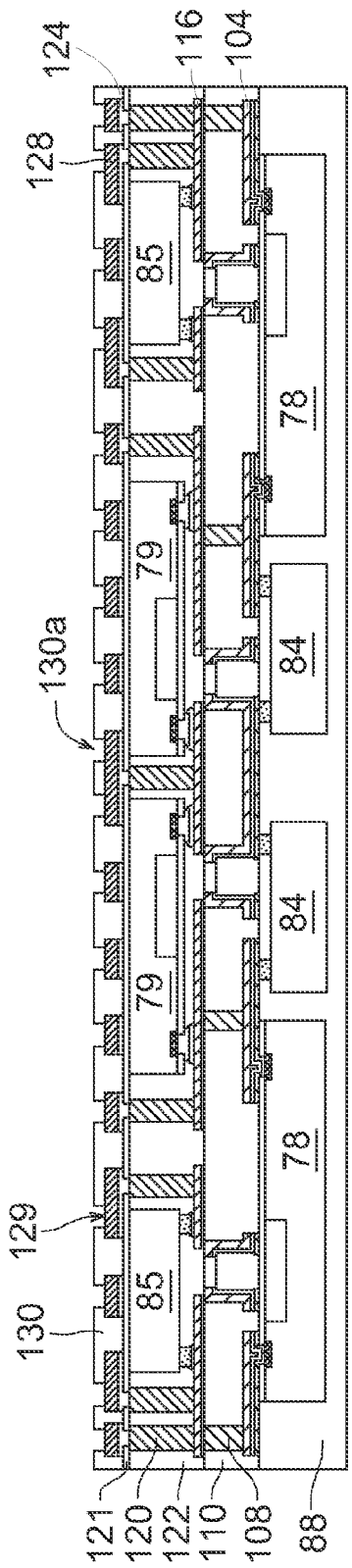
Figure 5A:
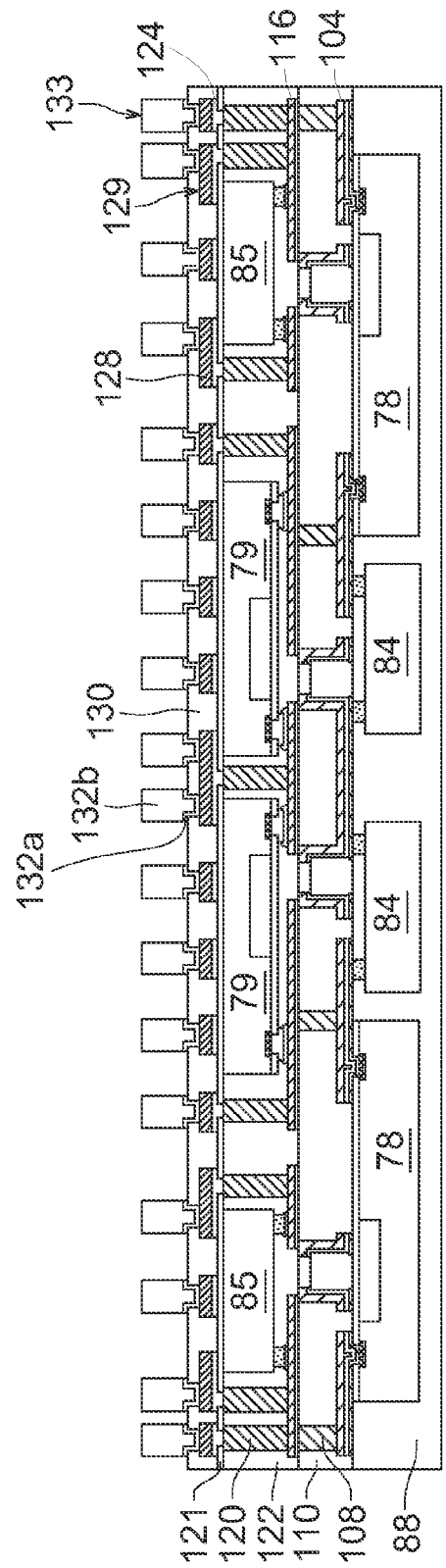

Next, referring to FIG. 5W, multiple logic chips 79 (two of them are shown) and multiple illuminant devices 85 (two of them are shown) can be joined with the metal layer 116 of the metal traces or interconnects 111 by a suitable process, such as flip-chip process or solder bonding process. Accordingly, the logic chips 79 and the illuminant devices 85 can be formed over the logic chips 78, over the illuminant devices 84, vertical over the transparent bumps 98, over the metal interconnects 107a and 107b, and between the metal bumps or posts 120. The logic chips 79 and the illuminant devices 85 may be higher than the metal bumps or posts 120.

Each of the logic chips 79 illustrated in FIG. 5W includes a passivation layer 81, a semiconductor substrate (not shown) over the passivation layer 81, multiple metal pads 82 over the passivation layer 81, and a sensor area 80 over the passivation layer 81. The passivation layer 81 can be an insulating layer, such as silicon-nitride layer, silicon-oxide layer, or silicon-oxynitride layer, having a suitable thickness, e.g., smaller than 1 micrometer, such as between 0.2 and 0.9 micrometers. Multiple openings in the passivation layers 81 of the logic chips 79 are under multiple contact points of the metal pads 82 of the logic chips 79, and the contact points of the metal pads 82 of the logic chips 79 are at tops of the openings in the passivation layers 81 of the logic chips 79. The metal pads 82 of the logic chips 79 can be copper pads, aluminum pads, or gold pads. The logic chips 79 can be joined with the metal traces or interconnects 111 by using metal bumps 83, such as solder bumps, copper bumps, or gold bumps. Each of the metal pads 82 of the logic chips 79 can be connected to one of the metal traces or interconnects 111, such as the metal trace or interconnect 111$b$, through the aligned opening in its passivation layer 81 and through one of the metal bumps 83. Each of the sensor areas 80 of the logic chips 79 aligns with one of the transparent bumps 98 and one of the illuminant devices 84. The sensor areas 80 of the logic chips 79 can detect light, emitted from the illuminant devices 84, through the transparent bumps 98 between the logic chips 79 and the illuminant devices 84. Each of the sensor areas 80 of the logic chips 79 can be a light detector, an image sensor, or a CMOS sensor.

The logic chips 79 illustrated in FIG. 5W can be central-processing-unit (CPU) chips, graphics-processing-unit (GPU) chips, or digital-signal-processing (DSP) chips. Alternatively, as shown in FIG. 5W, the right logic chip 79 can be a central-processing-unit (CPU) chip, and the left logic chip 79 can be a processing-unit (GPU) chip or a digital-signal-processing (DSP) chip.

Each of the illuminant devices 85 illustrated in FIG. 5W can be a light emitting diode (LED), a laser device, or any other light emitting device. Alternatively, the illuminant devices 85 can be chips that can emit light. Each of the illuminant devices 85 has metal pads or bumps 86 joining the metal layer 116 of the metal traces or interconnects 111. The metal pads or bumps 86 may include a layer of gold, aluminum or copper having a suitable thickness, e.g., smaller than 10 micrometers, such as between 4 and 8 micrometers. One of the metal pads or bumps 86 can be connected to one of the metal traces or interconnects 111, such as the metal trace or interconnect 111$a$ or 111$c$. As shown in FIG. 5W, the sensor areas 80 of the logic chips 78 can detect light, emitted from the illuminant devices 85, through the transparent bumps 98 between the logic chips 78 and the illuminant devices 85.

Next, referring to FIG. 5X, a polymer layer 122 can be formed on the logic chips 79, the illuminant devices 85, the transparent layer 110, the metal bumps or posts 120, and the metal traces or interconnects 111 by a suitable process, such as spin coating process, dispensing process, molding process, or screen printing process. The polymer layer 122 contacts top surfaces and sidewalls of the metal bumps or posts 120, the semiconductor substrates of the logic chips 79, sidewalls of the logic chips 79, top surfaces and sidewalls of the illuminant devices 85, and top surfaces and sidewalls of the metal traces or interconnects 111. The polymer layer 122 may include or may be a layer of one or more of polyimide, BCB, PMMA, PS, PC, and epoxy.

Next, referring to FIG. 5Y, the polymer layer 122 can be ground or polished by, e.g., a chemical-mechanical-polishing (CMP) process, a mechanical polishing process, a mechanical grinding process, or a process including mechanical polishing and chemical etching until each of the metal bumps or posts 120 has an exposed top surface 120$s$, each of the logic chips 79 has an exposed top surface 79$s$, and each of the illuminant devices 85 has an exposed top surface 85$s$. The exposed top surfaces 79$s$ can be provided by the semiconductor substrates of the logic chips 79. The ground or polished polymer layer 122 may have a top surface 122$s$ substantially coplanar with the exposed top surfaces 120$s$, 79$s$ and 85$s$.

Next, referring to FIG. 5Z, an insulating layer 121 is formed on the top surface 122$s$ and the exposed top surfaces 120$s$, 79$s$ and 85$s$. Multiple openings 121$a$ in the insulating layer 121 expose multiple regions of the top surfaces 120$s$. The insulating layer 121 may include a silicon-nitride layer, a silicon-oxynitride layer, and/or a silicon-oxide layer and has a suitable thickness, e.g., smaller than 5 micrometers, such as between 0.5 and 1.5 micrometers.

Next, referring to FIG. 5AA, a metal layer 124 is formed on the insulating layer 121, on the top surfaces 120$s$ exposed by the openings 121$a$, and in the openings 121$a$. The metal layer 124 may have a suitable thickness, e.g., smaller than 2 micrometers, such as between 0.05 and 2 micrometers or between 0.1 and 1.5 micrometers.

The metal layer 124, for example, can be composed of an adhesion/barrier layer and a seed layer on the adhesion/barrier layer. The adhesion/barrier layer of the metal layer 124 is formed on the insulating layer 121, on the top surfaces 120$s$ exposed by the openings 121$a$, and in the openings 121$a$ and can be formed by a non-electroplating process, such as physical-vapor deposition (PVD) process, chemical-vapor deposition (CVD) process, or atomic layer deposition (ALD) process. The physical vapor deposition (PVD) process can be a sputtering process or an evaporation process. The adhesion/barrier layer of the metal layer 124 may include or may be a layer of one or more of titanium-nitride, titanium-tungsten-alloy, tantalum-nitride, titanium, and tantalum. The adhesion/barrier layer of the metal layer 124 may have a suitable thickness, e.g. smaller than 1 micrometer, such as between 0.1 and 1 micrometers or between 0.05 and 0.8 micrometers. The seed layer of the metal layer 124 can be formed by a non-electroplating process, such as physical-vapor deposition (PVD) process, chemical-vapor deposition (CVD) process, or atomic layer deposition (ALD) process. The seed layer of the metal layer 124 may include or may be a layer of one or more of gold, copper, silver, nickel, palladium, and platinum. The seed layer of the metal layer 124 may have a suitable thickness, e.g. smaller than 2 micrometers, such as between 0.3 and 2 micrometers, between 20 nanometers and 1.5 micrometers, or between 0.1 and 1 micrometers.

As shown in FIG. 5AA, after the metal layer 124 is formed, a photoresist layer 126 is formed on the seed layer of the metal layer 124 by a suitable process, such as spin coating process or lamination process, and then a photo exposure process and a development process can be employed to form multiple openings 126$a$ in the photoresist layer 126. The openings 126$a$ in the photoresist layer 126 expose multiple regions of the seed layer of the metal layer 124. The photoresist layer 126 may include or may be a polymer layer.

Next, referring to FIG. 5AB, a metal layer 128 is formed on the seed layer of the metal layer 124 exposed by the openings 126$a$ in the photoresist layer 126. The metal layer 128 can be formed by a suitable process, such as electroplating process and/or electroless plating process. The metal layer 128 may include or may be a layer of one or more of gold, copper, silver, nickel, aluminum, palladium, and platinum. The metal layer 128 may have a suitable thickness, e.g. smaller than 50 micrometers, such as between 1 and 20 micrometers, between 2 nanometers and 50 micrometers, or between 2 and 15 micrometers.

For example, the metal layer 128 can be a single layer of electroplated copper or electroplated gold having a thickness, e.g., smaller than 25 micrometers, such as between 2 and 15 micrometers. Alternatively, the metal layer 128 can be composed of an electroplated copper layer having a thickness between 2 and 15 micrometers, a nickel layer having a thickness between 0.1 and 5 micrometers on the copper layer, and a gold or palladium layer having a thickness between 0.1 and 2 micrometers on the nickel layer.

Next, referring to FIG. 5AC, the photoresist layer 126 is removed by using, e.g., an organic chemical, and then the metal layer 124 not under the metal layer 128 is removed by a suitable process, such as wet etching process, dry etching process, chemical etching process, or plasma etching process. Accordingly, the remained metal layer 124 and the metal layer 128 compose multiple metal traces or interconnects 129 on the insulating layer 121, on the top surfaces 120s exposed by the openings 121a, and in the openings 121a. The metal traces or interconnects 129 can be connected to the metal traces or interconnects 111 through the metal bumps or posts 120.

Next, referring to FIG. 5AD, a polymer layer 130 can be formed on the metal layer 128 of the metal traces or interconnects 129 and on the insulating layer 121. The polymer layer 130 contacts sidewalls of the metal traces or interconnects 129. Multiple openings 130a in the polymer layer 130 expose multiple regions of the metal layer 128. The polymer layer 130 can be formed by a process including a spin coating process, an exposing process, a developing process, and a curing process. Alternatively, the polymer layer 130 can be formed by a process including a dispensing process, a molding process, or a screen printing process. The polymer layer 130 may include or may be a layer of one or more of polyimide, BCB, PMMA, PS, PC, and epoxy. The polymer layer 130 may have a suitable thickness, e.g., greater than 2 micrometers, such as between 2 and 20 micrometers or between 5 and 30 micrometers.

Next, referring to FIG. 5AE, multiple metal bumps 133 are formed on the metal layer 128 of the metal traces or interconnects 129 exposed by the openings 130a in the polymer layer 130. Each of the metal bumps 133 can be composed of a metal layer 132a and a metal layer 132b on the metal layer 132a.

The metal layer 132a, for example, can be composed of an adhesion/barrier layer and a seed layer on the adhesion/barrier layer. The adhesion/barrier layer of the metal layer 132a can be formed on the metal layer 128 exposed by the openings 130a in the polymer layer 130 by a suitable process, such as physical-vapor deposition (PVD) process or sputtering process. The adhesion/barrier layer of the metal layer 132a may include or may be a layer of one or more of titanium, tantalum, titanium-nitride, titanium-tungsten alloy, and tantalum-nitride. The adhesion/barrier layer of the metal layer 132a may have a suitable thickness, e.g. smaller than 1 micrometer, such as between 0.1 and 1 micrometers or between 0.05 and 0.8 micrometers. The seed layer of the metal layer 132a can be formed by a suitable process, such as physical-vapor deposition (PVD) process or sputtering process. The seed layer of the metal layer 132a may include or may be a layer of gold, copper, silver, nickel, palladium, or platinum. The seed layer of the metal layer 132a may have a suitable thickness, e.g. smaller than 2 micrometers, such as between 0.3 and 2 micrometers, between 20 nanometers and 1.5 micrometers, or between 0.1 and 1 micrometers. The metal layer 132b may include or may be a layer of one or more of copper, gold, nickel, silver, palladium, and platinum. The metal layer 132b can be formed on the seed layer of the metal layer 132a by a suitable process, such as electroplating process.

For example, the metal layer 132b can be a single layer of electroplated copper, electroplated gold or electroplated nickel, which is formed on the copper, gold or nickel seed layer of the metal layer 132a and has a thickness, e.g., greater than 5 micrometers, such as between 5 and 100 micrometers or between 10 and 60 micrometers. Alternatively, the metal layer 132b can be composed of an electroplated copper layer having a thickness between 5 and 100 micrometers and a nickel, gold or palladium layer having a thickness between 1 and 10 micrometers on the electroplated copper layer. Alternatively, the metal layer 132b can be composed of an electroplated copper layer having a thickness between 5 and 100 micrometers on the copper seed layer of the metal layer 132a, a nickel layer having a thickness between 1 and 10 micrometers on the electroplated copper layer, and a gold or palladium layer having a thickness between 1 and 10 micrometers on the nickel layer. Alternatively, the metal layer 132b can be composed of an electroplated copper layer having a thickness between 1.5 and 5 micrometers on the copper seed layer of the metal layer 132a, an electroplated nickel layer having a thickness between 1 and 3 micrometers on the electroplated copper layer, and an electroplated solder having a thickness between 50 and 100 micrometers on the electroplated nickel layer.

Alternatively, the metal layer 132a can be composed of a titanium-containing layer and a copper or nickel layer having a thickness smaller than 1 micrometer on the titanium-containing layer, and the metal layer 132b can be a solder bump having a thickness between 150 and 350 micrometers on the copper or nickel layer of the metal layer 132a. The titanium-containing layer of the metal layer 132a can be formed on the metal layer 128 exposed by the openings 130s in the polymer layer 130 by a suitable process, such as physical-vapor deposition (PVD) process, sputtering process, or electroless plating process. The titanium-containing layer of the metal layer 132a can be a titanium layer, a titanium-nitride layer, or a titanium-tungsten-alloy layer and has a suitable thickness, e.g. smaller than 1 micrometer, such as between 0.1 and 1 micrometers or between 0.05 and 0.8 micrometers. The copper or nickel layer of the metal layer 132a can be formed by a suitable process, such as physical-vapor deposition (PVD) process, sputtering process, or electroless plating process. The solder bump can be formed by a suitable process, such as screen plating process, and can be composed of gold-tin alloy, tin-silver alloy, tin-silver-copper alloy, indium, tin-bismuth alloy, or other lead-free alloy.

As shown in FIG. 5AE, after the metal bumps 133 are formed, a singulation process can be performed to cut the carrier 88, the transparent layer 110, the insulating layer 121, and the polymer layers 122 and 130 by using, e.g., mechanical sawing or laser cutting and to singularize multiple multi-chip packages 203 (one of them is shown). Each of the multi-chip packages 203 includes multiple waveguide structures, each including one or more of the transparent bumps 98 and one or more of the metal interconnects 107b. One or more of the multi-chip packages 203 can be connected to and bonded with a carrier, such as mother board, printed-circuit board (PCB), ball-grid-array (BGA) substrate, metal substrate, glass substrate, or ceramic substrate, using the metal bumps 133.

FIGS. 6A-6J illustrate a process of forming a multi-chip package including waveguide structures for signal transmission and power/ground delivery.

FIG. 6A illustrates a process continuing from FIG. 5V. After the metal traces or interconnects 111 illustrated in FIG.

5V and the metal bumps or posts 120 illustrated in FIG. 5V are formed, multiple logic chips 79 (two of them are shown) and multiple illuminant devices 85 (two of them are shown) are joined with the metal layer 116 of the metal traces or interconnects 111 by using, e.g., a glue material 77. Accordingly, the logic chips 79 and the illuminant devices 85 can be formed over the logic chips 78, over the illuminant devices 84, vertical over the transparent bumps 98, over the metal interconnects 107a and 107b, and between the metal bumps or posts 120. The logic chips 79 may be higher than the metal bumps or posts 120.

Each of the logic chips 79 illustrated in FIG. 6A includes a passivation layer 81, a semiconductor substrate (not shown) over the passivation layer 81, multiple metal pads 82 over the passivation layer 81, and a sensor area 80 over the passivation layer 81. The passivation layer 81 can be an insulating layer, such as silicon-nitride layer, silicon-oxide layer, or silicon-oxynitride layer, having a suitable thickness, e.g., smaller than 1 micrometer, such as between 0.2 and 0.9 micrometers. No openings in the passivation layers 81 of the logic chips 79 are under the metal pads 82 of the logic chips 79. The metal pads 82 of the logic chips 79 can be copper pads, aluminum pads, or gold pads. Each of the sensor areas 80 of the logic chips 79 aligns with one of the transparent bumps 98 and one of the illuminant devices 84. The sensor areas 80 of the logic chips 79 can detect light, emitted from the illuminant devices 84, through the transparent bumps 98 between the logic chips 79 and the illuminant devices 84. Each of the sensor areas 80 of the logic chips 79 can be a light detector, an image sensor, or a CMOS sensor. The passivation layers 81 of the logic chips 79 and bottom surfaces of the illuminant devices 85 contact the glue material 77.

The logic chips 79 illustrated in FIG. 6A can be central-processing-unit (CPU) chips, graphics-processing-unit (GPU) chips, or digital-signal-processing (DSP) chips. Alternatively, as shown in FIG. 6A, the right logic chip 79 can be a central-processing-unit (CPU) chip, and the left logic chip 79 can be a processing-unit (GPU) chip or a digital-signal-processing (DSP) chip.

Each of the illuminant devices 85 illustrated in FIG. 6A can be a light emitting diode (LED), a laser device, or any other light emitting device. Alternatively, the illuminant devices 85 can be chips that can emit light. Each of the illuminant devices 85 has metal pads or bumps 86 at its top side. Each of the metal pads or bumps 86 may include a layer of gold, aluminum or copper, which has a suitable thickness, e.g., smaller than 60 micrometers, such as between 4 and 20 micrometers or between 20 and 60 micrometers. As shown in FIG. 6A, the sensor areas 80 of the logic chips 78 can detect light, emitted from the illuminant devices 85, through the transparent bumps 98 between the logic chips 78 and the illuminant devices 85.

Next, referring to FIG. 6B, a polymer layer 122 can be formed on the logic chips 79, the illuminant devices 85, the transparent layer 110, the metal bumps or posts 120, and the metal traces or interconnects 111 by a suitable process, such as spin coating process, dispensing process, molding process, or screen printing process. The polymer layer 122 contacts top surfaces and sidewalls of the metal pads or bumps 86 of the illuminant devices 85, sidewalls of the illuminant devices 85, top surfaces and sidewalls of the metal bumps or posts 120, the semiconductor substrates of the logic chips 79, sidewalls of the logic chips 79, and top surfaces and sidewalls of the metal traces or interconnects 111. The polymer layer 122 may include or may be a layer of one or more of polyimide, BCB, PMMA, PS, PC, and epoxy.

Next, referring to FIG. 6C, the polymer layer 122 can be ground or polished by, e.g., a chemical-mechanical-polishing (CMP) process, a mechanical polishing process, a mechanical grinding process, or a process including mechanical polishing and chemical etching until each of the metal bumps or posts 120 has an exposed top surface 120s, each of the logic chips 79 has an exposed top surface 79s, and each of the metal pads or bumps 86 has an exposed top surface 86s. The exposed top surfaces 79s can be provided by the semiconductor substrates of the logic chips 79. The ground or polished polymer layer 122 may have a top surface 122s substantially coplanar with the exposed top surfaces 79s, 86s and 120s.

Next, referring to FIG. 6D, multiple through-silicon vias (TSVs) 134 are formed in the logic chips 79 by a suitable process, such as wet etching process or dry etching process. The through-silicon vias 134 pass through the semiconductor substrates of the logic chips 79 and expose the metal pads 82 of the logic chips 79.

After the through-silicon vias 134 are formed, an insulating layer (not shown) can be formed on the top surface 122s, the exposed top surfaces 79s, 86s and 120s, sidewalls of the through-silicon vias 134, and the metal pads 82 exposed by the through-silicon vias 134. The insulating layer may include or may be a silicon-nitride layer, a silicon-oxynitride layer, or a silicon-oxide layer and has a suitable thickness, e.g., smaller than 2 micrometers, such as between 0.5 and 1.5 micrometers. Next, an etching process can be employed to remove the insulating layer on and in contact with the metal pads 82 of the logic chips 79 and the top surfaces 86s of the metal pads or bumps 86. Accordingly, the through-silicon vias 134 expose multiple regions of the metal pads 82 of the logic chips 79, and multiple openings (not shown) in the insulating layer expose multiple regions of the top surfaces 86s and 120s.

Figure 6E:
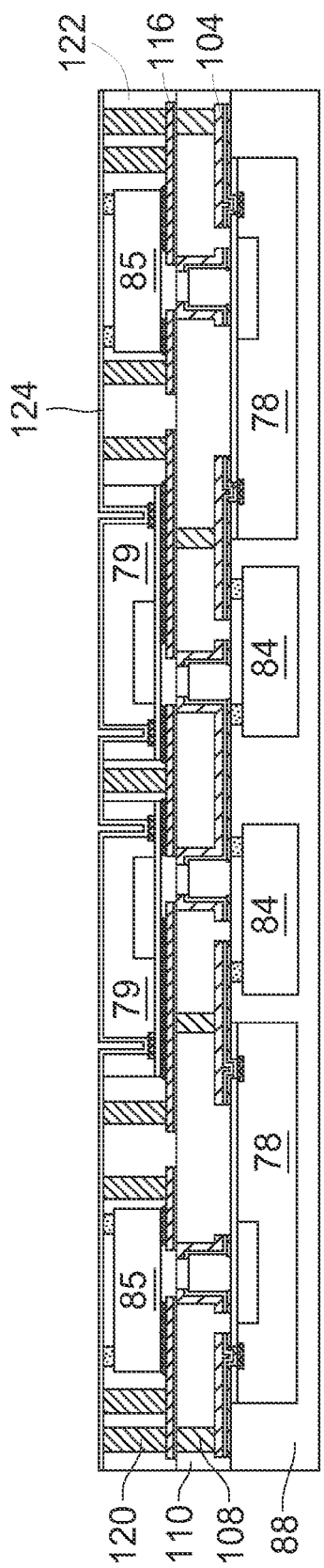

Next, referring to FIG. 6E, a metal layer 124 can be formed in the through-silicon vias 134, on the insulating layer, on the top surfaces 86s and 120s exposed by the openings in the insulating layer, and on the metal pads 82 exposed by the through-silicon vias 134. The metal layer 124 may have a suitable thickness, e.g., smaller than 1.5 micrometers, such as between 0.05 and 1.5 micrometers or between 0.1 and 1 micrometers.

The metal layer 124, for example, can be composed of an adhesion/barrier layer and a seed layer on the adhesion/barrier layer and in the through-silicon vias 134. The adhesion/barrier layer of the metal layer 124 is formed in the through-silicon vias 134, on the insulating layer, on the top surfaces 86s and 120s exposed by the openings in the insulating layer, and on the metal pads 82 exposed by the through-silicon vias 134. The adhesion/barrier layer of the metal layer 124 can be formed by a non-electroplating process, such as physical-vapor deposition (PVD) process, chemical-vapor deposition (CVD) process, or atomic layer deposition (ALD) process. The physical vapor deposition (PVD) process can be a sputtering process or an evaporation process. The adhesion/barrier layer of the metal layer 124 may include or may be a layer of one or more of titanium-nitride, titanium-tungsten alloy, tantalum-nitride, titanium, and tantalum. The adhesion/barrier layer of the metal layer 124 may have a suitable thickness, e.g. smaller than 1 micrometer, such as between 0.1 and 1 micrometers or between 0.05 and 0.8 micrometers. The seed layer of the metal layer 124 can be formed by a non-electroplating process, such as physical-vapor deposition (PVD) process, chemical-vapor deposition (CVD) process, or atomic layer deposition (ALD) process. The seed layer of the metal layer 124 may include or may be a layer of one or more of gold, copper, silver, nickel, palladium, and platinum. The seed layer of the metal layer 124 may have a suitable thickness, e.g. smaller than 1 micrometer, such as between 0.1 and 1 micrometers or between 20 nanometers and 0.5 micrometers.

Figure 6F:
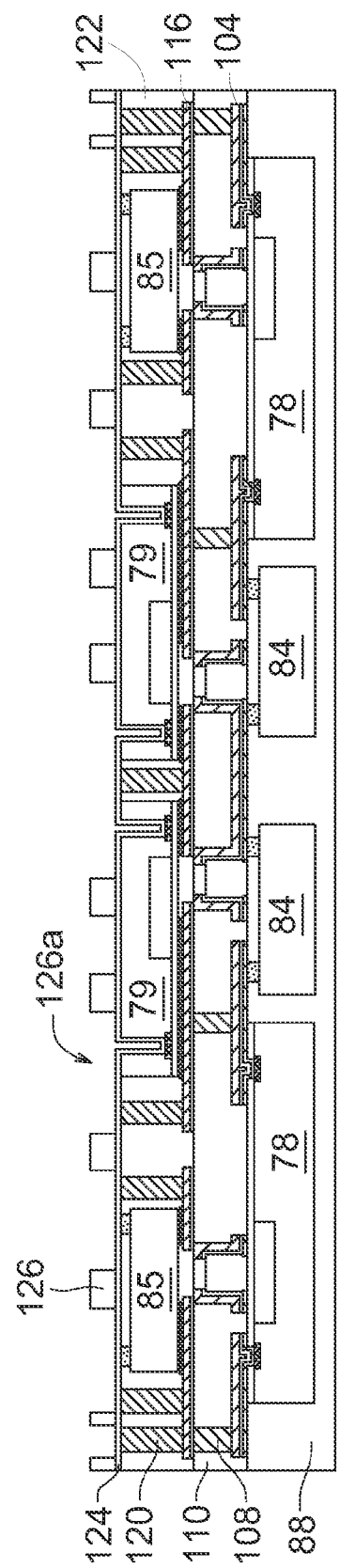

As shown in FIG. 6F, after the metal layer 124 is formed, a photoresist layer 126 is formed on the seed layer of the metal layer 124 by a suitable process, such as spin coating process or lamination process, and then a photo exposure process and a development process can be employed to form multiple openings 126a in the photoresist layer 126. The openings 126a in the photoresist layer 126 expose multiple regions of the seed layer of the metal layer 124. The photoresist layer 126 may include or may be a polymer layer.

Figure 6G:
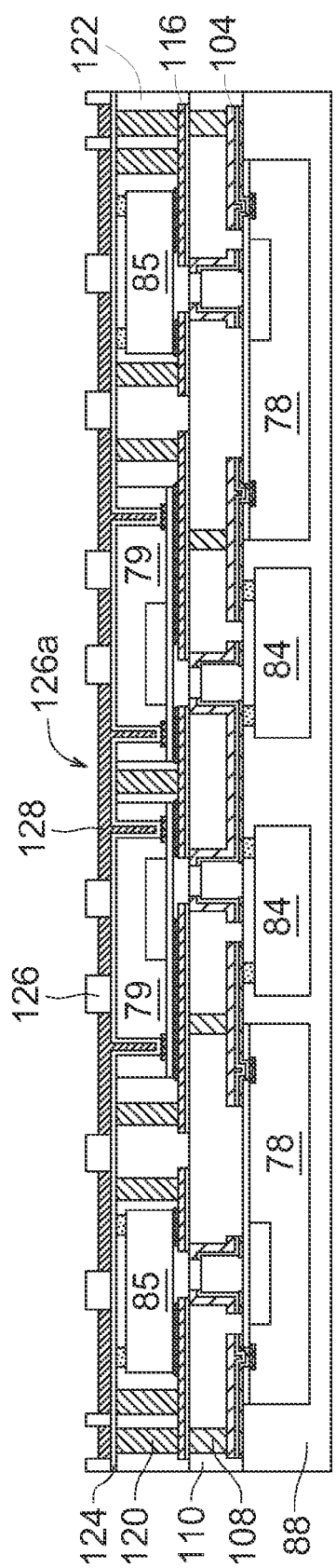

Next, referring to FIG. 6G, a metal layer 128 is formed in the through-silicon vias 134 and on the seed layer of the metal layer 124 exposed by the openings 126a in the photoresist layer 126. The metal layer 128 can be formed by a suitable process, such as electroplating process and/or electroless plating process. The metal layer 128 may include or may be a layer of one or more of gold, copper, silver, nickel, aluminum, palladium, and platinum. The metal layer 128 may have a suitable thickness, e.g. smaller than 50 micrometers, such as between 1 and 20 micrometers, between 2 nanometers and 50 micrometers, or between 2 and 15 micrometers.

For example, the metal layer 128 can be a single layer of electroplated copper or electroplated gold having a thickness, e.g., smaller than 25 micrometers, such as between 2 and 15 micrometers. Alternatively, the metal layer 128 can be composed of an electroplated copper layer having a thickness between 2 and 15 micrometers, a nickel layer having a thickness between 0.1 and 5 micrometers on the copper layer, and a gold or palladium layer having a thickness between 0.1 and 2 micrometers on the nickel layer.

Figure 6H:
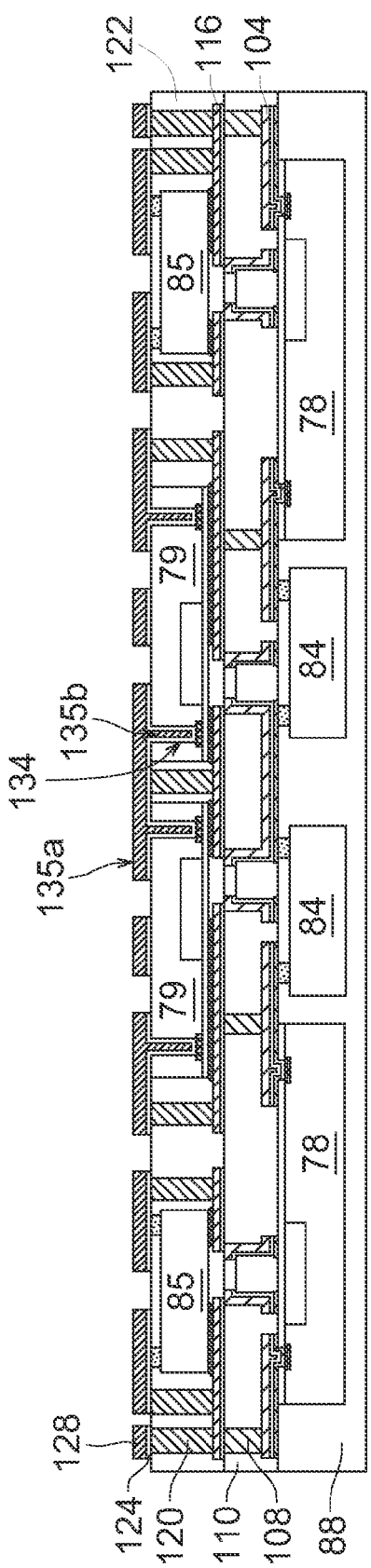

Next, referring to FIG. 6H, the photoresist layer 126 is removed by using, e.g., an organic chemical, and then the metal layer 124 not under the metal layer 128 is removed by a suitable process, such as wet etching process, dry etching process, chemical etching process, or plasma etching process. Accordingly, the remained metal layer 124 and the metal layer 128 compose multiple metal traces or interconnects 135a and multiple metal plugs 135b. The metal traces or interconnects 135a are formed on the top surfaces 86s of the metal pads or bumps 86, on the top surfaces 120s of the metal bumps or posts 120, and on the insulating layer on the top surfaces 79s and 122s. The metal plugs 135b are formed in the through-silicon vias 134 and on the metal pads 82 exposed by the through-silicon vias 134. The metal plugs 135b contact the insulating layer on the sidewalls of the through-silicon vias 134.

The metal traces or interconnects 135a can be connected to the metal bumps or posts 120, the metal pads or bumps 86 of the illuminant devices 85, and the metal pads 82 of the logic chips 79. The metal pads 82 of the logic chips 79 can be connected to the metal traces or interconnects 135a through the metal plugs 135b in the through-silicon vias 134. One of the metal pads 82 of the logic chips 79 can be connected to one or more of the metal bumps or posts 120 and one or more of the metal pads or bumps 86 of the illuminant devices 85 through one of the metal plugs 135b and one of the metal traces or interconnects 135a. The metal traces or interconnects 135a can be configured for delivering power/ground and/or transmitting electrical signals.

Figure 6I:
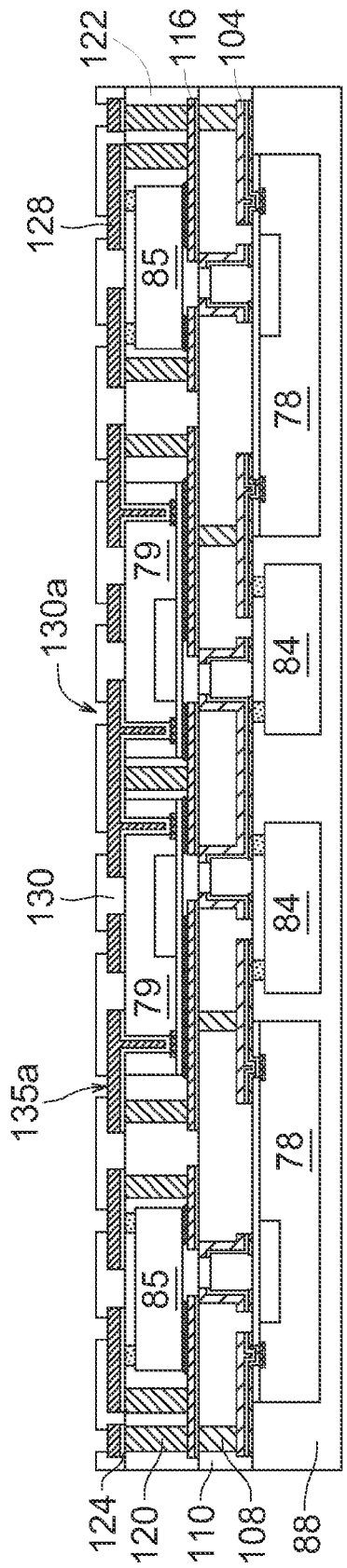

Next, referring to FIG. 6I, a polymer layer 130 can be formed on the metal layer 128 of the metal traces or interconnects 135a and on the insulating layer. The polymer layer 130 contacts sidewalls of the metal traces or interconnects 135a. Multiple openings 130a in the polymer layer 130 expose multiple regions of the metal layer 128. The polymer layer 130 can be formed by a process including a spin coating process, an exposing process, a developing process, and a curing process. Alternatively, the polymer layer 130 can be formed by a process including a dispensing process, a molding process, or a screen printing process. The polymer layer 130 may include or may be a layer of one or more of polyimide, BCB, PMMA, PS, PC, and epoxy. The polymer layer 130 may have a suitable thickness, e.g., greater than 2 micrometers, such as between 2 and 20 micrometers or between 5 and 30 micrometers.

Figure 6J:
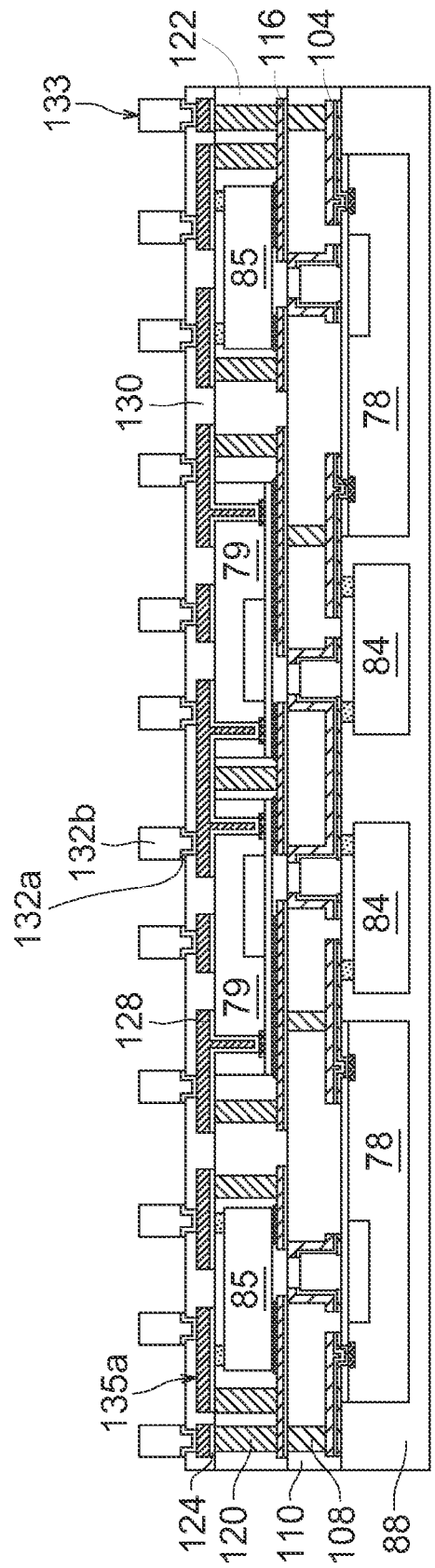

Next, referring to FIG. 6J, multiple metal bumps 133 are formed on the metal layer 128 of the metal traces or interconnects 135a exposed by the openings 130a in the polymer layer 130. Each of the metal bumps 133 can be composed of a metal layer 132a and a metal layer 132b on the metal layer 132a. The details of the metal layers 132a and 132b shown in FIG. 6J can be referred to as the details of the metal layers 132a and 132b as illustrated in FIG. 5AE.

As shown in FIG. 6J, after the metal bumps 133 are formed, a singulation process can be performed to cut the carrier 88, the transparent layer 110, the insulating layer on the polymer layer 122, and the polymer layers 122 and 130 by using, e.g., mechanical sawing or laser cutting and to singularize multiple multi-chip packages 204 (one of them is shown). Each of the multi-chip packages 204 includes multiple waveguide structures, each including one or more of the transparent bumps 98 and one or more of the metal interconnects 107b. One or more of the multi-chip packages 204 can be connected to and bonded with a carrier, such as mother board, printed-circuit board (PCB), ball-grid-array (BGA) substrate, metal substrate, glass substrate, or ceramic substrate, using the metal bumps 133.

Figure 7A:
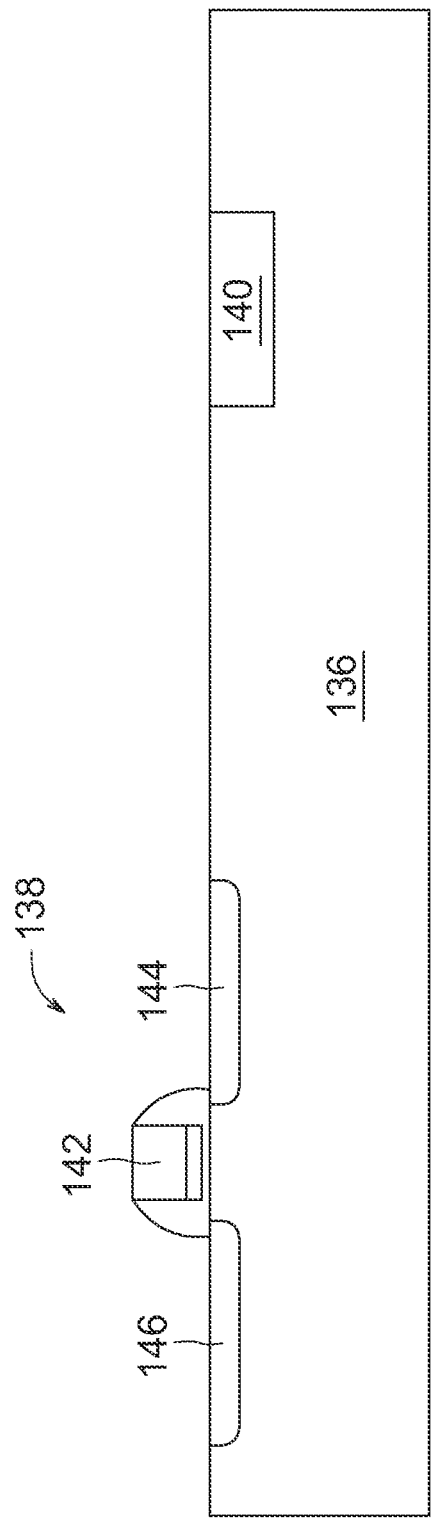
FIGS. 7A-7P show a process for forming a chip with waveguide structures for signal transmission and power/ground delivery according to an exemplary embodiment of the present disclosure.
Figure 7B:
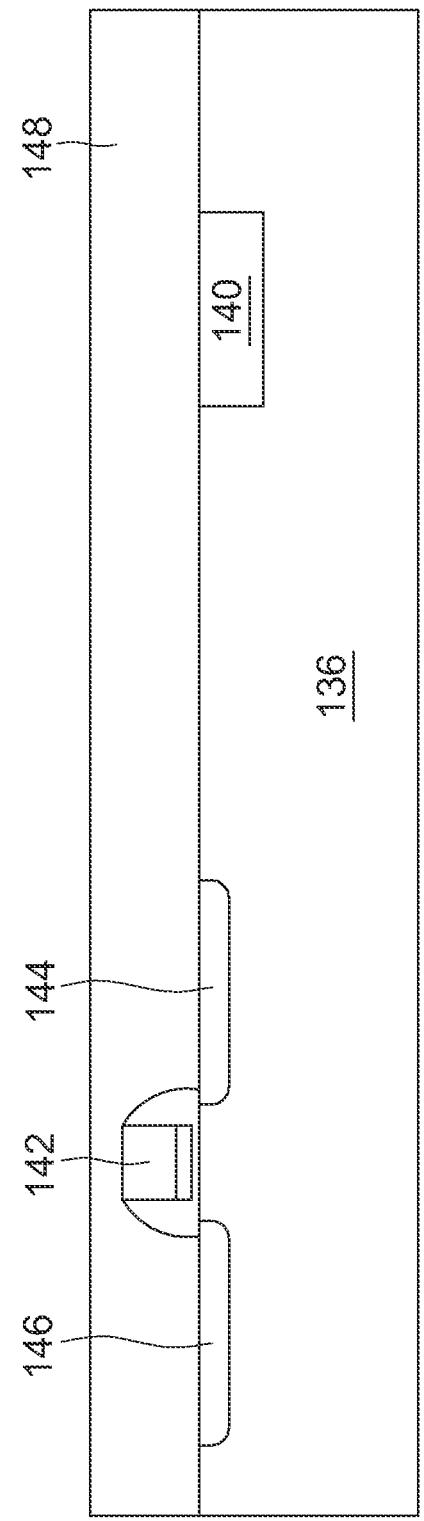
Figure 7G:
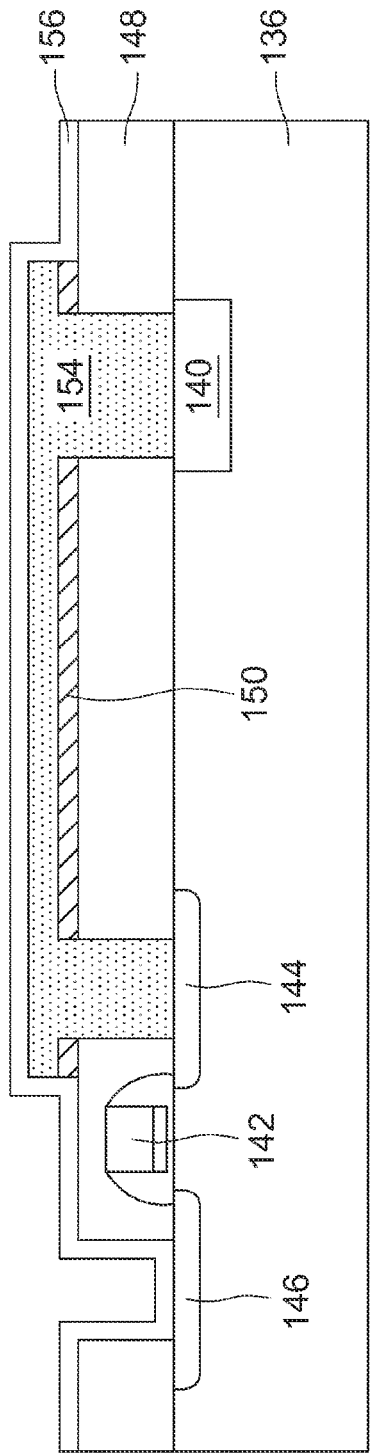
Figure 7H:
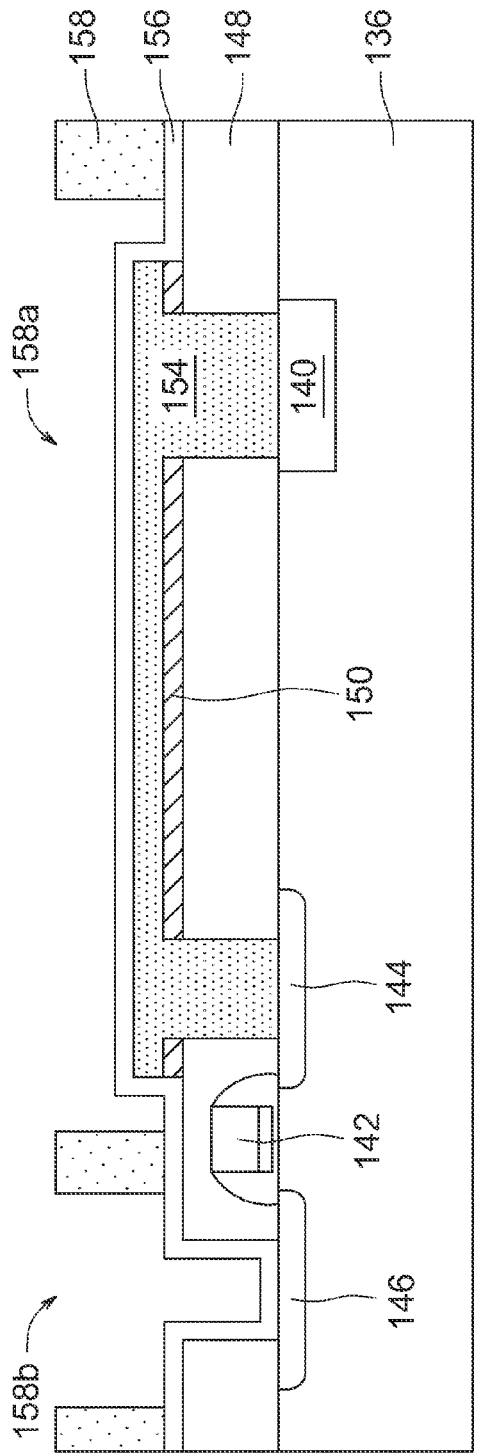
Figure 7I:
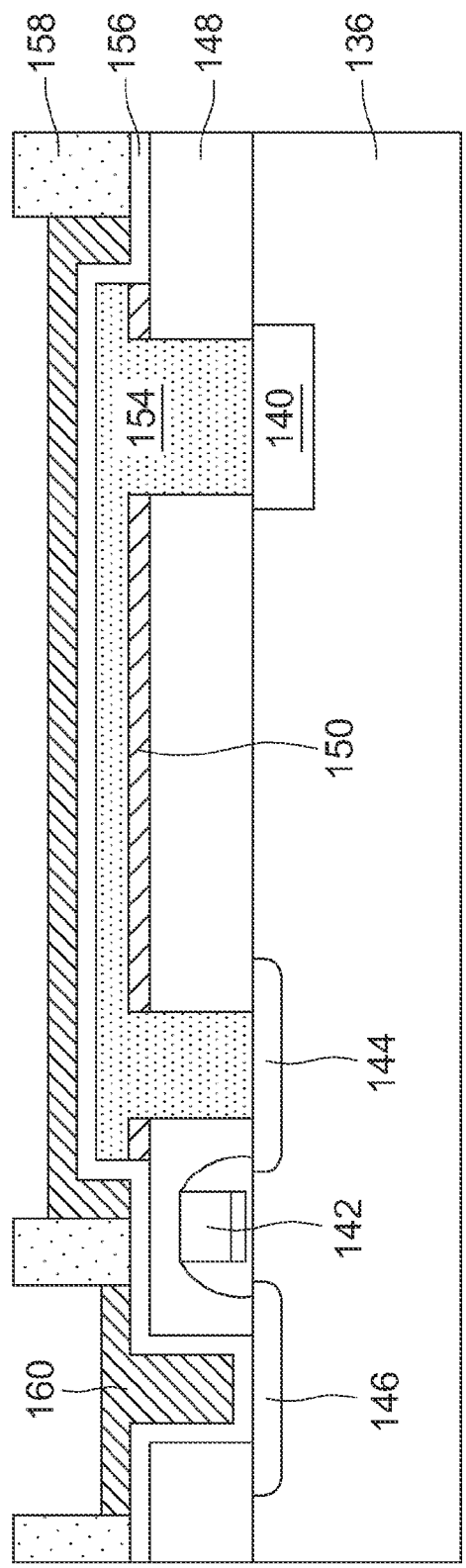
Figure 7J:
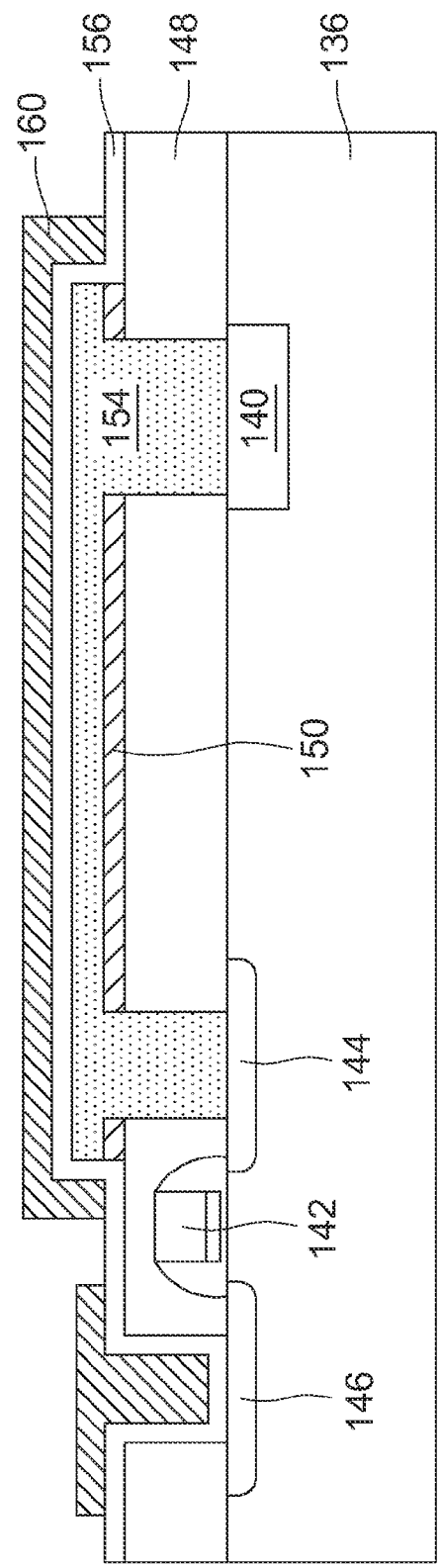
Figure 7K:
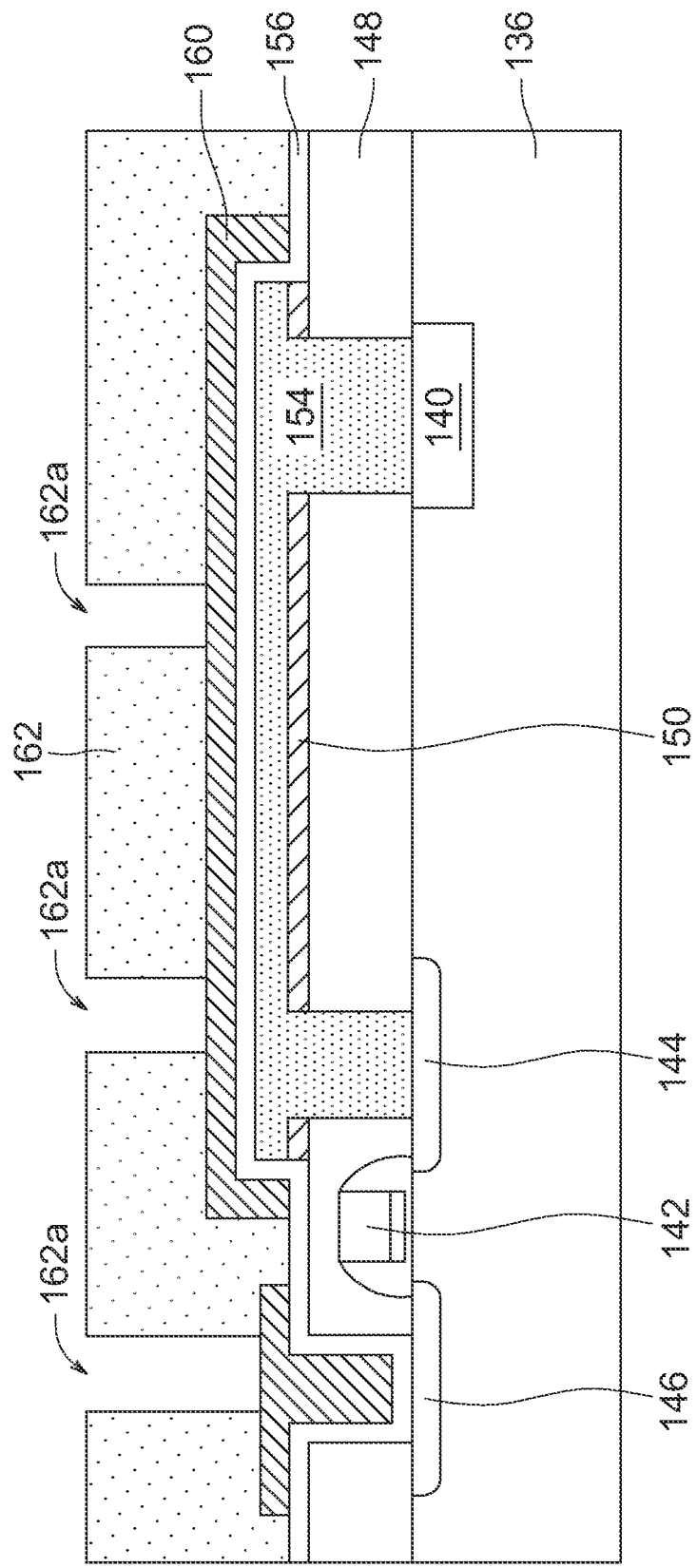
Figure 7L:
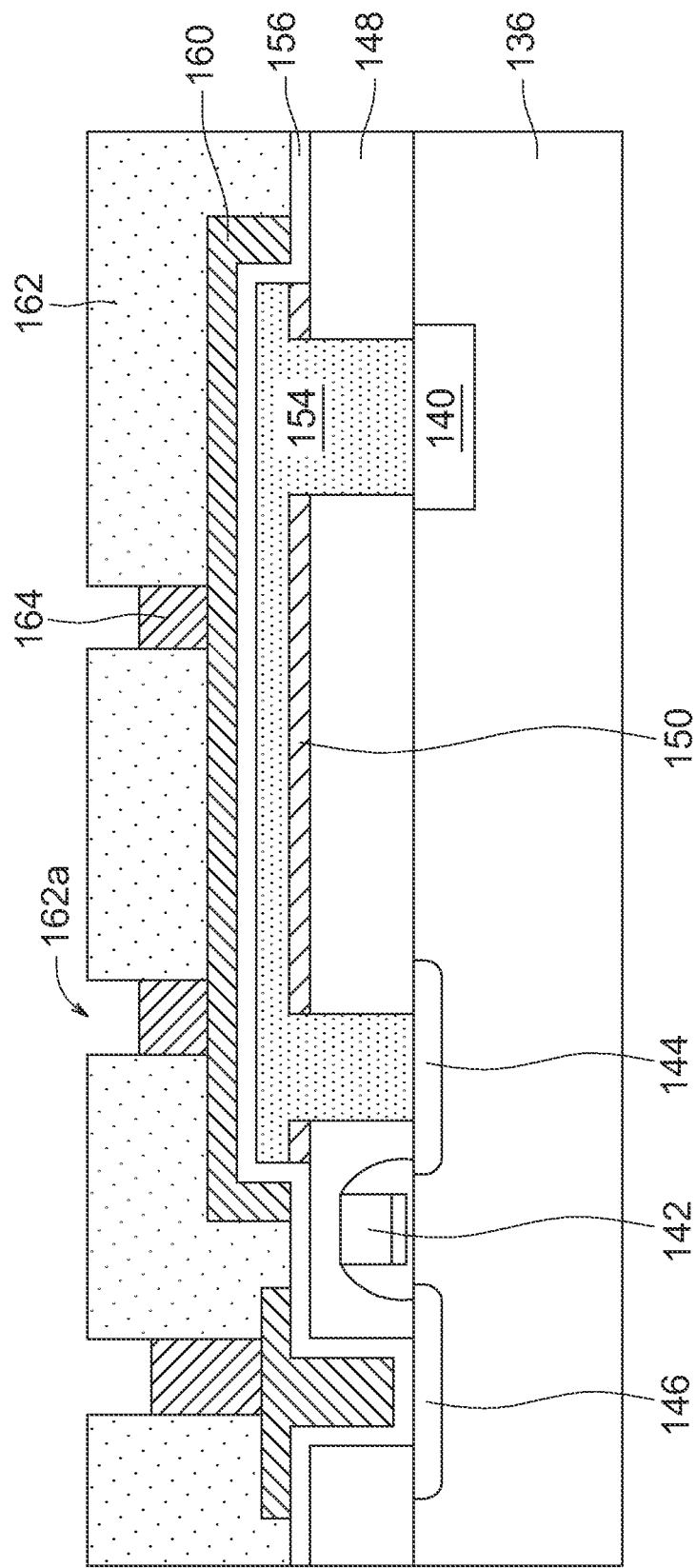
Figure 7M:
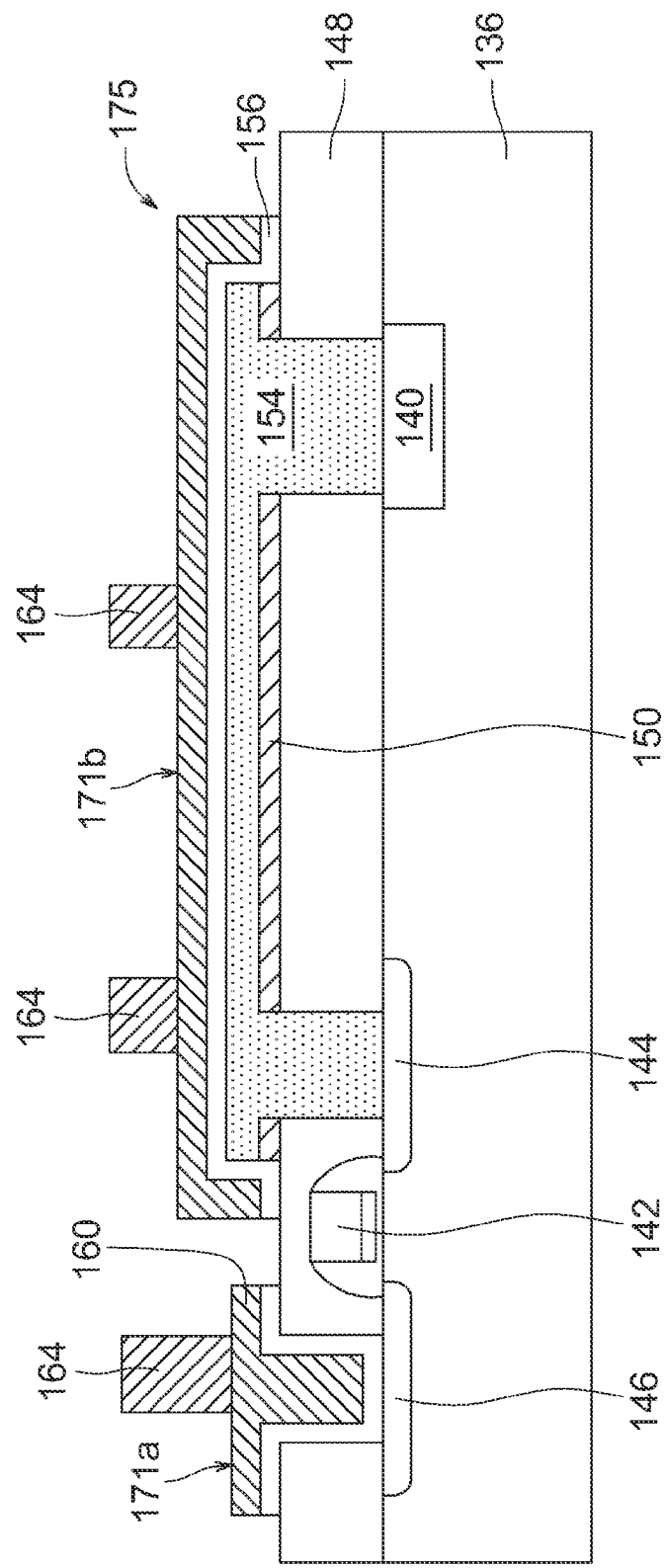
Figure 7N:
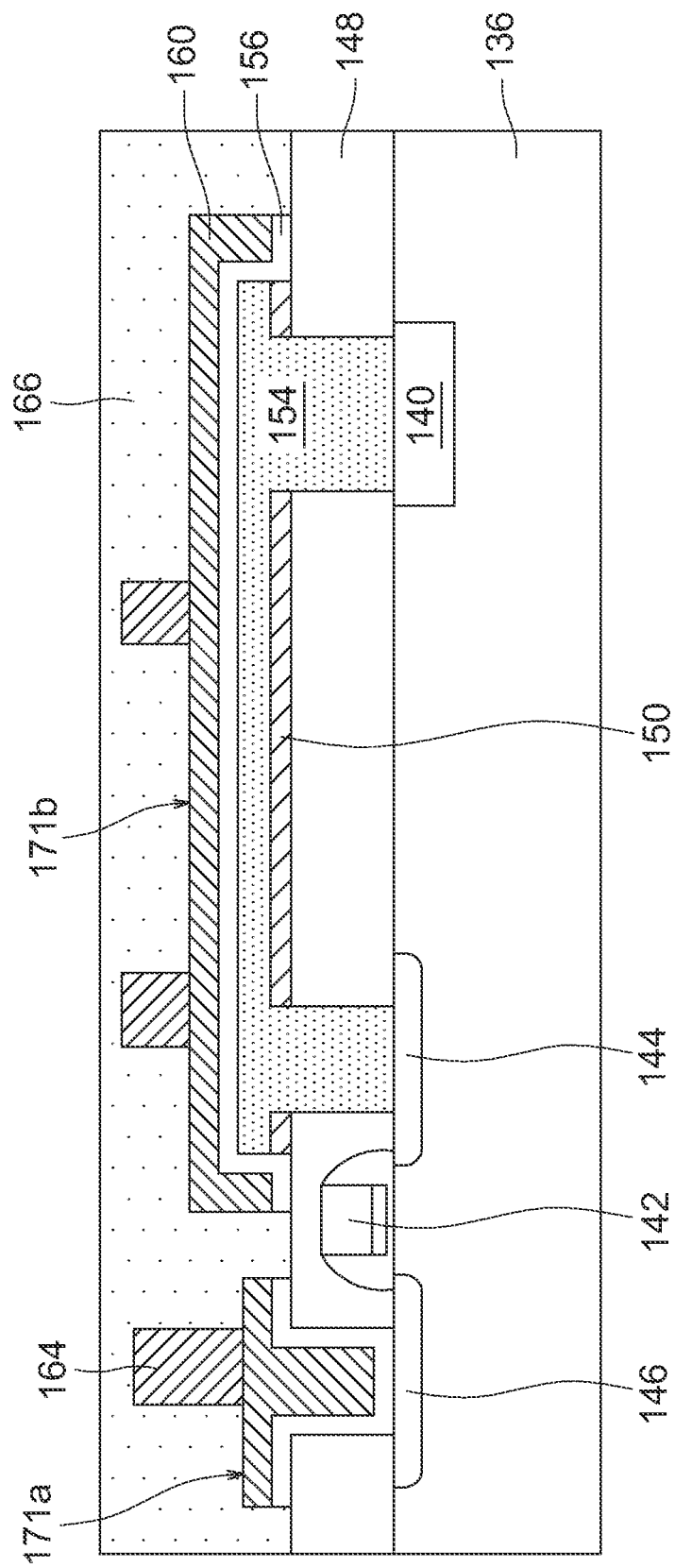
Figure 70:
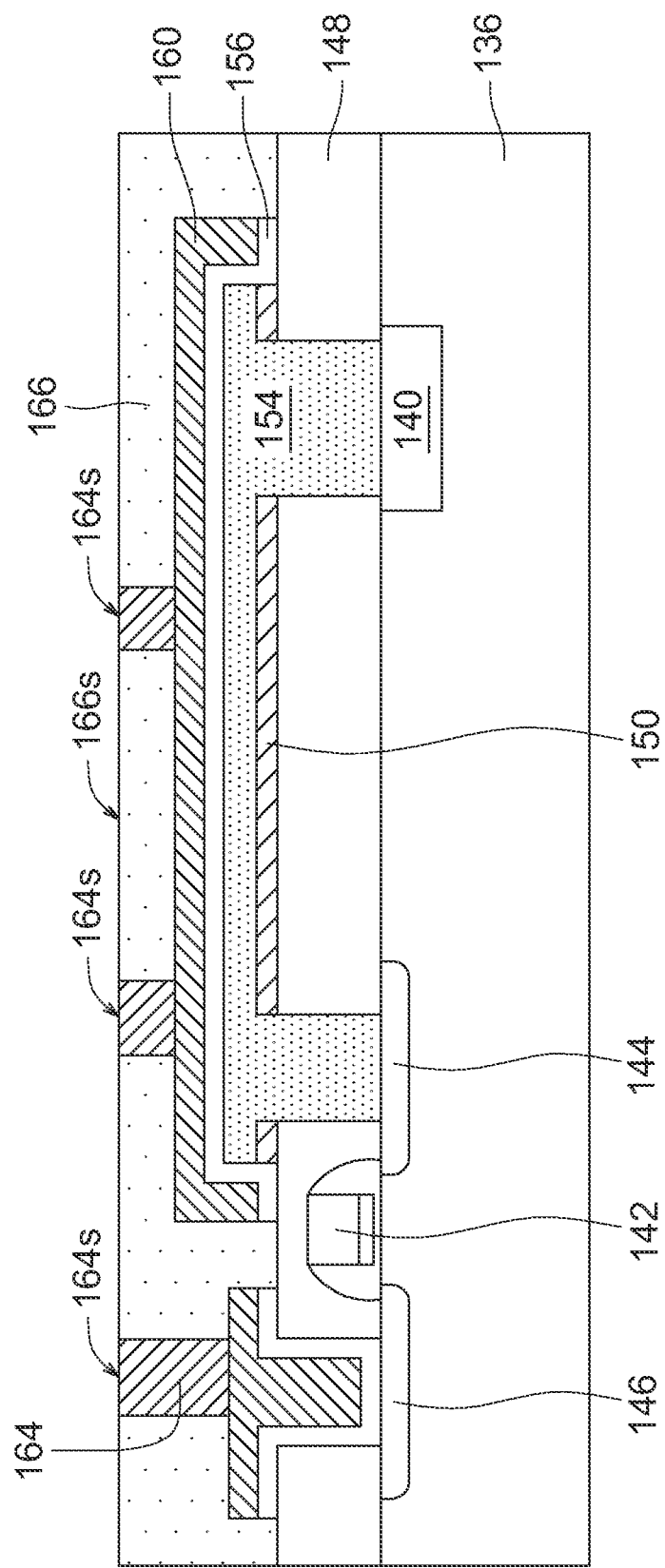
Figure 7P:
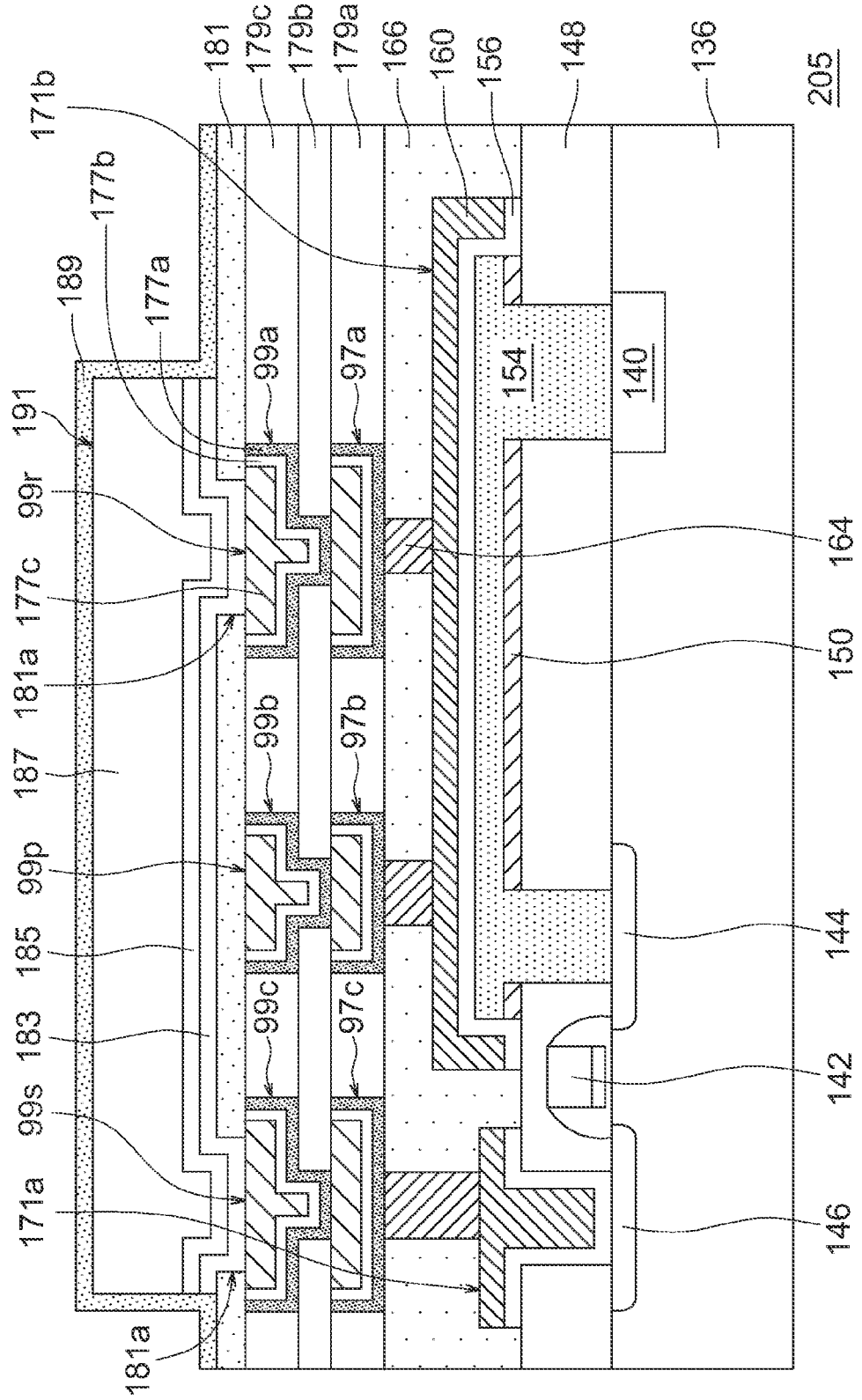

FIGS. 7A-7P illustrate a process of forming a semiconductor chip including waveguide structures for signal transmission and power/ground delivery.

Referring to FIG. 7A, a semiconductor substrate 136 having a sensor device 138 and an illuminant device 140 is provided. The sensor device 138 may include a gate 142, a source 144, and a drain 146.

The semiconductor substrate 136 can be a silicon based substrate, a gallium arsenide (GaAs) based substrate, a silicon indium based (SiIn) substrate, a silicon antimony based (SiSb) substrate, and indium antimony (InSb) based substrate, or a silicon germanium (SiGe) based substrate. The illuminant device 140 can be a light emitting diode (LED), a laser device, or generally any light emitting device. The illuminant device 140 may include germanium and aluminum. The sensor device 138 can be a light sensor, an image sensor, a complementary metal-oxide-semiconductor (CMOS) sensor, or generally any sensor capable of detecting light emitted from the illuminant device 140. The sensor device 138 may be, or may include, a field-effect transistor. The source 144 and the drain 146 may be contacts, or terminals, between which electrons may flow, and the gate 142 may control the flow of electrons between the source 144 and the drain 146.

Next, referring to FIG. 7B, a dielectric layer 148 is formed on the semiconductor substrate 136, the sensor device 138, and the illuminant device 140 by a suitable process, such as chemical-vapor-deposition (CVD) process. The dielectric layer 148 may include or may be a layer of silicon oxide (such as $SiO_2$), silicon nitride (such as $Si_3N_4$), silicon oxynitride (such as SiON), silicon oxycarbide (such as SiOC), phospho-silicate glass (PSG), silicon carbon nitride (such as SiCN), or polymer (such as polyimide, benzocyclobutene (BCB), poly-benzoxazole (PBO), poly-phenylene oxide (PPO), epoxy, or silosane). Alternatively, the dielectric layer 148 may include or may be a low-k dielectric layer having a constant of k between 0.5 and 3.

Next, referring to FIG. 7C, a reflecting layer 150 is formed on the dielectric layer 148 by a suitable process, such as vacuum deposition process, plasma-enhanced chemical-vapor deposition (PECVD) process, or physical-vapor deposition (PVD) process. The physical-vapor deposition (PVD) process can be a sputtering process or an evaporation process. The reflecting layer 150 may include or may be a layer of one or more of chromium, nickel, titanium, tantalum, copper, gold, silver, and aluminum. The reflecting layer 150 may have a suitable thickness, e.g., smaller than 3 micrometers, such as between 0.5 and 3 micrometers or between 20 nanometers and 1.5 micrometers. For example, the reflecting layer 150 can be a titanium-containing layer, such as titanium or titanium tungsten, having a thickness between 0.1 and 0.9 micrometers on the dielectric layer 148.

Next, referring to FIG. 7D, three openings or vias 152 are formed through the dielectric layer 148 and the reflecting layer 150 by a suitable process, such as chemical etching process or plasma etching process. One of the openings or vias 152 exposes a region 140r of the illuminant device 140, another one exposes a region 144r of the source 144, and the other one exposes a region 146r of the drain 146.

Next, referring to FIG. 7E, a transparent layer 154 can be formed on the reflecting layer 150, the regions 140r, 144r and 146r, and sidewalls of the openings or vias 152 by a suitable process, such as chemical-vapor-deposition (CVD) process or spin coating process. The transparent layer 154 may include or may be a diamond layer or a transparent polymer layer. Alternatively, the transparent layer 154 may include or may be a layer of polymer, polyimide, Polymethylmethacrylate (PMMA), Polystyrene (PS), Polycarbonate (PC), or glass. The transparent layer 154 on a top surface of the reflecting layer 150 may have a suitable thickness, e.g., smaller than 2 micrometers, such as between 0.1 and 2 micrometers or between 0.5 and 1 micrometers.

Next, referring to FIG. 7F, the transparent layer 154 can be patterned by a suitable process, such as wet etching process, dry etching process, chemical etching process or plasma etching process, and then the reflecting layer 150 not under the patterned transparent layer 154 can be removed by a suitable process, such as wet etching process, dry etching process, chemical etching process or plasma etching process. Accordingly, the region 146r of the drain 146 is not covered with the patterned transparent layer 154 and is exposed by one of the openings or vias 152.

Next, referring to FIG. 7G, a metal layer 156 can be formed on a top surface and sidewalls of the patterned transparent layer 154, on sidewalls of the reflecting layer 150, on a top surface of the dielectric layer 148, on the region 146r of the drain 146, and on the sidewall(s) of the opening or via 152 that is vertically over the region 146r. The metal layer 156, for example, can be composed of a reflecting layer and a seed layer on the reflecting layer.

The reflecting layer of the metal layer 156 can be formed on the top surface and sidewalls of the patterned transparent layer 154, on the sidewalls of the reflecting layer 150, on the top surface of the dielectric layer 148, on the region 146r of the drain 146, and on the sidewall(s) of the opening or via 152 that is vertically over the region 146r by a suitable process, such as vacuum deposition process, plasma-enhanced chemical-vapor deposition (PECVD) process, or physical-vapor deposition (PVD) process. The reflecting layer of the metal layer 156 may include or may be a layer of one or more of chromium, nickel, titanium, tantalum, copper, gold, silver, and aluminum. The reflecting layer of the metal layer 156 may have a suitable thickness, e.g., smaller than 3 micrometers, such as between 0.5 and 3 micrometers or between 20 nanometers and 1.5 micrometers. For example, the reflecting layer 150 can be a titanium-containing layer, such as titanium or titanium tungsten, having a thickness between 0.1 and 0.9 micrometers on the dielectric layer 148.

The seed layer of the metal layer 156 can be formed by a suitable process, such as sputtering process or evaporation process. The seed layer of the metal layer 156 may include or may be a layer of one or more of gold, copper, silver, nickel, palladium, and platinum. The seed layer of the metal layer 156 may have a suitable thickness, e.g. smaller than 2 micrometers, such as between 0.3 and 2 micrometers or between 20 nanometers and 1.5 micrometers.

Next, referring to FIG. 7H, a photoresist layer 158 is formed on the seed layer of the metal layer 156 by using, e.g., a spin coating process, a screen printing process or a lamination process, and then a photo exposure process and a development process can be employed to form openings 158a and 158b in the photoresist layer 158. The opening 158a in the photoresist layer 158 exposes a first region over the patterned transparent layer 154, and the opening 158b in the photoresist layer 158 exposes a second region over the region 146r of the drain 146. The first and second regions are provided by a top surface the seed layer of the metal layer 156. The photoresist layer 158 may include or may be a polymer layer.

Next, referring to FIG. 7I, a metal layer 160 can be formed on the seed layer of the metal layer 156 exposed by the openings 158a and 158b, vertically over the patterned transparent layer 154, and in the opening 152 vertically over region 146r of the drain 146. The metal layer 160 can be formed by a suitable process, such as electroplating process and/or electroless plating process. The metal layer 160 may include or may be a layer of one or more of aluminum, gold, copper, silver, nickel, palladium, and platinum. The metal layer 160 may have a suitable thickness, e.g. smaller than 50 micrometers, such as between 1 and 20 micrometers, between 2 nanometers and 50 micrometers, between 5 nanometers and 1.5 micrometers, or between 0.1 and 0.9 micrometers. For example, the metal layer 160 can be an electroplated copper layer having a thickness smaller than 2 micrometers, such as between 0.1 and 1.5 micrometers, on the copper seed layer of the metal layer 156.

Next, referring to FIG. 7J, the photoresist layer 158 can be removed by using, e.g., an organic chemical. Next, referring to FIG. 7K, a photoresist layer 162 can be formed on the seed layer of the metal layer 156 and the metal layer 160 by using, e.g., a spin coating process, a screen printing process or a lamination process, and then a photo exposure process and a development process can be employed to form multiple openings 162a in the photoresist layer 162. The openings 162a in the photoresist layer 162 expose multiple regions of a top surface of the metal layer 160. The photoresist layer 162 may include or may be a polymer layer.

Next, referring to FIG. 7L, a metal layer 164 can be formed on the metal layer 160 exposed by the openings 162a. The metal layer 164 can be formed by a suitable process, such as electroplating process. The metal layer 164 may include or may be a layer of one or more of aluminum, gold, copper, silver, nickel, palladium, and platinum. The metal layer 164 may have a suitable thickness, e.g. smaller than 50 micrometers, such as between 1 and 20 micrometers, between 2 nanometers and 50 micrometers, between 5 nanometers and 1.5 micrometers, or between 0.1 and 0.9 micrometers. For example, the metal layer 164 can be an electroplated copper layer having a thickness, e.g., smaller than 5 micrometers, such as between 0.1 and 1.5 micrometers on the electroplated copper layer 160.

Next, referring to FIG. 7M, the photoresist layer 162 can be removed by using, e.g., an organic chemical, and then the metal layer 156 not under the metal layer 160 can be removed by a suitable process, such as wet etching process, dry etching process, chemical etching process, or plasma etching process. Accordingly, the remained metal layer 156 and the metal layer 160 compose metal interconnects or traces 171a and 171b, and the metal layer 164 composes multiple metal bumps. The patterned transparent layer 154, the metal interconnect or trace 171b, and the reflecting layer 150 compose a waveguide structure 175. The metal interconnect or trace 171b and the reflecting layer 150 can be used as a metal shielding of the waveguide structure 175, and the patterned transparent layer 154 surrounded by the metal shielding can be used as a waveguide of the waveguide structure 175. The metal interconnect or trace 171b of the waveguide structure 175 can be configured for delivering power/ground or transmitting electrical signals, and the patterned transparent layer 154 of the waveguide structure 175 can be configured for transmitting an optical signal from the illuminant device 140 to the source 144 of the sensor device 138. The drain 146 of the sensor device 138 can be connected to one or more of the metal bumps 164 through the metal interconnect or trace 171a. One or more of the metal bumps 164 can be formed on the metal layer 160 of the metal interconnect or trace 171b. The metal interconnect or trace 171b can be used as a power/ground interconnect or a signal interconnect.

Next, referring to FIG. 7N, a dielectric layer 166 can be formed on the dielectric layer 148, top surfaces and sidewalls of the metal interconnects or traces 171a and 171b, and top surfaces and sidewalls of the metal bumps 164 by a suitable process, such as chemical-vapor-deposition (CVD) process. The dielectric layer 166 may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), silicon carbon nitride (such as SiCN), or polymer (such as polyimide, benzocyclobutene (BCB), polybenzoxazole (PBO), poly-phenylene oxide (PPO), epoxy, or silosane). Alternatively, the dielectric layer 166 may include or may be a low-k dielectric layer having a constant of k between 0.5 and 3. The dielectric layer 166 may have a suitable thickness, e.g., between 0.3 and 30 micrometers or between 1 and 10 micrometers.

Next, referring to FIG. 7O, the dielectric layer 166 can be ground or polished by, e.g., a chemical-mechanical-polishing (CMP) process, a mechanical polishing process, a mechanical grinding process, or a process including mechanical polishing and chemical etching until each of the metal bumps 164 has an exposed top surface 164s. The ground or polished dielectric layer 166 may have a top surface 166s substantially coplanar with the exposed top surfaces 164s.

Next, referring to FIG. 7P, multiple metal interconnects or traces 97a, 97b, 97c, 99a, 99b and 99c and multiple dielectric layers 179a, 179b and 179c can be formed over the dielectric layer 166, the metal bumps 164, and the metal interconnects or traces 171a and 171b by, e.g., a process including a damascene process, a chemical-vapor-deposition (CVD) process, and a chemical-mechanical-polishing (CMP) process. The damascene process includes a copper-electroplating process and a physical-vapor deposition (PVD) process (such as sputtering process or evaporation process).

Each of the metal interconnects or traces 97a, 97b, 97c, 99a, 99b and 99c can be composed of an adhesion/barrier layer 177a, a seed layer 177b on the adhesion/barrier layer 177a, and an electroplated copper layer 177c on the seed layer 177b. The adhesion/barrier layer 177a and the seed layer 177b can be formed by the physical-vapor deposition (PVD) process, such as sputtering process or evaporation process. The adhesion/barrier layer 177a, for example, can be a titanium-containing layer, such as titanium layer, titanium-nitride layer or titanium-tungsten-alloy layer, having a suitable thickness, e.g., smaller than 1 micrometer, such as between 20 nanometers and 0.9 micrometers. Alternatively, the adhesion/barrier layer 177a can be a tantalum-containing layer, such as tantalum layer or tantalum-nitride layer, having a suitable thickness, e.g., smaller than 1 micrometer, such as between 20 nanometers and 0.9 micrometers.

The seed layer 177b, for example, can be a copper-containing layer, such as copper layer or copper-titanium layer, having a suitable thickness, e.g., smaller than 1 micrometer, such as between 20 nanometers and 0.9 micrometers, on the adhesion/barrier layer 177a. The electroplated copper layer 177c may a suitable thickness, e.g., smaller than 1.5 micrometer, such as between 0.5 and 1.2 micrometers. The adhesion/barrier layer 177a has a first portion vertically under a bottom surface of the electroplated copper layer 177c, a second portion at a right sidewall of the electroplated copper layer 177c, and a third portion at a left sidewall of the electroplated copper layer 177c. The seed layer 177b has a first portion contacting the bottom surface of the electroplated copper layer 177c and the first portion of the adhesion/barrier layer 177a, a second portion contacting the right sidewall of the electroplated copper layer 177c and the second portion of the adhesion/barrier layer 177a, and a third portion contacting the left sidewall of the electroplated copper layer 177c and the third portion of the adhesion/barrier layer 177a.

Each of the metal interconnects or traces 97a and 97b can be connected to the metal interconnect or trace 171b through one or more of the metal bumps 164 on the metal interconnect or trace 171b. The metal interconnect or trace 97c can be connected to the metal interconnect or trace 171a through one or more of the metal bumps 164 on the metal interconnect or trace 171a.

Each of the dielectric layers 179a, 179b and 179c may include or may be a layer of silicon oxide (such as $SiO_2$), silicon nitride (such as $Si_3N_4$), silicon oxynitride (such as SiON), silicon oxycarbide (such as SiOC), phosphosilicate glass (PSG), or silicon carbon nitride (such as SiCN). Each of the dielectric layers 179a, 179b and 179c can be formed by the chemical-vapor-deposition (CVD) process and may have a suitable thickness, e.g., smaller than 1.5 micrometers, such as between 0.1 and 0.9 micrometers. The metal interconnects or traces 97a, 97b and 97c are in the dielectric layer 179a, and the metal interconnects or traces 99a, 99b and 99c are in the dielectric layer 179c. The dielectric layer 179b can be over the metal interconnects or traces 97a, 97b and 97c and under the metal interconnects or traces 99a, 99b and 99c.

As shown in FIG. 7P, after the metal interconnects or traces 97a, 97b, 97c, 99a, 99b and 99c and the dielectric layers 179a, 179b and 179c are formed, a passivation layer 181 can be formed on the metal interconnects or traces 99a, 99b and 99c and on the dielectric layer 179c. Multiple openings 181a (two of them are shown) in the passivation layer 181 are vertically over multiple contact points of the metal interconnects or traces 99a and 99c, and the contact points of the metal interconnects or traces 99a and 99c are at bottoms of the openings 181a. The contact points of the metal interconnect or trace 99a include a contact point 99r provided by the electroplated copper layer 177c, and the contact point 99r is at the bottom of its aligned opening 181a. The contact points of the metal interconnect or trace 99c include a contact point 99s provided by the electroplated copper layer 177c, and the contact point 99s is at the bottom of its aligned opening 181a.

After the passivation layer 181 is formed, a metallization structure including a metal interconnect or trace 191 can be formed on or over the passivation layer 181 by, e.g., a process including an electroplating process and a physical-vapor deposition (PVD) process (such as sputtering process or evaporation process). The metallization structure including the metal interconnect or trace 191 can be composed of an adhesion/barrier layer 183, a seed layer 185 on the adhesion/barrier layer 183, and a metal layer 187 on the seed layer 185. The adhesion/barrier layer 183 and the seed layer 185 can be formed by the physical-vapor deposition (PVD) process, such as sputtering process or evaporation process. The adhesion/barrier layer 183, for example, can be a titanium-containing layer, such as titanium layer, titanium-nitride layer or titanium-tungsten-alloy layer, having a suitable thickness, e.g., smaller than 1 micrometer, such as between 20 nanometers and 0.9 micrometers. Alternatively, the adhesion/barrier layer 183 can be a tantalum-containing layer, such as tantalum layer or tantalum-nitride layer, having a suitable thickness, e.g., smaller than 1 micrometer, such as between 20 nanometers and 0.9 micrometers. The adhesion/barrier layer 183 of the metal interconnect or trace 191 contacts the contact points 99r and 99s.

The seed layer 185 may include or may be a copper layer, a gold layer, or a nickel layer and has a suitable thickness, e.g., smaller than 1 micrometer, such as between 20 nanometers and 0.9 micrometers. The metal layer 187 may include or may be an electroplated copper layer, an electroplated gold layer, a nickel layer, a palladium layer, or a platinum layer and has a suitable thickness, e.g., greater than 2 micrometers, such as between 5 and 25 micrometers or between 7 and 20 micrometers. Alternatively, the metal layer 187 can be composed of an electroplated copper layer having a thickness greater than 2 micrometers on the seed layer 185, a nickel layer having a thickness between 0.5 and 10 micrometers on the electroplated copper layer, and a gold or palladium layer having a thickness between 0.5 and 5 micrometers on the nickel layer. The seed layer 185 contacts a bottom surface of the metal layer 187 but does not contact any sidewall of the metal layer 187. The adhesion/barrier layer 183 is vertically under the metal layer 187 but is not at any sidewall of the metal layer 187. The thickness of the metal layer 187 may be greater than the thickness of the electroplated copper layer 177c.

The metal interconnect or trace 191 composed of the adhesion/barrier layer 183, the seed layer 185, and the metal layer 187 can connect the contact point 99r and the contact point 99s. The metal interconnect or trace 99b between the metal interconnects or traces 99a and 99c may have a region 99p vertically under the metal interconnect or trace 191, and no opening in the passivation layer 181 is between the metal interconnect or trace 191 and the region 99p. The metal interconnect or trace 191 does not contact the region 99p of the metal interconnect or trace 99b. The metal interconnect or trace 191 can be connected to (or not connected to) the metal interconnect or trace 99b. The metal interconnect or trace 99b may have a portion, having the region 99p, spaced apart from the metal interconnects or traces 99a and 99b.

As shown in FIG. 7P, after the metallization structure including the metal interconnect or trace 191 is formed, an insulating layer 189 can be formed on the metallization structure and on the passivation layer 181. The insulating layer 189 contacts a top surface of the passivation layer 181 and a top surface and sidewalls of the metal interconnect or trace 191. The insulating layer 189 may include or may be a nitride layer, such as silicon-nitride layer or silicon-oxynitride layer, having a suitable thickness, e.g., smaller than 1 micrometer, such as between 0.1 and 0.9 micrometers. Alternatively, the insulating layer 189 may include or may be an oxide layer, such as silicon-oxide layer or silicon-oxynitride layer, having a suitable thickness, e.g., smaller than 1 micrometer, such as between 0.1 and 0.9 micrometers. Alternatively, the insulating layer 189 may be a polymer layer having a suitable thickness, e.g., greater than 2 micrometers, such as between 5 and 30 micrometers. There may be multiple openings in the insulating layer 189 vertically over the metal interconnect or trace 191, and multiple metal bumps, such as copper bump, gold bump or solder bump, having a thickness greater than 5 micrometers, such as between 5 and 100 micrometers, can be formed over the openings in the insulating layer 189 and are connected to the metal interconnect or trace 191 through the openings in the insulating layer 189.

After the above-mentioned process is finished, a singulation process can be performed to cut the semiconductor substrate 136 by using, e.g., mechanical sawing or laser cutting and to singularize multiple semiconductor chips 205 (one of them is shown in FIG. 7P). One or more of the semiconductor chips 205 can be connected to or jointed with a substrate, such as glass substrate, flexible substrate, printed circuit board (PCB) substrate, metal substrate, ceramic substrate, or polymer substrate.

In summary, each of the devices illustrated in FIGS. 1L, 1M and 1N, the device 200 illustrated in FIG. 1O, the device 201 illustrated in FIG. 2Q, the device 202 illustrated in FIG. 3X, the multi-chip package 203 illustrated in FIG. 5AE, the multi-chip package 204 illustrated in FIG. 6J, and the chip 205 illustrated in FIG. 7P includes at least one waveguide structure used for optical-signal transmission and power/ground delivery. The waveguide structure includes a waveguide used for transmitting optical signals from an illuminant device to a detector. The waveguide can be made of a transparent material, such as transparent polymer, glass, glass fiber or diamond. For example, the waveguide can be composed of the patterned transparent layer 12, the transparent bump 98, or the transparent layer 154. The waveguide structure further includes a metal shielding used for delivering power/ground or transmitting electrical signals. The transparent material of the waveguide structure is surrounded by the metal shielding of the waveguide structure. The metal shielding may include one or more of a titanium-containing layer, a tantalum-containing layer, a chromium-containing layer, an aluminum layer, a copper layer, a gold layer, a nickel layer, a palladium layer, or a platinum layer. For example, the metal shielding can be composed of multiple metal layers, such as the metal layers 8, 14, 16 and 20 shown in FIG. 1J, 2G or 3N, the metal layers 90, 101 and 104 shown in FIG. 5N, or the metal layers 150, 156 and 160 shown in FIG. 7P. The waveguide structure can provide an optical-signal transmission with high speed and high volume through the waveguide, while a stable power or ground reference can be provided to multiple units, such as transistors, through the metal shielding. The metal shielding contacts and surrounds the waveguide to reduce the attenuation of the optical signal transmitted through the waveguide.

The above-mentioned waveguide structure can be used in a wide variety of electronic devices, including, but not limited to, e.g., a telephone, a cordless phone, a mobile phone, a smart phone, a netbook computer, a notebook computer, a digital camera, a digital video camera, a digital picture frame, a personal digital assistant (PDA), a pocket personal computer, a portable personal computer, an electronic book, a digital book, a desktop computer, a tablet or slate computer, an automobile electronic product, a mobile internet device (MID), a mobile television, a projector, a mobile projector, a pico projector, a smart projector, a three-dimensional (3D) video display, a 3D television (3D TV), a 3D video game player, a mobile computer device, a mobile compuphone (also called mobile phoneputer or mobile personal computer phone) which is a device or a system combining and providing functions of computers and phones, or a high performance and/or low power computer or server, for example, used for cloud computing.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure, e.g., design of structure and/or control of methods described herein, can be implemented in hardware, software, firmware, or any combinations of such, and over one or more networks. Suitable software can include computer-readable or machine-readable instructions for performing methods and techniques (and portions thereof) of designing and/or controlling the implementation of tailored RF pulse trains. Any suitable software language (machine-dependent or machine-independent) may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A device comprising:
a substrate;
an illuminant device in or on said substrate;
a sensor device in or on said substrate;
a waveguide structure over said substrate, said illuminant device and said sensor device, wherein said waveguide structure comprises a first optical-signal transmission part and a power/ground delivery part surrounding said first optical-signal transmission part, wherein said power/ground delivery part comprises a first metal layer and a second metal layer, wherein said first metal layer comprises a first portion vertically under said first optical-signal transmission part and a second portion not vertically under said first optical-signal transmission part, wherein first and second openings are through said first portion of said first metal layer, wherein said illuminant device comprises a first region under said first opening, and said sensor device comprises a second region under said second opening, wherein said first optical-signal transmission part contacts said first portion of said first metal layer and is over said first and second regions, wherein said second metal layer contacts said second portion of said first metal layer and a top surface and sidewalls of said first optical-signal transmission part;
an insulating layer over said waveguide structure; and
a metal interconnect over said insulating layer, wherein said metal interconnect is connected to said second metal layer.

2. The device of claim 1 further comprising a metal bump over said metal interconnect, wherein said metal bump is connected to said metal interconnect.

3. The device of claim 2, wherein said metal bump comprises a copper bump having a thickness between 5 and 100 micrometers.

4. The device of claim 1 comprises a semiconductor chip.

5. The device of claim 1, wherein said illuminant device comprises a light emitting diode (LED).

6. The device of claim 1, wherein said sensor device comprises an image sensor.

7. The device of claim 1, wherein said sensor device comprises a gate, a source and a drain, wherein said second region is provided by said source.

8. The device of claim 1, wherein said first optical-signal transmission part comprises a transparent polymer.

9. The device of claim 1, wherein said first optical-signal transmission part comprises diamond.

10. The device of claim 1, wherein said first optical-signal transmission part comprises glass.

11. The device of claim 1, wherein said first metal layer comprises a first titanium-containing layer.

12. The device of claim 11, wherein said second metal layer comprises a second titanium-containing layer.

13. The device of claim 12, wherein said second metal layer further comprises a copper layer over said second titanium-containing layer.

14. The device of claim 1, wherein said second metal layer comprises a titanium-containing layer and a copper layer over said titanium-containing layer.

15. The device of claim 1, wherein said metal interconnect comprises a metal bump, wherein said metal bump comprises an electroplated copper layer having a thickness between 5 and 100 micrometers.

16. The device of claim 1, wherein said metal interconnect comprises a metal bump, wherein said metal bump comprises a gold layer.

17. The device of claim 1, wherein said metal interconnect comprises an aluminum-containing layer.

18. The device of claim 1, wherein said insulating layer comprises a silicon-nitride layer.

19. The device of claim 1, wherein said insulating layer comprises a polymer layer.

20. The device of claim 1, wherein said waveguide structure further comprises a second optical-signal transmission part on a third portion of said first metal layer and next to said first optical-signal transmission part, wherein said second portion of said first metal layer is not vertically under said second optical-signal transmission part, wherein said second optical-signal transmission part is surrounded by said power/ground delivery part, wherein said second metal layer contacts a top surface and sidewalls of said second optical-signal transmission part, wherein said second optical-signal transmission part has a portion spaced apart from said first optical-signal transmission part.

\* \* \* \* \*